United States Patent
Maeda et al.

(10) Patent No.: US 7,920,615 B2
(45) Date of Patent: Apr. 5, 2011

(54) SURFACE-EMITTING LASER DIODE AND METHOD OF MANUFACTURING THE SAME

(75) Inventors: Osamu Maeda, Kanagawa (JP); Masaki Shiozaki, Kanagawa (JP); Norihiko Yamaguchi, Kanagawa (JP); Yoshinori Yamauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 247 days.

(21) Appl. No.: 12/227,443

(22) PCT Filed: Jun. 4, 2007

(86) PCT No.: PCT/JP2007/061281
§ 371 (c)(1),
(2), (4) Date: Nov. 18, 2008

(87) PCT Pub. No.: WO2007/142184
PCT Pub. Date: Dec. 13, 2007

(65) Prior Publication Data
US 2009/0129417 A1    May 21, 2009

(30) Foreign Application Priority Data

Jun. 8, 2006  (JP) .................................. 2006-159317
May 8, 2007  (JP) .................................. 2007-123558

(51) Int. Cl.
*H01S 5/00* (2006.01)
(52) U.S. Cl. ............................... 372/46.013; 372/50.124
(58) Field of Classification Search ............. 372/46.013, 372/50.124
See application file for complete search history.

(56) References Cited

FOREIGN PATENT DOCUMENTS

| JP | 2000-261094 | 9/2000 |
|---|---|---|
| JP | 2001-024277 | 1/2001 |
| JP | 2003-298186 | 10/2003 |
| JP | 2005-044964 | 2/2005 |
| JP | 2005-142361 | * 6/2005 |
| JP | 2006-210429 | 8/2006 |

OTHER PUBLICATIONS

International Search Report; International Application No. PCT/JP2007/061281; Dated: Aug. 14, 2007.

* cited by examiner

*Primary Examiner* — Armando Rodriguez
(74) *Attorney, Agent, or Firm* — Rader, Fishman & Grauer PLLC

(57) ABSTRACT

A surface-emitting laser diode capable of being manufactured easily at low cost, and capable of stabilizing the polarization direction of laser light in one direction and achieving higher output is provided. A light emission section 20 in which a lower first DBR mirror layer 12, a lower second DBR mirror layer 13, a lower spacer layer 14, an active layer 15 including a light emission region 15A, an upper spacer layer 16, a current confinement layer 17, an upper DBR mirror layer 18 and a contact layer 19 are laminated in this order is included on a substrate 10. The lower first DBR mirror layer 12 includes an oxidation section 30 nonuniformly distributed in a direction rotating around the light emission region 15A in a periphery of a region corresponding to the light emission region 15A. The oxidation section 30 includes a pair of multilayer films 31 and 32, and is formed by oxidizing a low refractive index layer 12A. Thereby, an anisotropic stress according to nonuniform distributions of the multilayer films 31 and 32 is generated in the active layer 15.

15 Claims, 38 Drawing Sheets

SURFACE-EMITTING LASER DIODE AND METHOD OF MANUFACTURING THE SAME

TECHNICAL FIELD

The present invention relates to a surface-emitting laser diode including a laser light emission region on a top surface thereof and a method of manufacturing the same, and specifically to a surface-emitting laser diode suitably applicable to applications demanding light output having a stable polarization direction and a method of manufacturing the same.

BACKGROUND ART

Unlike a conventional edge-emitting laser diode, a surface-emitting laser diode emits light in a direction orthogonal to a substrate, and a large number of devices can be arranged in a two-dimensional array on a single substrate, so the surface-emitting laser diode has received attention as a light source for digital copying machine or printer.

Conventionally, in a surface-emitting laser diode of this kind, a pair of multilayer reflecting mirrors are formed on a semiconductor substrate, and an active layer as a light emission region is included between the pair of multilayer reflecting mirrors. Then, a current confinement layer with a configuration having a narrowed current injection region is arranged on one of the multilayer reflecting mirrors so as to increase current injection efficiency into the active layer and to reduce a threshold current. Moreover, an n-side electrode and a p-side electrode are arranged on a bottom surface and a top surface, respectively, and a light emission opening for emitting laser light is arranged in the p-side electrode. In the surface-emitting laser diode, after a current is confined by the current confinement layer, the current is injected into the active layer, and light is emitted in the active layer, and while the light is repeatedly reflected by the pair of multilayer reflecting mirrors, the light is emitted from the light emission opening of the p-side electrode as laser light.

By the way, the above-described surface-emitting laser diode typically has such nonuniformity that the polarization direction varies due to device variations, or such instability that the polarization direction is changed by output or environmental temperature. Therefore, in the case where such a surface-emitting laser diode is applied to a polarization-dependent optical device such as a mirror or a beam splitter, for example, in the case where the surface-emitting laser diode is used as a light source for digital copying machine or printer, there is an issue that variations in the polarization direction cause a difference in imaging position or output, thereby blur or color unevenness occurs.

Therefore, to overcome such an issue, some techniques of stabilizing a polarization direction in one direction by arranging a polarization controllability function in the surface-emitting laser diode have been reported.

For example, as one of such techniques, there is a technique using a special inclined substrate which has a (311) plane as a normal and is made of gallium-arsenic (GaAs). In the case where a surface-emitting laser diode is formed through the use of such a special inclined substrate, gain characteristics with respect to the [−233] direction are enhanced, and the polarization direction of laser light is controllable to this direction. In addition, the polarization ratio of laser light is very high, so this technique is effective to stabilize the polarization direction of the surface-emitting laser diode in one direction.

Moreover, in Patent Document 1, a technique of controlling polarization by reducing the size of the section of a post structure to be smaller than the mode size of light is disclosed.

Moreover, in Patent Document 2, a technique of forming a discontinuity in a part of a metallic contact layer which does not have an influence on characteristics of laser light emitted from a light emission opening so as to obtain polarization in a direction parallel to a boundary of the discontinuity is disclosed.

Patent Document 1: Japanese Patent No. 2891133
Patent Document 2: Published Japanese Translation No. 2001-525995 of PCT international application

DISCLOSURE OF THE INVENTION

However, the above-described inclined substrate is a special substrate having a (311) plane as a normal, so compared to a (001) plane substrate or the like as a typical substrate, the inclined substrate is very expensive. Moreover, in the case where such a special inclined substrate is used, epitaxial growth conditions such as growth temperature, doping conditions and gas flow rate are completely different from the case where the (001) plane substrate is used, so it is difficult to easily manufacture the inclined substrate.

Further, in the above-described Patent Document 1, the size of the section of the post structure is smaller than the mode size of light, so light output is as low as approximately 1 mW; therefore, the surface-emitting laser diode is not suitable for applications demanding high output such as a light source for digital copying machine or printer.

Moreover, in the above-described Patent Document 2, as an example, a surface-emitting laser diode in which a groove (a discontinuity) with a depth of 4.0 to 4.5 μm is formed in a position 7 μm away from an edge of a light emission opening is disclosed, thereby polarization in a direction parallel to the groove is obtained. However, unless the distance of a short side of a resonance region is reduced to such an extent that a diffraction loss effect is generated, the polarization direction may not be stabilized in one direction, so it is considered that the polarization direction may not be stabilized by the discontinuity formed in a range where the diffraction loss effect is not obtained (the distance of the short side is 7 μm).

Thus, in the techniques in related arts, it is difficult to easily manufacture a high-power surface-emitting laser diode capable of stabilizing the polarization direction of laser light in one direction at low cost.

In view of the foregoing, it is an object of the invention to provide a surface-emitting laser diode which is capable of being easily manufactured at low cost and is capable of stabilizing the polarization direction of laser light in one direction and achieving higher output, and a method of manufacturing the same.

A surface-emitting laser diode of the invention includes a light emission section, in which a first multilayer reflecting mirror, an active layer including one or a plurality of light emission regions and a second multilayer reflecting mirror are laminated in this order, on a substrate. At least one of the first multilayer reflecting mirror and the second multilayer reflecting mirror includes an oxidation section nonuniformly distributed in a direction rotating around the light emission region in a periphery of a region corresponding to the light emission region. In addition, any other layer may be inserted between the first multilayer reflecting mirror and the active layer, or between the active layer and the second multilayer reflecting mirror.

In the surface-emitting laser diode of the invention, at least one of the first multilayer reflecting mirror and the second multilayer reflecting mirror includes an oxidation section nonuniformly distributed in a direction rotating around the light emission region in a periphery of a region corresponding to the light emission region, so a stress by the oxidation section is nonuniformly generated in the active layer. At this time, in the case where the nonuniform distribution of the oxidation section has anisotropy, an anisotropic stress by the oxidation section is generated in the active layer, so one of a polarization component in a direction parallel to the direction of the stress and a polarization component in a direction orthogonal to the direction of the stress is enhanced, and the other polarization component is suppressed. Thereby, the polarization component of laser light is fixed in one direction.

A method of manufacturing a surface-emitting laser diode of the invention includes the following steps (A) to (D).

(A) A step of laminating a first multilayer reflecting mirror, an active layer and a second multilayer reflecting mirror in this order on a substrate.

(B) A step of forming a coating layer including one or a plurality of ring-shaped opening with a nonuniform width on a top surface side of the second multilayer reflecting mirror.

(C) A step of forming a groove section with a nonuniform depth corresponding to the width of the opening by dry etching using the coating layer as a mask.

(D) A step of forming an oxidation section nonuniformly distributed corresponding to the depth of the groove section in at least one of the first multilayer reflecting mirror and the second multilayer reflecting mirror by oxidizing a side surface of the groove section.

In the method of manufacturing a surface-emitting laser diode of the invention, the groove section with a nonuniform depth corresponding to the width of the opening is formed by dry etching, and the oxidation section nonuniformly distributed corresponding to the depth of the groove section is formed by oxidation after that. At this time, in the case where the nonuniform depth of the groove section has anisotropy, the distribution of the oxidation section has the same anisotropy as the groove section, and an anisotropic stress by the oxidation section is generated in the active layer, so one of a polarization component in a direction parallel to the direction of the stress and a polarization component in a direction orthogonal to the direction of the stress is enhanced, and the other polarization component is suppressed. Thereby, the polarization component of laser light is fixed in one direction.

According to the surface-emitting laser diode of the invention, the oxidation section nonuniformly distributed in a direction rotating around the light emission region is arranged in a periphery of a region corresponding to the light emission region of at least one of the first multilayer reflecting mirror and the second multilayer reflecting mirror, so the polarization direction of laser light can be stabilized in one direction.

According to the method of manufacturing a surface-emitting laser diode of the invention, the groove section with a nonuniform depth corresponding to the width of the opening is formed by dry etching, and the oxidation section nonuniformly distributed corresponding to the depth of the groove section is formed by oxidation after that, so the polarization direction of laser light can be stabilized in one direction.

Moreover, the substrate is not necessarily a special substrate such as an (n11) plane substrate (n is an integer), and may be a (100) plane substrate, so the surface-emitting laser diode can be manufactured easily at low cost. Further, it is not necessary to arrange the oxidation section also in a region corresponding to the light emission region, so there is little possibility that the light output declines, and high-power laser light can be emitted.

Thus, according to the surface-emitting laser diode and the method of manufacturing the same of the invention, the surface-emitting laser diode can be manufactured easily at low cost, and the polarization direction of laser light can be stabilized in one direction, and higher output can be achieved.

BEST MODES FOR CARRYING OUT THE INVENTION

Preferred embodiments will be described in detail below referring to the accompanying drawings.

First Embodiment

Figure 1:
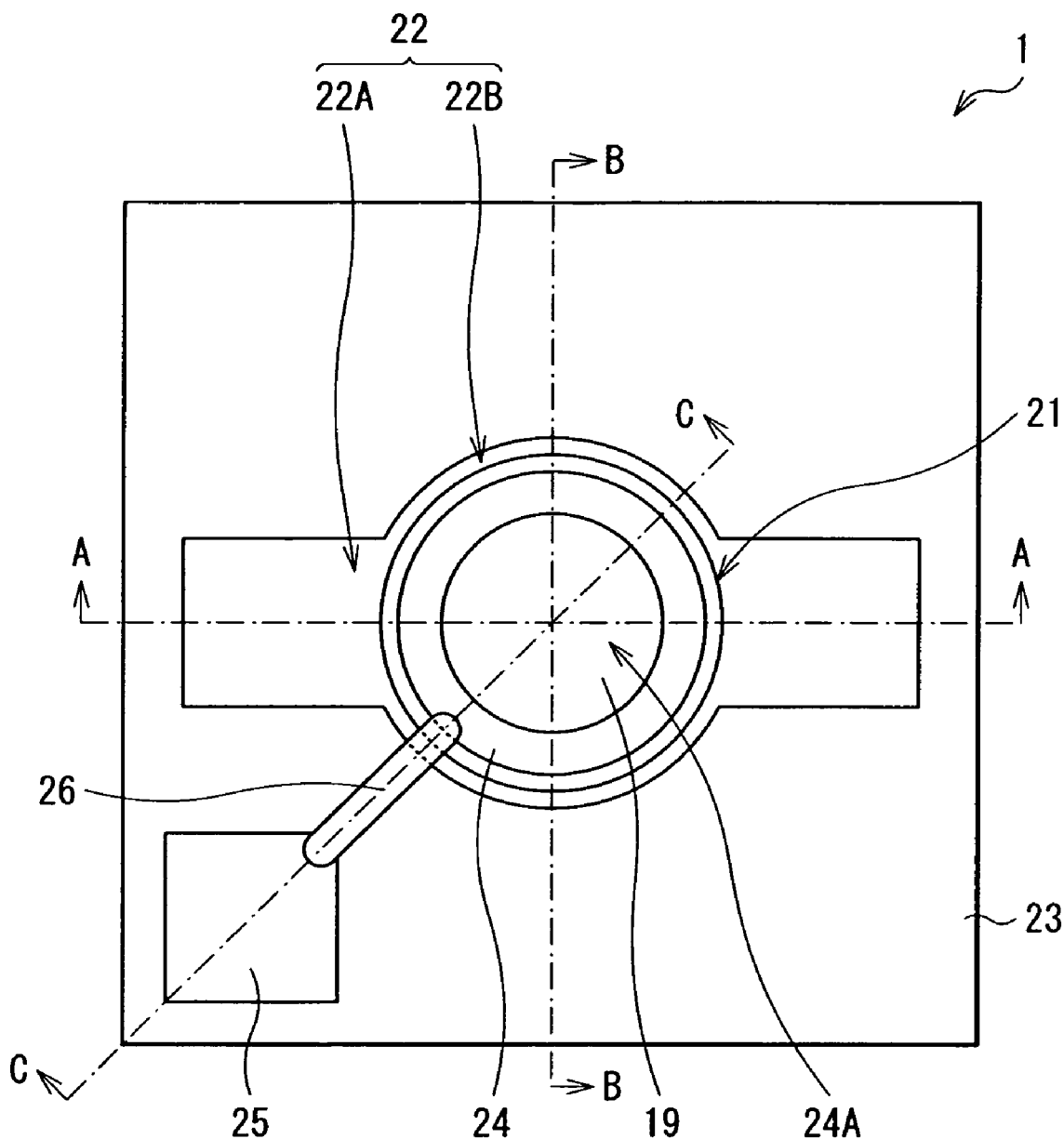
FIG. 1 is a top view of a surface-emitting laser diode according to a first embodiment of the invention.
Figure 2:
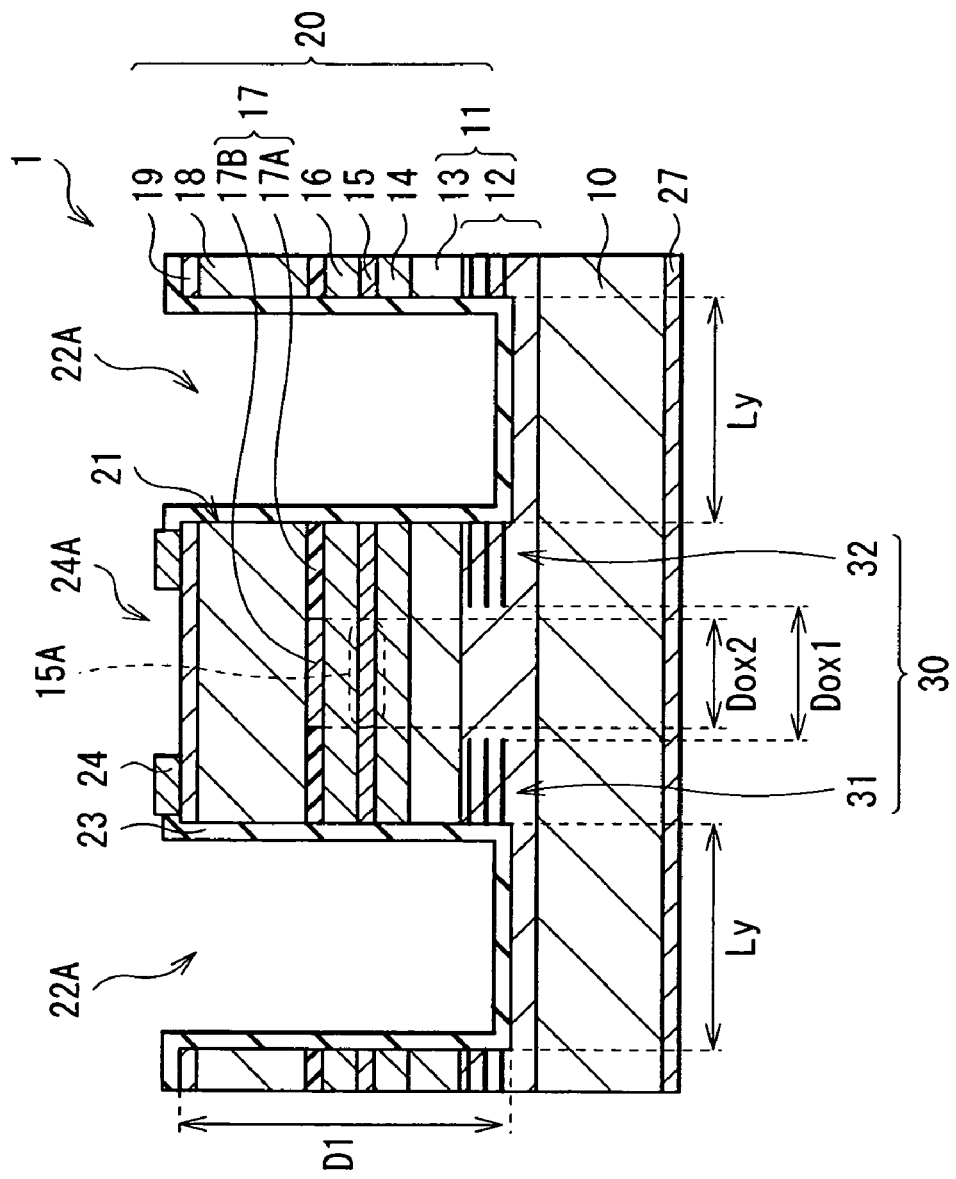
FIG. 2 is an illustration showing a sectional configuration of the laser diode taken along an arrow direction A-A of FIG. 1.
Figure 3:
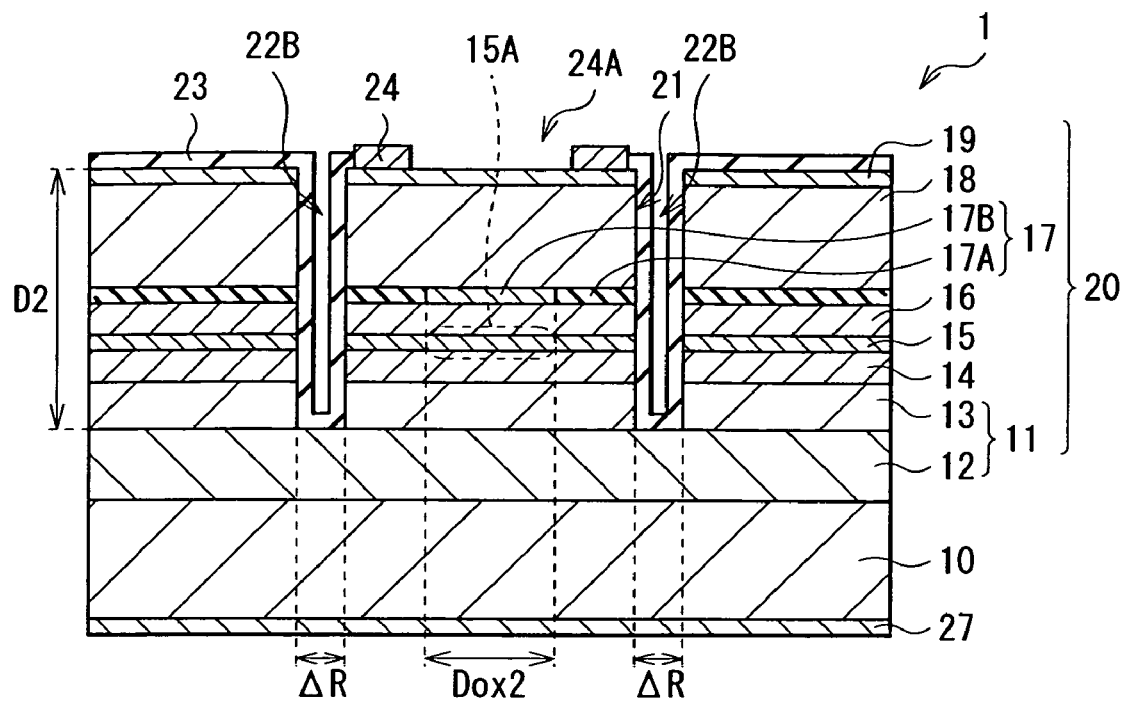
FIG. 3 is an illustration showing a sectional configuration of the laser diode taken along an arrow direction B-B of FIG. 1.
Figure 4:
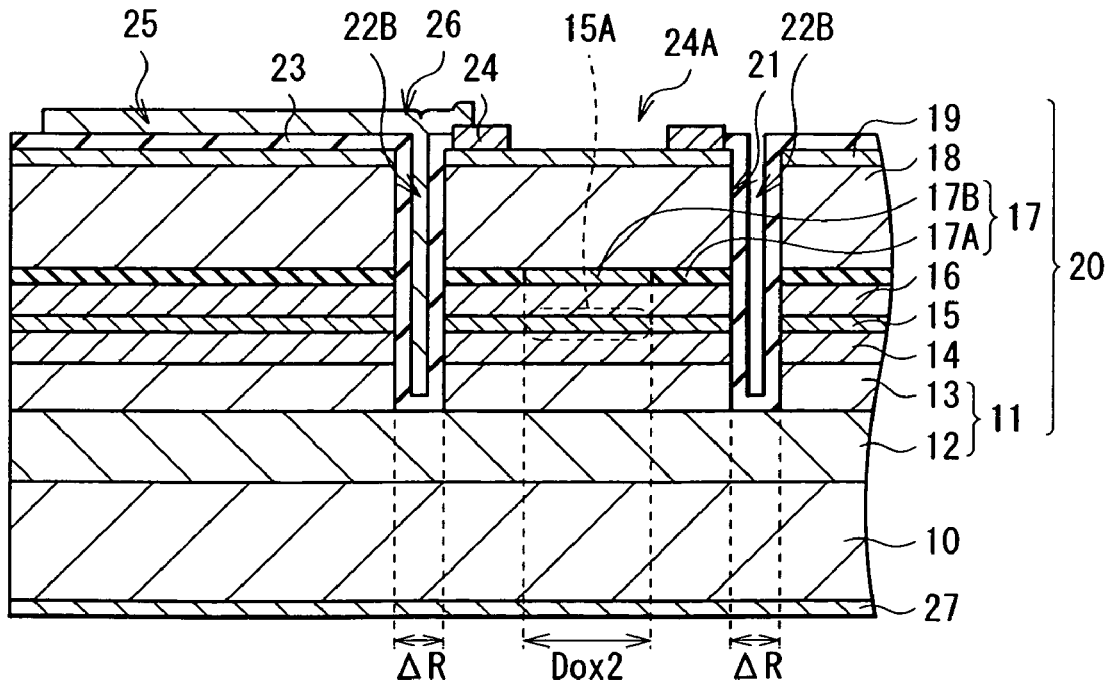
FIG. 4 is an illustration showing a sectional configuration of the laser diode taken along an arrow direction C-C of FIG. 1.
Figure 5:
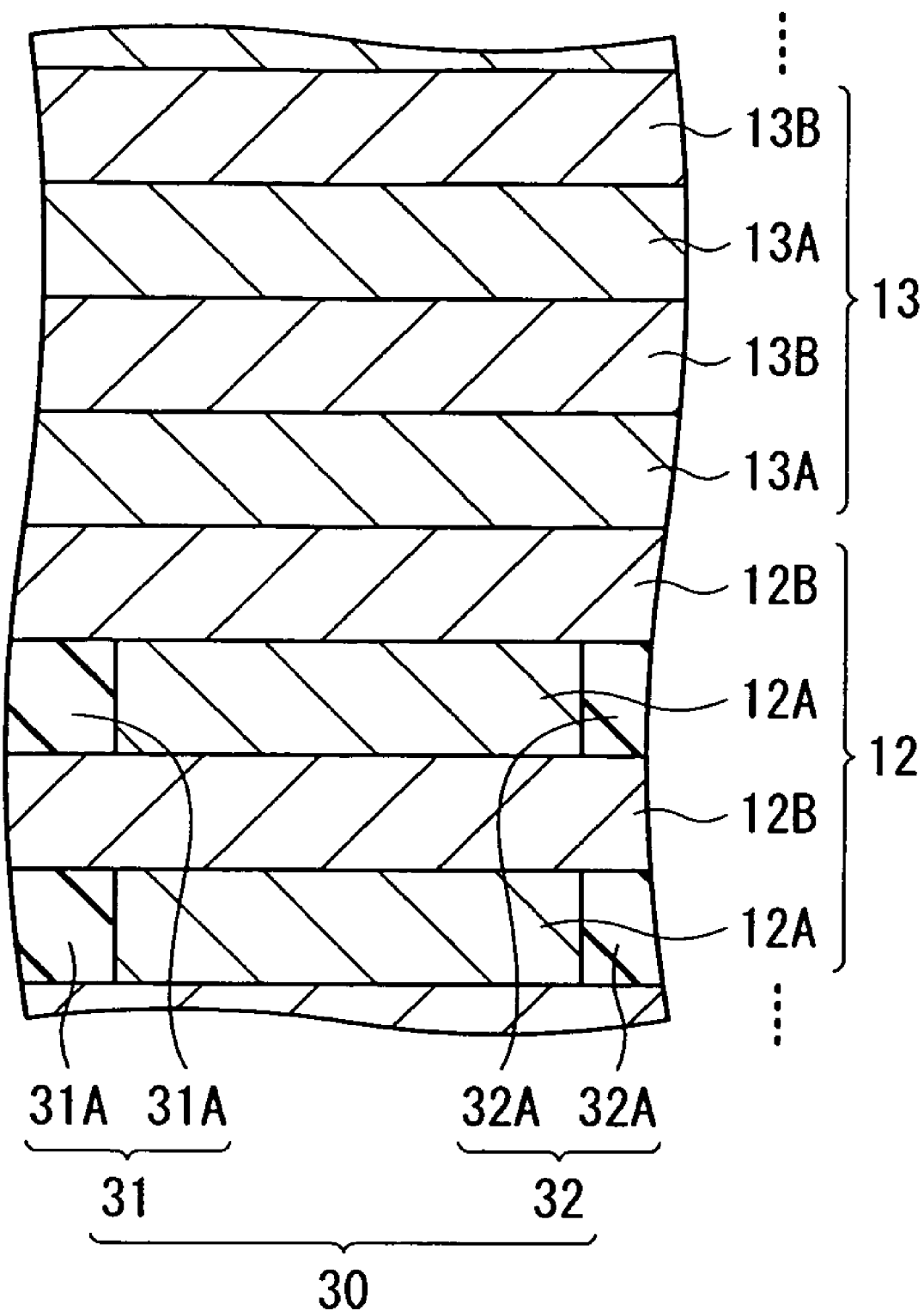
FIG. 5 is an enlarged view of an example of a sectional configuration of a lower DBR mirror layer in FIG. 2.
Figure 6:
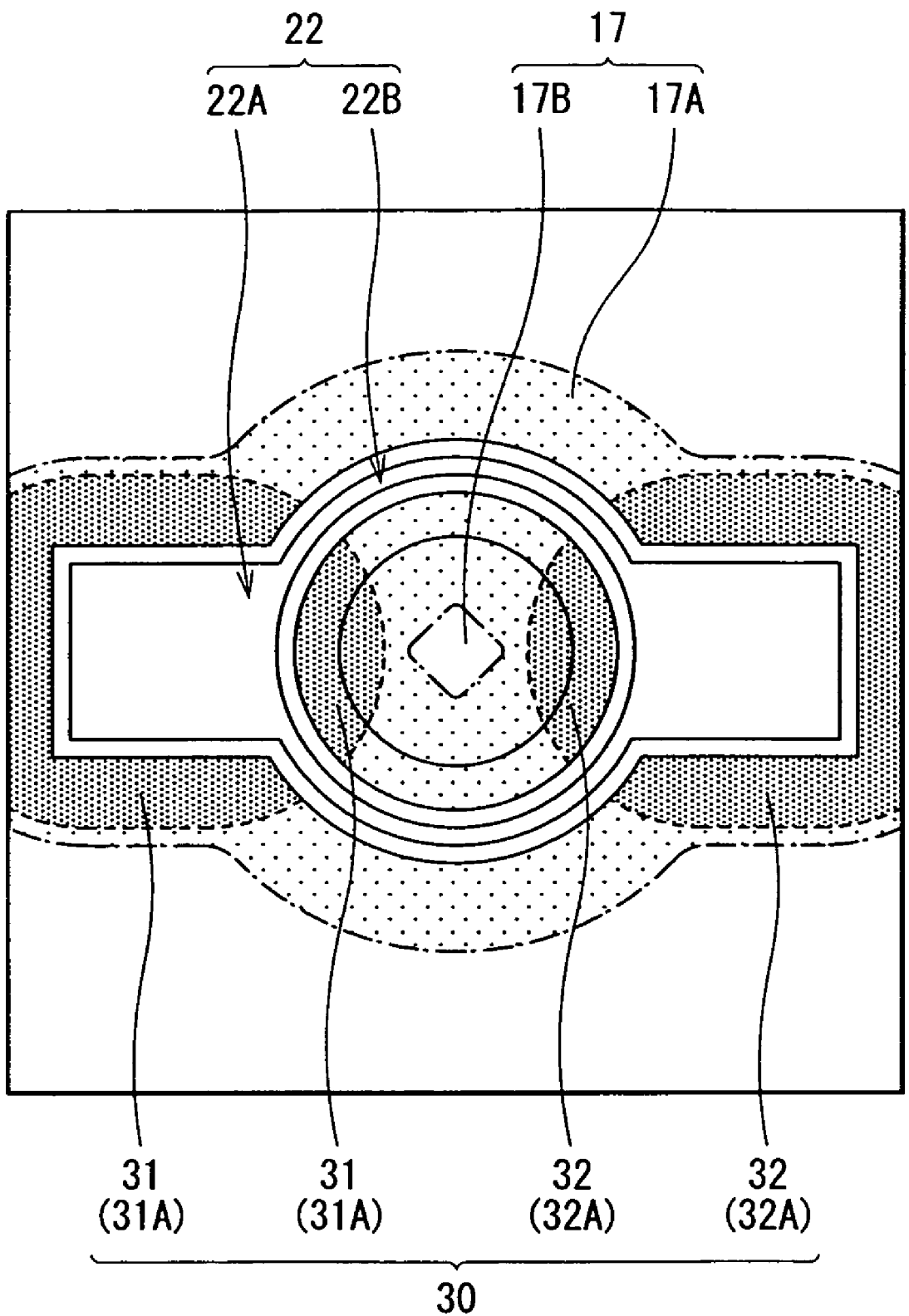
FIG. 6 is an illustration showing plan configurations of an oxidation section and a current confinement layer in FIG. 2.
Figure 7:
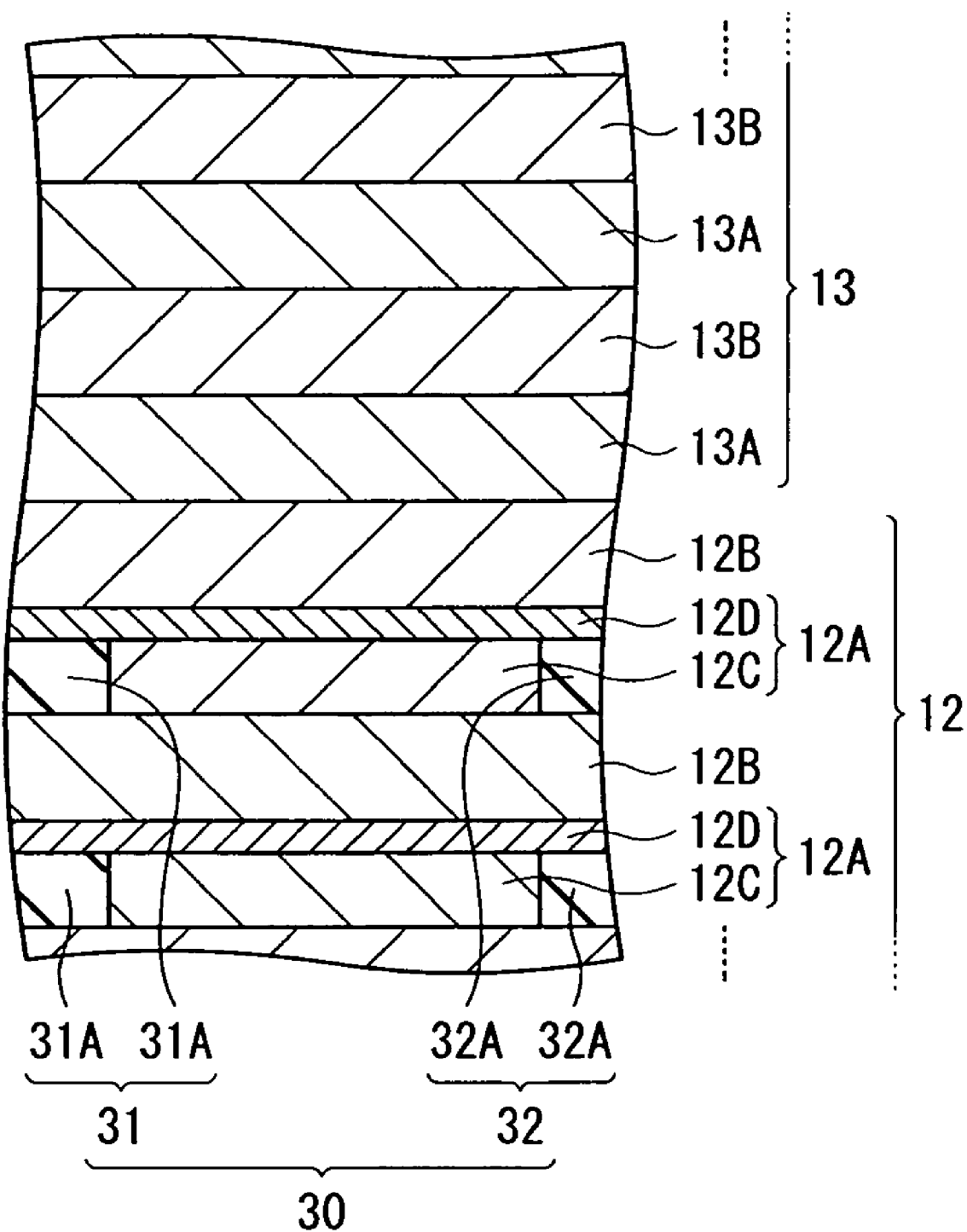
FIG. 7 is an enlarged view of another example of the sectional configuration of the lower DBR mirror layer in FIG. 2.
Figure 8:
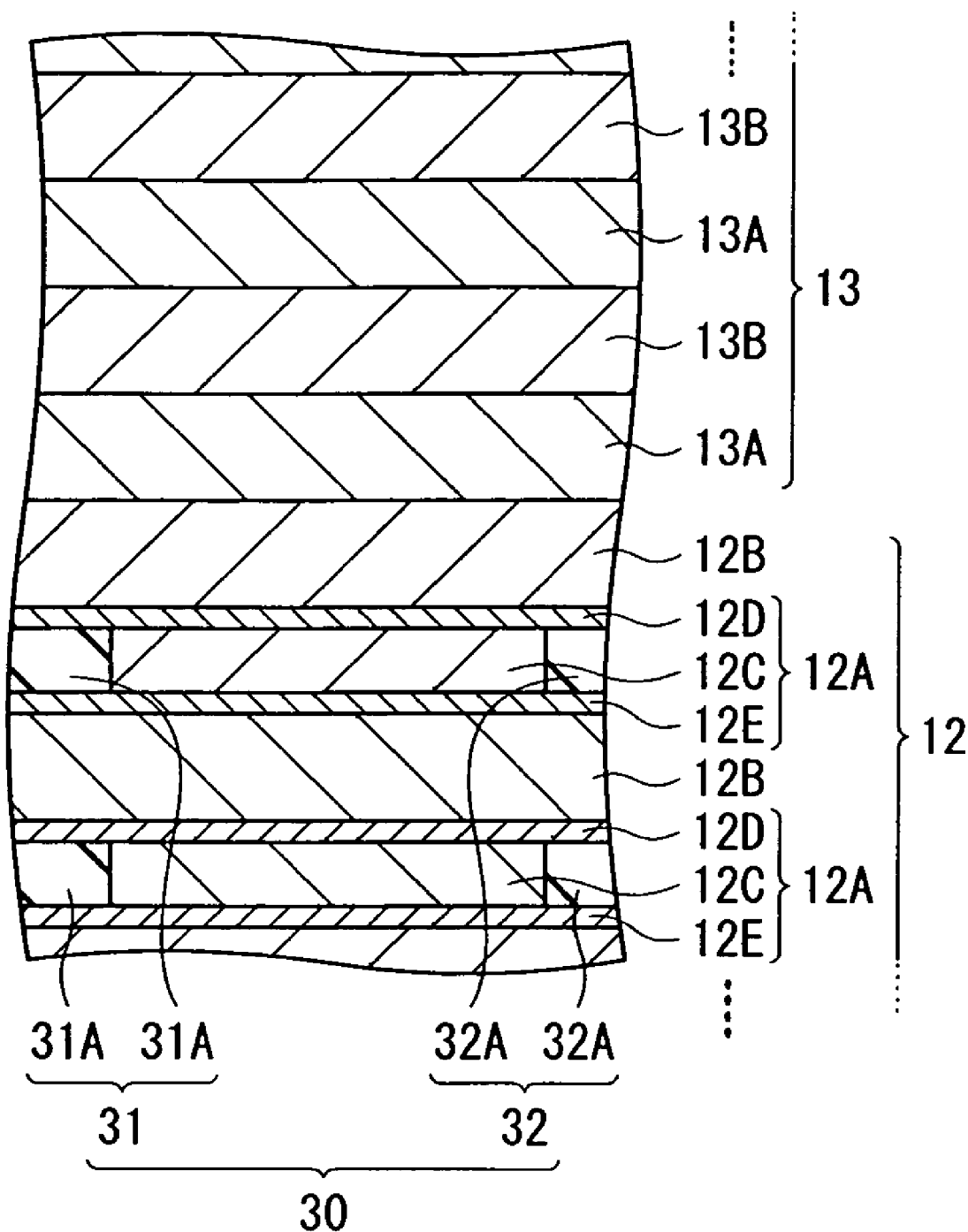
FIG. 8 is an enlarged view of another example of the sectional configuration of the lower DBR mirror layer in FIG. 2.

FIG. 1 shows a top view of a surface-emitting laser diode 1 according to a first embodiment of the invention. FIG. 2 shows a sectional configuration of the surface-emitting laser diode 1 taken along an arrow direction A-A of FIG. 1, and FIG. 3 shows a sectional configuration of the surface-emitting laser diode 1 taken along an arrow direction B-B of FIG. 1, and FIG. 4 shows a sectional configuration of the surface-emitting laser diode 1 taken along an arrow direction C-C of FIG. 1. FIG. 5 shows an example of a sectional configuration of a lower DBR mirror layer 11 (which will be described later) in FIG. 2, and FIGS. 7 and 8 show modified examples of the sectional configuration of the lower DBR mirror layer 11 in FIG. 2. FIG. 6 shows distributions (shapes) viewed from the top of a current confinement layer 17 and an oxidation section 11A (which will be described later) while seeing through the surface-emitting laser diode 1 shown in FIG. 1.

The surface-emitting laser diode 1 includes a light emission section 20 on one surface of a substrate 10. The light emission section 20 is configured by laminating the lower DBR mirror layer 11 (a first multilayer reflecting mirror), a lower spacer layer 14, an active layer 15, an upper spacer layer 16, the current confinement layer 17, an upper DBR mirror layer 18 (a second multilayer reflecting mirror) and a contact layer 19 in this order from the substrate 10 side. In the light emission section 20, for example, a columnar mesa section 21 with a width of approximately 10 μm to 30 μm and a groove section 22 surrounding the mesa section 21 are formed in a part of the lower DBR mirror layer 11, the lower spacer layer 14, the active layer 15, the upper spacer layer 16, the current confinement layer 17, the upper DBR mirror layer 18 and the contact layer 19.

The groove section 22 is a ring-shaped groove having a nonuniform width, and has a nonuniform depth according to (in proportion to) the width of the groove. More specifically, a pair of grooves 22A with a width in a radical direction Ly and a width in a circumferential direction Lx are arranged in a portion corresponding to one axis (a line A-A of FIG. 1) parallel to a laminate surface and passing through a central portion of the mesa section 21, and a pair of grooves 22B with a width in a radical direction ΔR are arranged in communication with the grooves 22A. The grooves 22A each have a depth D1 reaching a lower first DBR mirror layer 12 (which will be described later) of the lower DBR mirror layer 11. On the other hand, the grooves 22B each have a depth D2 not reaching the lower first DBR mirror layer 12. In other words, the depth D2 of the groove 22B is smaller than the depth D1 of the groove 22A, and the height of the mesa section 21 is nonuniform corresponding to the depth of the groove section 22 accordingly, and the layer configuration exposed to a side surface of the mesa section 21 varies corresponding to the depth of the groove section 22. In addition, in FIG. 3, the case where the grooves 22B reach a lower second DBR mirror layer 13 (which will be described later) of the lower DBR mirror layer 11 is exemplified.

Herein, Lx and Ly is preferably large enough to prevent an etching rate which will be described later from being slowed down, and preferably 5 μm or more. Moreover, ΔR is preferably smaller than Lx and Ly, and is preferably large enough for the etching rate of the grooves 22B to become slower than that of the groove 22A by a loading effect which will be described later, and preferably within a range from 1 μm to 3 μm both inclusive, and more preferably 2 μm.

The substrate 10 is, for example, an n-type GaAs substrate, and the GaAs substrate is preferably, for example, a (100) plane substrate; however, the GaAs substrate may be a special substrate such as an (n11) plane substrate (n is an integer).

The lower DBR mirror layer 11 has a configuration in which the lower first DBR mirror layer 12 (a third multilayer reflecting mirror) and the lower second DBR mirror layer 13

(a fourth multilayer reflecting mirror) are laminated in this order from the substrate 10 side. As shown in FIG. 5, the lower first DBR mirror layer 12 is configured by laminating a plurality of pairs of a low refractive index layer 12A and a high refractive index layer 12B. The low refractive index layer 12A is made of, for example, n-type $Al_{x1}Ga_{1-x1}As$ with an optical thickness of $\lambda/4$ ($\lambda$ is an oscillation wavelength), and the high refractive index layer 12B is made of, for example, n-type $Al_{x2}Ga_{1-x2}As$ with an optical thickness of $\lambda/4$. The lower second DBR mirror layer 13 is configured by laminating a plurality of pairs of a low refractive index layer 13A and a high refractive index layer 13B. The low refractive index layer 13A is made of, for example, n-type $Al_{x3}Ga_{1-x3}As$ with an optical thickness of $\lambda/4$, and the high refractive index layer 13B is made of, for example, n-type $Al_{x4}Ga_{1-x4}As$ with an optical thickness of $\lambda/4$. In addition, as an n-type impurity, for example, silicon (Si), selenium (Se) or the like is cited.

Herein, the values x1 to x4 of Al composition in the lower DBR mirror layer 11 satisfy the following formula. Thereby, the low refractive index layer 12A of the lower first DBR mirror layer 12 is more susceptible to oxidation than the low refractive index layer 13A of the lower second DBR mirror layer 13, and has resistance to oxidation equal to or higher than that of the current confinement layer 17.

$$1 \geq x9 \geq x1 > (x3, x10) > 0.8 > (x2, x4) \geq 0 \quad (1)$$

In the formula (1), (x3, x10) means x3 or x10, and (x2, x4) means x2 or x4. Moreover, x9 is the value of Al composition included in a material of which the current confinement layer 17 is made, and x10 is the value of Al composition included in a material of which the low refractive index layer of the upper DBR mirror layer 18 is made. Further, 0.8 corresponds to a boundary between the refractive index of the low refractive index layer and the refractive index of the high refractive index layer.

However, in a region, which is a periphery of a region corresponding to a central region (a light emission region 15A which will be described later) of the mesa section 21 and surrounds the grooves 22A, of each low refractive index layer 12A of the lower first DBR mirror layer 12, an oxidation section 30 is formed by oxidizing a part of the low refractive index layer 12A. The oxidation section 30 includes a pair of oxidation layers 31A and 32A, and the pair of oxidation layers 31A and 32A are arranged so as to face each other at a distance Dox1 with a region corresponding to the light emission region 15A of the lower first DBR mirror layer 12 (the region is also a region corresponding to a current injection region 17B which will be describe later) in between, and are formed corresponding to the groove 22A with a larger depth of the groove section 22. In other words, the oxidation section 30 is nonuniformly distributed in a direction rotating around the light emission region 15A, and a nonuniform stress according to the distribution of the oxidation section 30 is generated in the active layer 15.

Herein, assuming that a length in a radial direction of the current injection region 17B is Dox2, the distance Dox1 is preferably larger than Dox2, and in the case where high-order transverse mode oscillation is desired to be suppressed, the distance Dox1 is preferably within a range from Dox2+1 μm to 15 μm both inclusive. Moreover, in the case where the high-order transverse mode oscillation is desired to be further suppressed, the distance Dox1 is preferably within a range from Dox2+1 μm to 10 μm both inclusive. Further, in the case where a loss of light emission efficiency by the oxidation layers 31A and 32A is desired to be prevented, the distance Dox1 is preferably larger than the distance Dox2, and more preferably equal to or larger than 1.1×Dox2.

The oxidation layers 31A and 32A each include $Al_2O_3$ (aluminum oxide), and as will be described later, the oxidation layers 31A and 32A are obtained by oxidizing highly-concentrated Al included in the low refractive index layer 12A from side surfaces of the mesa section 21 and the groove section 22. Therefore, the oxidation layers 31A are laminated with the high refractive index layer 12B in between in the lower DBR mirror layer 11 to constitute a multilayer film 31 (a first multilayer film), and the oxidation layers 32A are laminated with the high refractive index layer 12B in between in the lower DBR mirror layer 11 to constitute a multilayer film 32 (a second multilayer film). In addition, the lower first DBR mirror layer 12 is not exposed in a portion facing the groove 22B in a side surface of the mesa section 21, so the oxidation layers 31A and 32A are not distributed in a portion except for a portion adjacent to the groove 22A of the portion.

By the way, the low refractive index layer 12A of the lower first DBR mirror layer 12 is not limited to the above-described composition, and can have, for example, a configuration shown in FIG. 7 or 8 while its optical thickness is maintained at $\lambda/4$. For example, as shown in FIG. 7, in the case where a first refractive index layer 12C made of $Al_{x5}Ga_{1-x5}As$ and a second refractive index layer 12D made of $Al_{x6}Ga_{1-x6}As$ are laminated in this order from the substrate 10 side, values x2 to x6 of Al composition are set to values satisfying the following formula (2), and as shown in FIG. 8, in the case where a third refractive index layer 12E made of $Al_{x7}Ga_{1-x7}As$, the first refractive index layer 12C made of $Al_{x5}Ga_{1-x5}As$ and the second refractive index layer 12D made of $Al_{x6}Ga_{1-x6}As$ are laminated in this order from the substrate 10 side, the values x2 to x7 of Al composition are set to values satisfying the following formula (3).

$$1 \geq x5 = x9 > (x6, x3, x10) > 0.8 > (x2, x4) \geq 0 \quad (2)$$

$$1 \geq x5 = x9 > (x6, x7, x3, x10) > 0.8 > (x2, x4) \geq 0 \quad (3)$$

In the formula (2), (x6, x3, x10) means x6, x3 or x10, and in Formulas (2) and (3), (x2, x4) means x2 or x4, and in the formula (3), (x6, x7, x3, x10) means x6, x7, x3 or x10.

The lower spacer layer 14 is made of, for example, $Al_{x8}Ga_{1-x8}As$ (0<x8<1). The active layer 15 is made of, for example, a GaAs-based material. In the active layer 15, a region facing the current injection region 17B which will be described later is a light emission region 15A, and a central region (a light emission central region) of the light emission region 15A is a region where fundamental transverse mode oscillation mainly occurs, and an edge region surrounding the light emission central region of the light emission region 15A is a region where high-order transverse mode oscillation mainly occurs. The upper spacer layer 16 is made of, for example, $Al_{x12}Ga_{1-x12}As$ (0<x12<1). It is desirable that the lower spacer layer 14, the active layer 15 and the upper spacer layer 16 do not include an impurity, but they may include a p-type or n-type impurity. As the p-type impurity, zinc (Zn), magnesium (Mg), beryllium (Be) or the like is cited.

The current confinement layer 17 includes a current confinement region 17A in an edge region thereof, and the current injection region 17B in a central region thereof. The current injection region 17B is made of, for example, p-type $Al_{x9}Ga_{1-x9}As$ (0<x9≦1). The current confinement region 17A includes $Al_2O_3$ (aluminum oxide), and as will be described later, the current confinement region 17A is obtained by oxidizing highly-concentrated Al included in an $Al_{x9}Ga_{1-x9}As$ layer 17D from a side surface side of the mesa section 21. In other words, the current confinement layer 17 has a function of confining a current.

The current injection region 17B has a quadrilateral (for example, rhombic) shape having diagonal lines in a [011] direction and a [01-1] direction, and has in-plane anisotropy. The reason why the current confinement region 17A has a quadrilateral shape having diagonal lines in the [011] direction and the [01-1] direction is because the oxidation rate of $Al_{x9}Ga_{1-x9}As$ in the [011] direction and the [01-1] direction is different from that in a [001] direction and a [010] direction which form an angle of 45° with these directions. In this case, the length Dox2 of the diagonal line of the current injection region 17B is preferably within a range from 3 μm to 8 μm both inclusive in the case where high-order transverse mode oscillation is desired to be suppressed. Moreover, in the case where the high-order transverse mode oscillation is desired to be further suppressed, the length Dox2 is preferably within a range from 3 μm to 5 μm both inclusive.

The upper DBR mirror layer 18 is configured by laminating a plurality of pairs of a low refractive index layer and a high refractive index layer. The low refractive index layer is made of, for example, p-type $Al_{x10}Ga_{1-x10}As$ (0<x10<1) with an optical thickness of λ/4, and the high refractive index layer is made of, for example, p-type $Al_{x11}Ga_{1-x11}As$ (0<x11<1) with an optical thickness of λ/4. The contact layer 19 is made of, for example, p-type GaAs.

In the surface-emitting laser diode 1 of the embodiment, a protective film 23 is also formed on an edge portion of a top surface of the mesa section 21, an inner surface of the groove section 22, and a surface of the contact layer 19 except for the mesa section 21. A ring-shaped upper electrode 24 including a light emission opening 24A in a region corresponding to the above-described current injection region 17B is formed on the surface of the contact layer 19, and an upper electrode pad 25 is formed on a surface of a portion away from the mesa section 21 of the protective film 23. Then, as shown in FIGS. 1 and 4, a connection section 26 is formed on a surface of a portion including the groove 22B of the protective film 23, and the upper electrode 24 and the upper electrode pad 25 are electrically connected to each other through the connection section 26. Moreover, a lower electrode 27 is formed on a back surface of the substrate 10.

The protective film 23 is formed of, for example, an insulating material such as an oxide or a nitride, and is formed so as to be laid over an area from an edge portion of the contact layer 19 to an inner surface of the groove section 22, and an area in proximity to the area. The upper electrode 24 and the upper electrode pad 25 each are configured by laminating, for example, a titanium (Ti) layer, a platinum (Pt) layer and a gold (Au) layer in this order, and are electrically connected to the contact layer 19. The connection section 26 is a section in which a plating layer is formed on a laminate configuration formed by laminating, for example, a Ti layer, a Pt layer and a Au layer in this order. The lower electrode 27 has a configuration in which a gold (Au)-germanium (Ge) alloy layer, a nickel (Ni) layer and a gold (Au) layer are laminated in order from the substrate 10 side, and is electrically connected to the substrate 10.

The surface-emitting laser diode 1 according to the embodiment can be manufactured by, for example, the following steps.

Figure 9A:
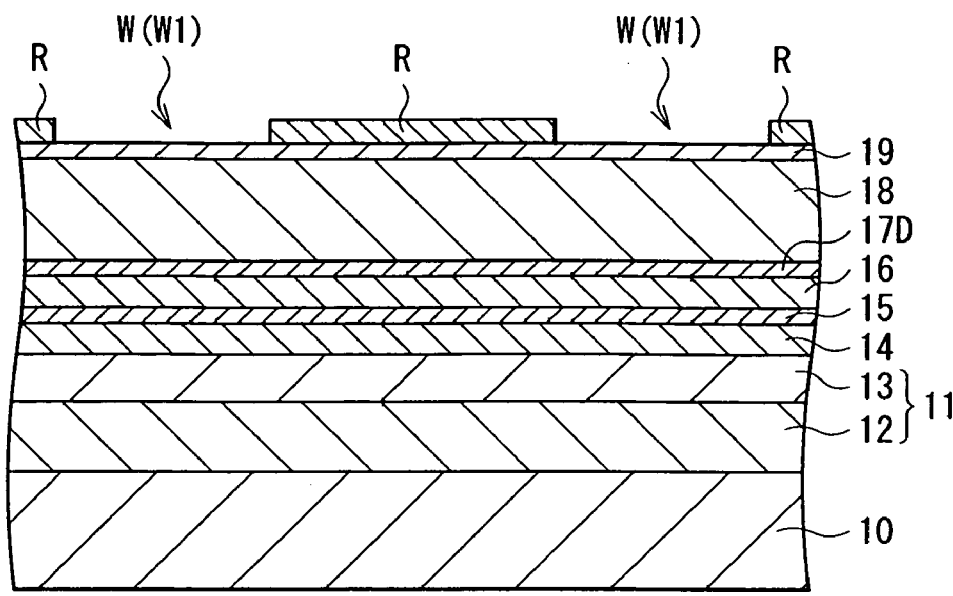
FIG. 9 is a sectional view and a top view for describing a step of manufacturing the laser diode in FIG. 1.
Figure 9B:
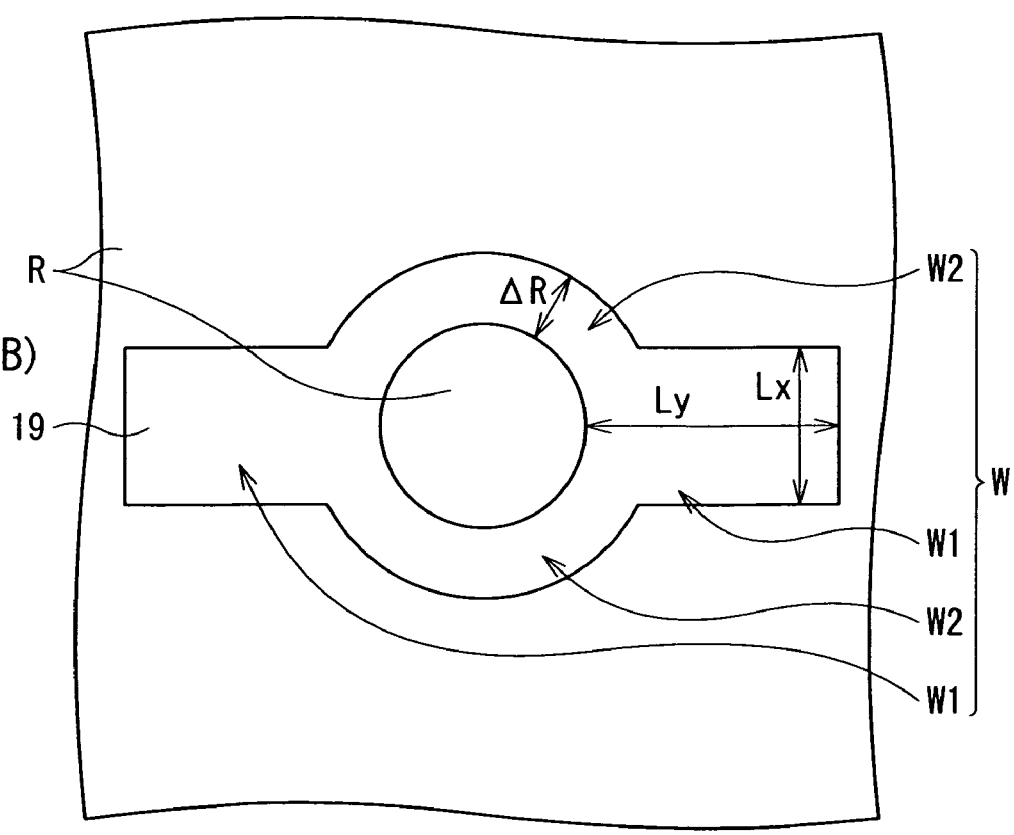
Figure 10A:
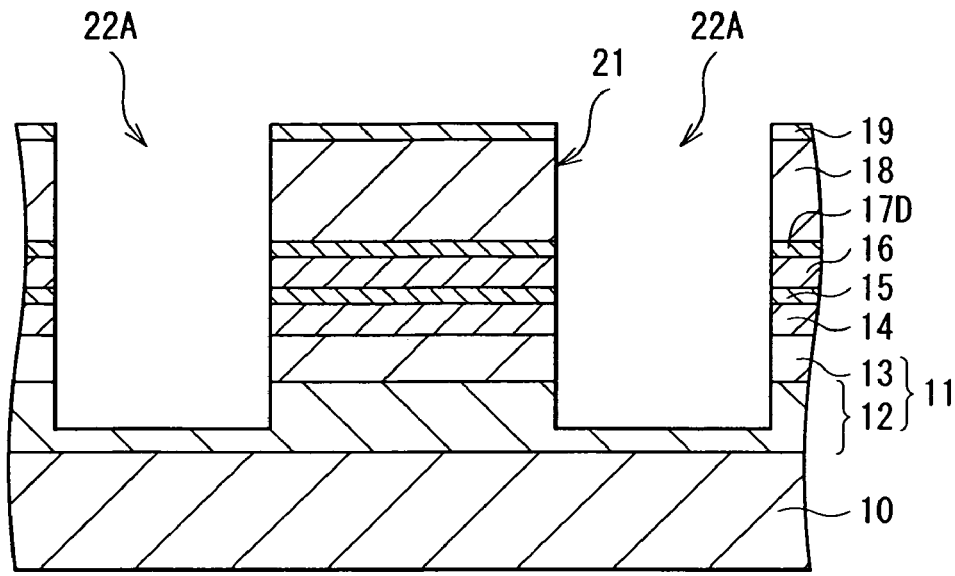
FIG. 10 is a sectional view for describing a step following FIG. 9.
Figure 10B:
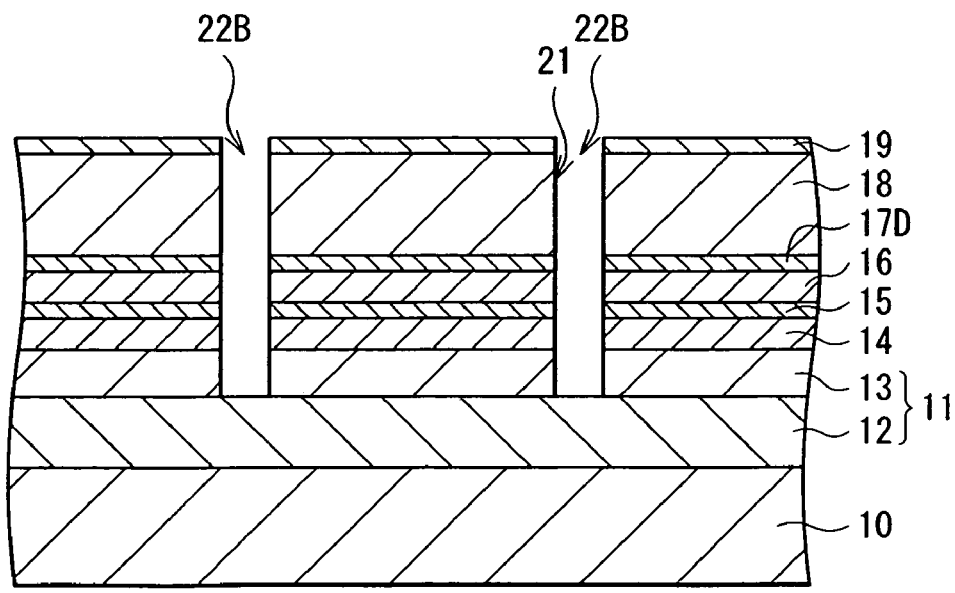
Figure 11A:
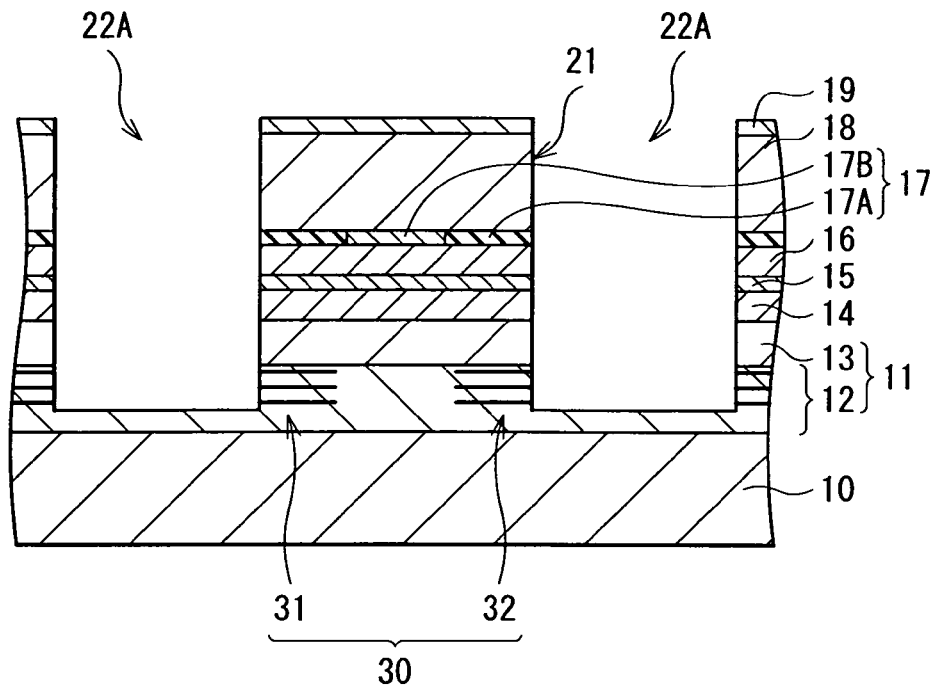
FIG. 11 is a sectional view for describing a step following FIG. 10.
Figure 11B:
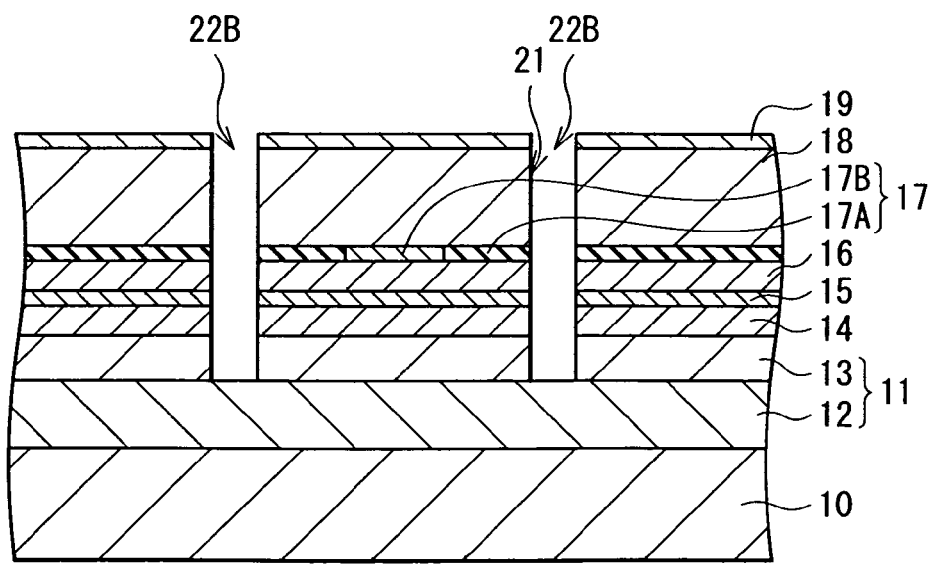
Figure 12:
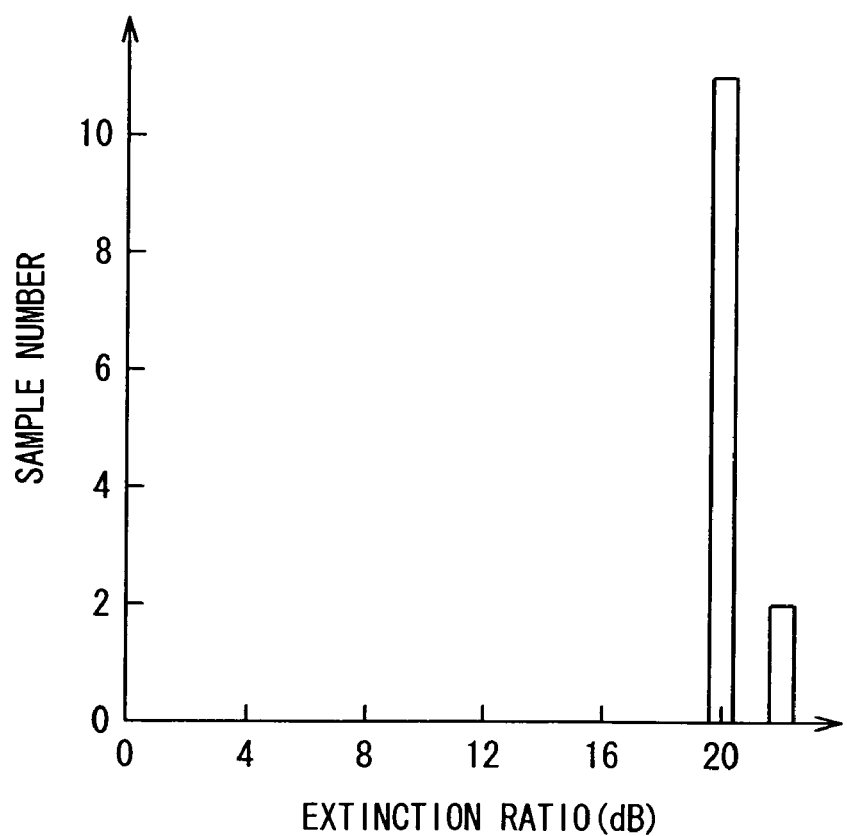
FIG. 12 is a relationship diagram showing an example of a relationship between an extinction ratio between orthogonal polarized waves and power supply.
Figure 12:
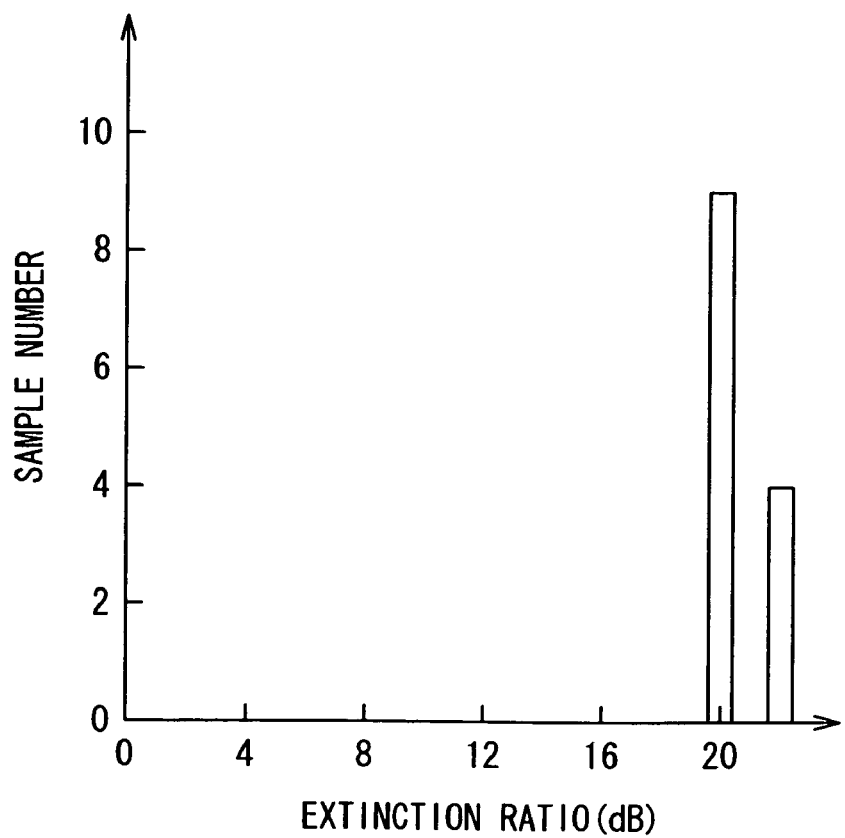
Figure 13A:
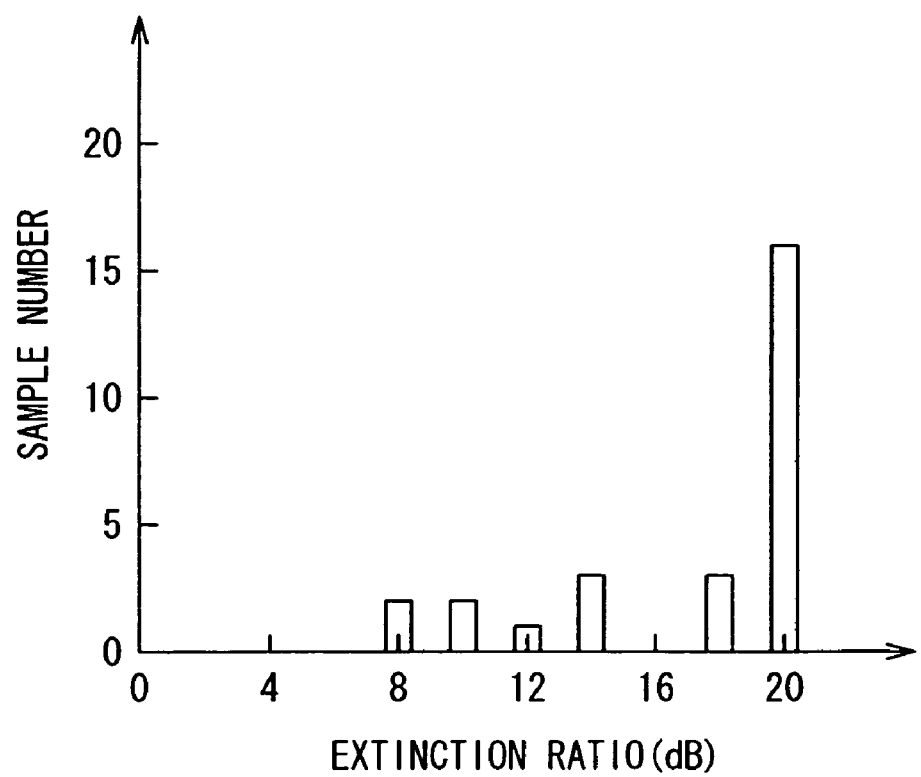
FIG. 13 is a relationship diagram showing a comparative example of a relationship between an extinction ration between orthogonal polarized waves and power supply.
Figure 13B:
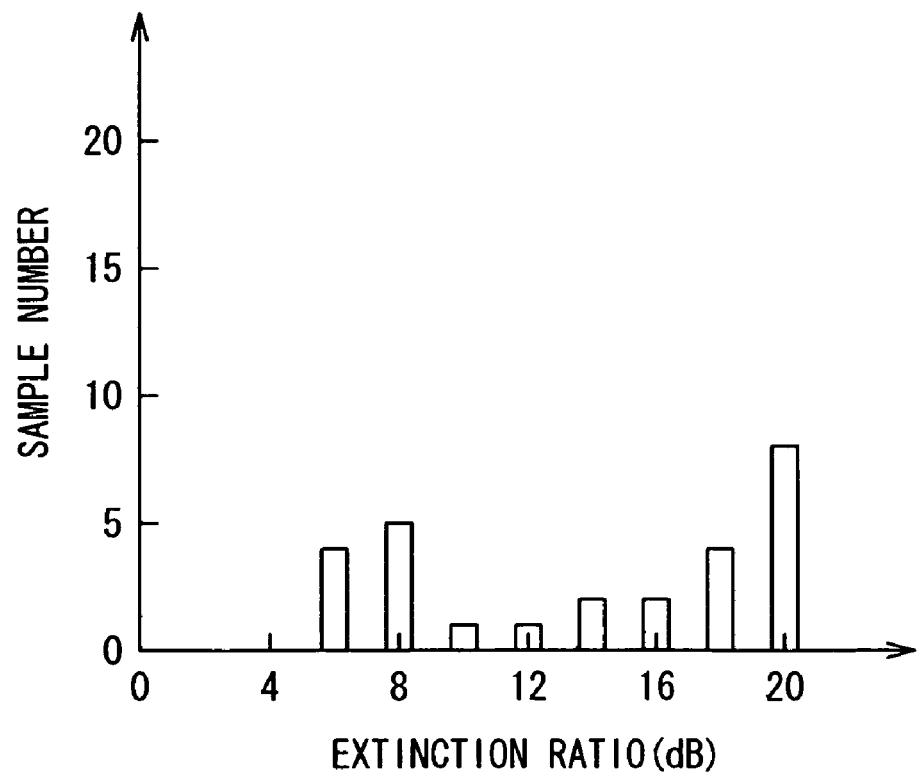

FIGS. 9(A) and 9(B) to 11(A) and 11(B) show steps of the manufacturing method in order. In addition, FIGS. 9(A), 10(A) and 11(A) show sectional configurations of a device in a manufacturing process taken along the same direction as an arrow direction A-A of FIG. 1, FIG. 9(B) shows a top surface configuration of FIG. 9(A), and FIGS. 10(B) and 11(B) show sectional configurations of the device in a manufacturing process taken along the same direction as an arrow direction B-B of FIG. 1.

In this case, a compound semiconductor layer on the substrate 10 made of GaAs is formed by, for example, a MOCVD (Metal Organic Chemical Vapor Deposition) method. At this time, as a material of a Group III-V compound semiconductor, for example, trimethyl aluminum (TMA), trimethyl gallium (TMG), trimethyl indium (TMIn) and arsine (AsH3) are used, and as a material of a donor impurity, for example, H2Se is used, and as a material of acceptor impurity, for example, dimethyl zinc (DMZ) is used.

At first, after the lower first DBR mirror layer 12, the lower second DBR mirror layer 13, the lower spacer layer 14, the active layer 15, the upper spacer layer 16, the $Al_{x9}Ga_{1-x9}As$ layer 17D, the upper DBR mirror layer 18 and the contact layer 19 are laminated in this order on the substrate 10, a resist layer R having a ring-shaped opening W with a nonuniform width is formed on a surface of the contact layer 19 (refer to FIGS. 9(A) and 9(B)). More specifically, the opening W includes a pair of arc-shaped openings W1 with a width Ly in a radial direction and a width Lx in a circumferential direction and a pair of arc-shaped openings W2 with a width ΔR in a radial direction in communication with the pair of openings W1.

Next, etching is performed from the contact layer 19 side by, for example, a reactive ion etching (RIE) method. Then, a loading effect is generated by the nonuniform width of the opening W, and the etching rate in the opening W2 with a small width is slower than that in the opening W1 with a large width. As a result, the groove 22A with the depth D1 is formed corresponding to the opening W1, and the groove 22B with the depth D2 is formed corresponding to the opening W2 (refer to FIGS. 10(A) and 10(B)). When the groove 22A and the groove 22B are formed in such a manner, the mesa section 21 is formed in a portion surrounded by the groove 22A and the groove 22B.

Next, an oxidation process is performed at high temperature in a water vapor atmosphere, and Al of the low refractive index layer 12A and the $Al_{x9}Ga_{1-x9}As$ layer 17D is selectively oxidized from the inside of the groove section 22. Thereby, regions around the groove section 22 of the low refractive index layer 12A and the $Al_{x9}Ga_{1-x9}As$ layer 17D become insulating layers (aluminum oxide). In other words, a pair of multilayer films 31 and 32 facing each other with a region corresponding to the light emission region 15A in between are formed in a region around a region corresponding to the light emission region 15A of the active layer 15 and surrounding the groove 22A in each low refractive index layer 12A, and the current confinement region 17A having an opening corresponding to the light emission region 15A is further formed, and the opening becomes the current injection region 17B (refer to FIGS. 11(A) and 11(B)).

When the loading effect is generated through the use of the resist layer R having the ring-shaped opening W with a nonuniform width in such a manner, the groove section 22 with a nonuniform depth can be formed by one etching process. Moreover, when the oxidation process is performed through the use of the groove section 22 with a nonuniform depth, the oxidation section 30 nonuniformly distributed in a direction rotating around the light emission region 15A can be easily formed.

Next, after an insulating material is deposited all over the surfaces of the mesa section 21, the groove section 22 and the periphery of the groove section 22 by, for example, a CVD (Chemical Vapor Deposition) method, a portion corresponding to a top surface of the mesa section 21 of the insulating material deposited by etching is selectively removed to expose the contact layer 19 (refer to FIGS. 2(A) and 2(B)). Next, after a metal material is laminated all over the surface by, for example, a vacuum deposition method, the upper electrode 24 having the light emission opening 24A is formed on the top surface of the mesa section 21 (an exposed portion of the contact layer 19) by, for example, selective etching, and the upper electrode pad 25 is formed in a position away from the mesa section 21 by, for example, selective etching. Moreover, the connection section 26 is formed by plating to electrically connect the upper electrode 24 and the upper electrode pad 25 to each other, and after the back surface of the substrate 10 is polished as necessary to adjust the thickness of the substrate 10, the lower electrode 27 is formed on the back surface of the substrate 10. Finally, the substrate 10 is divided into small chips by dicing. Thus, the surface-emitting laser diode 1 is manufactured.

However, in the above-described manufacturing steps, when the depth D1 of the groove 22A is changed by changing the etching time, the layer number of the low refractive index layers 12A exposed to an inner surface of the groove 22A is changed. Therefore, when the depth D1 of the groove 22A is increased with an increase in the etching time, the layer number of the exposed low refractive index layers 12A is increased, and conversely when the depth D1 of the groove 22A is reduced with a decrease in the etching time, the layer number of the exposed low refractive index layers 12A is reduced. At this time, the depth D2 of the groove 22B is changed depending on the etching time; however, in the case where the depth D2 is changed within the above-described range, the low refractive index layer 12A is not exposed to the inner surface of the groove 22A, so there is little possibility that a portion facing the groove 22B of the low refractive index layer 12A is oxidized, and there is no possibility that a stress in a direction in which the grooves 22B face each other is generated in the active layer 15. Therefore, even if the depth D1 of the groove 22A is small, a stress in a direction in which the grooves 22A face each other can be generated in the active layer 15, and the stress in the direction in which the grooves 22A face each other can be increased according to (in proportion to) the depth D1 of the groove 22A. In other words, the magnitude of an anisotropic stress generated in the active layer 15 can be freely set.

Moreover, as exemplified in FIGS. 7 and 8, in the case where the low refractive index layer 12A has a laminate configuration of a layer with a high Al composition and a layer with a low Al composition, the oxidation rate of the low refractive index layer 12A can be freely controlled by changing the thicknesses of these layers in a state in which the Al compositions of these layers are uniform. Then, for example, the oxidation rate can be the same as that in the case where the low refractive index layer 12A is a single layer, so as in the case where the values x1 to x4 of Al composition in the lower DBR mirror layer 11 satisfy the formula (1) in the case where the low refractive index layer 12A is a single layer, the low refractive index layer 12A can have such a property that the low refractive index layer 12A is more susceptible to oxidation than the low refractive index layer 13A, and has resistance to oxidation equal to or higher than that of the current confinement layer 17.

In addition, depending on oxidation conditions, for example, in the case where the value x9 of Al composition of the current confinement layer 17 and the value x5 of Al composition of the first refractive index layer 12C each are 1, and the value x6 of Al composition of the second refractive index layer 12D, the value x7 of Al composition of the third refractive index layer 12E, the value x3 of Al composition of the low refractive index layer 13A, and the value x10 of Al composition of the low refractive index layer of the upper DBR mirror layer 18 each are 0.9, the distance Dox1 can be within a range from Dox2+1 μm to 15 μm both inclusive.

Further, for example, the value of Al composition of a layer with a high Al composition in the low refractive index layer 12A can be the same as the value of Al composition of the current confinement layer 17, and the value of Al composition of a layer with a low Al composition of the low refractive index layer 12A can be the same as the value of Al composition of the low refractive index layer of the upper DBR mirror layer 18. Then, in such a case, when the low refractive index layer 12A is formed, epitaxial growth conditions such as doping conditions and a gas flow rate at the time of manufacturing the current confinement layer 17 or the upper DBR mirror layer 18 can be used, so the low refractive index layer 12A can be easily manufactured.

In the surface-emitting laser diode 1 according to the embodiment, when a predetermined voltage is applied between the lower electrode 27 and the upper electrode 24, a current is injected into the active layer 15 through the current injection region 17B in the current confinement layer 17, thereby light is emitted by electron-hole recombination. The light is reflected by a pair of the lower DBR mirror layer 11 and the upper DBR mirror layer 18 to cause laser oscillation with a predetermined wavelength, and the light is emitted to outside as a laser beam.

Moreover, the oxidation section 30 nonuniformly distributed in a direction rotating around the light emission region 15A is arranged in a periphery of a region corresponding to the light emission region 15A of the lower first DBR mirror layer 12 of the lower DBR mirror layer 11, so a tension stress by the oxidation section 30 is nonuniformly generated in the active layer 15. In this case, the oxidation section 30 includes a pair of multilayer films 31 and 32 which face each other with a region including the light emission region 15A in between, and has an anisotropic distribution in a direction where the grooves 22A face each other. Therefore, an anisotropic tension stress according to the distribution is generated in the active layer 15. In addition, as described above, there is no possibility that the low refractive index layer 12A is oxidized in the inner surface of the groove 22B, and there is no possibility that a stress in a direction where the grooves 22B face each other is generated in the active layer 15. Thereby, while a polarization component in a direction orthogonal to the direction of the tension stress is enhanced, a polarization component in a direction parallel to the direction of the tension stress is suppressed.

Figure 14:
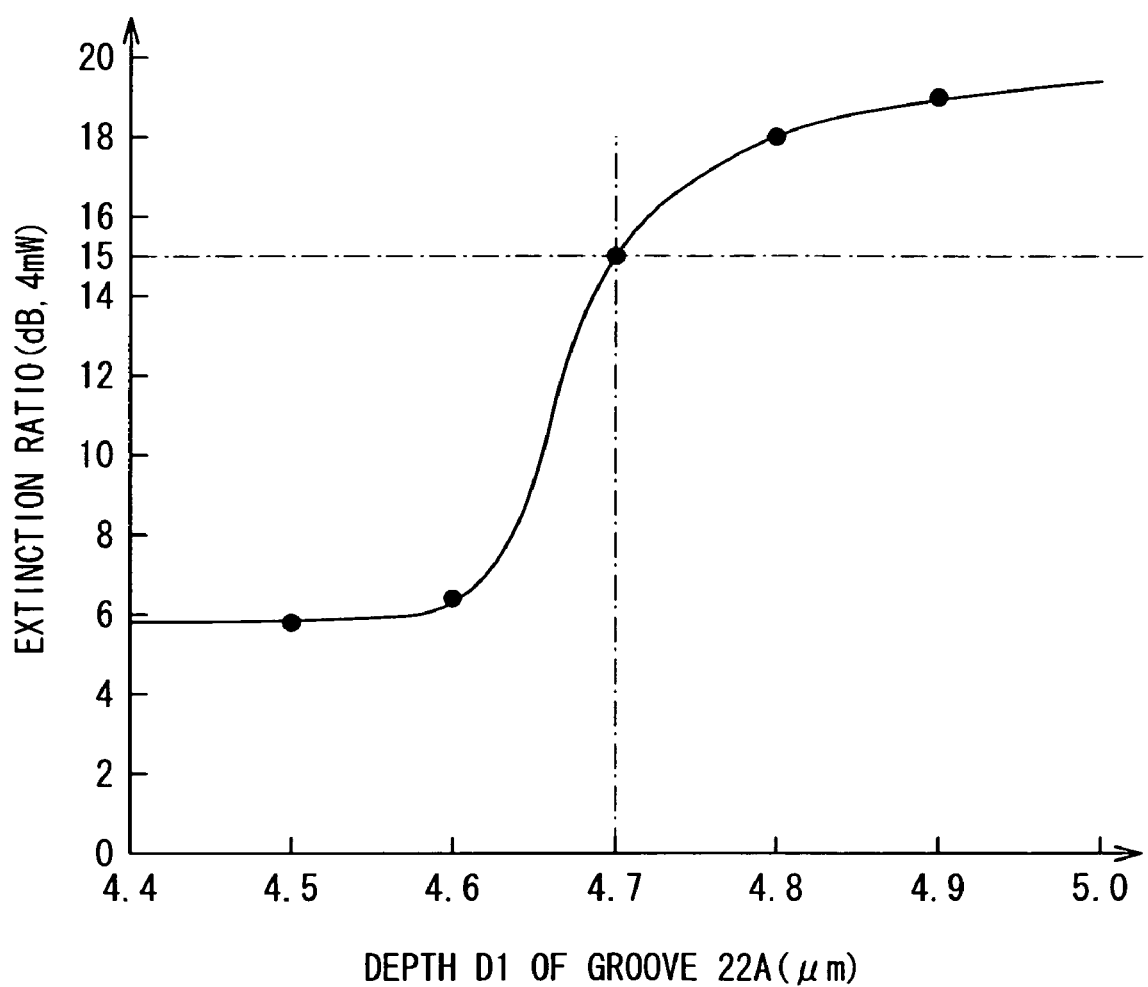
FIG. 14 is a relationship diagram showing an example of a relationship between an extinction ratio between orthogonal polarized waves and the depth of a groove 22A.

FIGS. 12(A) and 12(B) and 13(A) and 13(B) show examples of an extinction ratio between orthogonal polarized waves of the surface-emitting laser diode 1 according to the embodiment, show the extinction ratios between orthogonal polarized waves when the power supply is changed to 1 mW (milliwatts), 2 mW, 3 mW and 4 mW, respectively. In addition, the depth D1 of the groove 22A is fixed to 4.65 μm (the layer numbers of the multilayer films 31 and 32 are 4). The horizontal axis of each plot indicates the extinction ratio between orthogonal polarized waves, and the vertical axis indicates the number of samples. Moreover, FIG. 14 shows an extinction ratio between orthogonal polarized waves when the depth D1 of the groove 22A is changed from 4.4 μm to 5.0 μm in increments of 0.1 μm (the layer numbers of the multilayer films 31 and 32 are increased) in the case where the power supply is 4 mW. In general, it is said that when the extinction ratio between orthogonal polarized waves is 15 dB or over, a polarization component of laser light is sufficiently suppressed, and the polarization component is fixed in one direction.

It is obvious from the results exemplified in FIGS. 12(A) and 12(B) and 13(A) and 13(B) that in the case where the depth D1 of the groove 22A is 4.65 μm (the layer numbers of the multilayer films 31 and 32 are 4), the polarization component is fixed in one direction when the power supply is 1 mW or 2 mW. Moreover, it is obvious from the result exemplified in FIG. 14 that when the depth D1 of the groove 22A is 4.7 μm or over (the layer numbers of the multilayer films 31 and 32 are 7 or over), the polarization component is fixed in one direction. Then, such a tendency is developed not only in the case of the layer configuration of the lower DBR mirror layer 11 exemplified in FIGS. 5, 7 and 8 but also in the case of layer configurations in other embodiments which will be described later.

In addition, the extinction ratio between orthogonal polarized waves is changed by changing the distance Dox1 between a pair of the oxidation layers 31A and 32A; however, in a preferable range for suppressing high-order transverse mode oscillation, the extinction ratio between orthogonal polarized waves is sufficiently large, and the polarization component is fixed in one direction.

As described above, in the surface-emitting laser diode 1 of the embodiment, a pair of multilayer films 31 and 32 which face each other with the light emission region 15A in between are arranged in the lower first DBR mirror layer 12, so the polarization component of laser light can be fixed in one direction, and as a result, the polarization direction of the laser light can be stabilized in one direction.

By the way, in the embodiment, as described above, the substrate is not necessarily a special substrate such as an (n11) plane substrate (n is an integer), and may be a typical (100) plane substrate, so epitaxial growth conditions such as doping conditions and a gas flow rate of the typical (100) plane substrate can be used. Thereby, the surface-emitting laser diode 1 can be manufactured easily at low cost.

Moreover, in the embodiment, the lower DBR mirror layer 11 has a configuration in which the lower first DBR mirror layer 12 and the lower second DBR mirror layer 13 are laminated in this order from the substrate 10 side, so the larger the depth D1 of the groove 22A is, the more the layer numbers (thicknesses) of a pair of multilayer films 31 and 32 included in the lower first DBR mirror layer 12 can be increased. Thereby, an anisotropic stress can be increased according to the layer numbers (thicknesses) of a pair of multilayer films 31 and 32, and polarization controllability can be improved.

Further, in the embodiment, the lower DBR mirror layer 11 has the above-described configuration, so as long as the bottom surface of the groove 22B with a small depth is formed somewhere in the lower second DBR mirror layer 13, there is no possibility that an influence is exerted on the polarization controllability. In other words, it is not necessary to control the depth of the groove 22B precisely in a manufacturing step, and even if the depth of the groove 22B varies, there is no possibility that polarization controllability varies among surface-emitting laser diodes 1.

Moreover, in the embodiment, in the case where the value x1 of Al composition of the low refractive index layer 12A in the lower first DBR mirror layer 12 is equal to or substantially equal to the value x9 of Al composition of the current confinement layer 17, the reflectivity in the low refractive index layer 12A is higher than that in the low refractive index layer 13A in the lower second DBR mirror layer 13. Thereby, light leakage to the substrate 10 can be reduced, so the output of light emitted from the upper DBR mirror layer 18 to outside can be increased. Further, in the case where the low refractive index layer 12A includes AlGaAs, when the value of Al composition of AlGaAs is increased, the thermal conductivity of the low refractive index layer 12A is increased, so heat radiation of the surface-emitting laser diode 1 can be improved.

Further, in the embodiment, the more the layer numbers (thicknesses) of a pair of multilayer films 31 and 32 are increased, the more the anisotropic stress can be increased, so it is not necessary to arrange the oxidation section 30 in a region corresponding to the light emission region 15A to apply a large stress to the active layer 15. Thereby, there is little possibility that light output declines by the oxidation section 30, and high-power laser light can be emitted.

Therefore, in the embodiment, the surface-emitting laser diode 1 can be manufactured easily at low cost, and the polarization direction of laser light can be stabilized in one direction and higher output can be achieved.

Moreover, in the embodiment, as shown in FIGS. 1 to 4, the groove section 22 formed around the mesa section 21 has a depth to an extent to which the groove section 22 penetrates through at least active layer 15, so a current path passing from the upper electrode 24, the upper electrode pad 25 and the connection section 26 to the active layer 15 exists only in the mesa section 21. Thereby, there is no possibility that the current injection efficiency declines by forming the groove section 22 around the mesa section 21.

Second Embodiment

Figure 15:
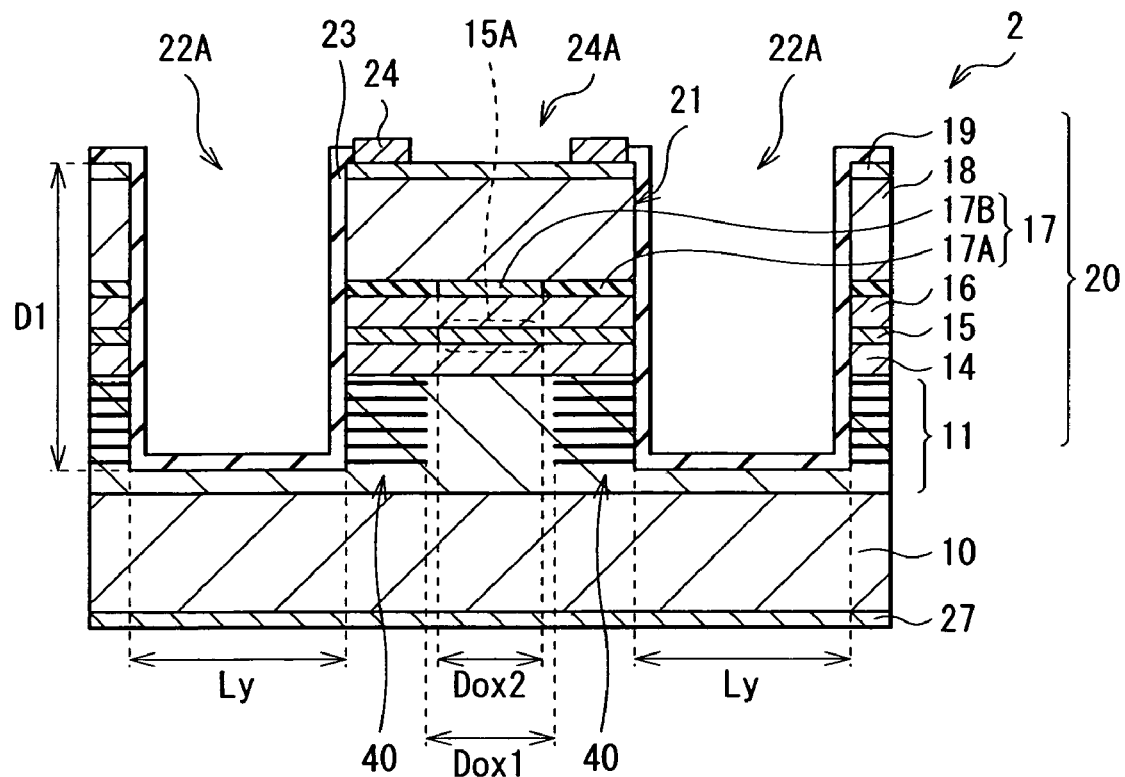
FIG. 15 is an illustration showing a sectional configuration in one direction of a surface-emitting laser diode according to a second embodiment of the invention.
Figure 16:
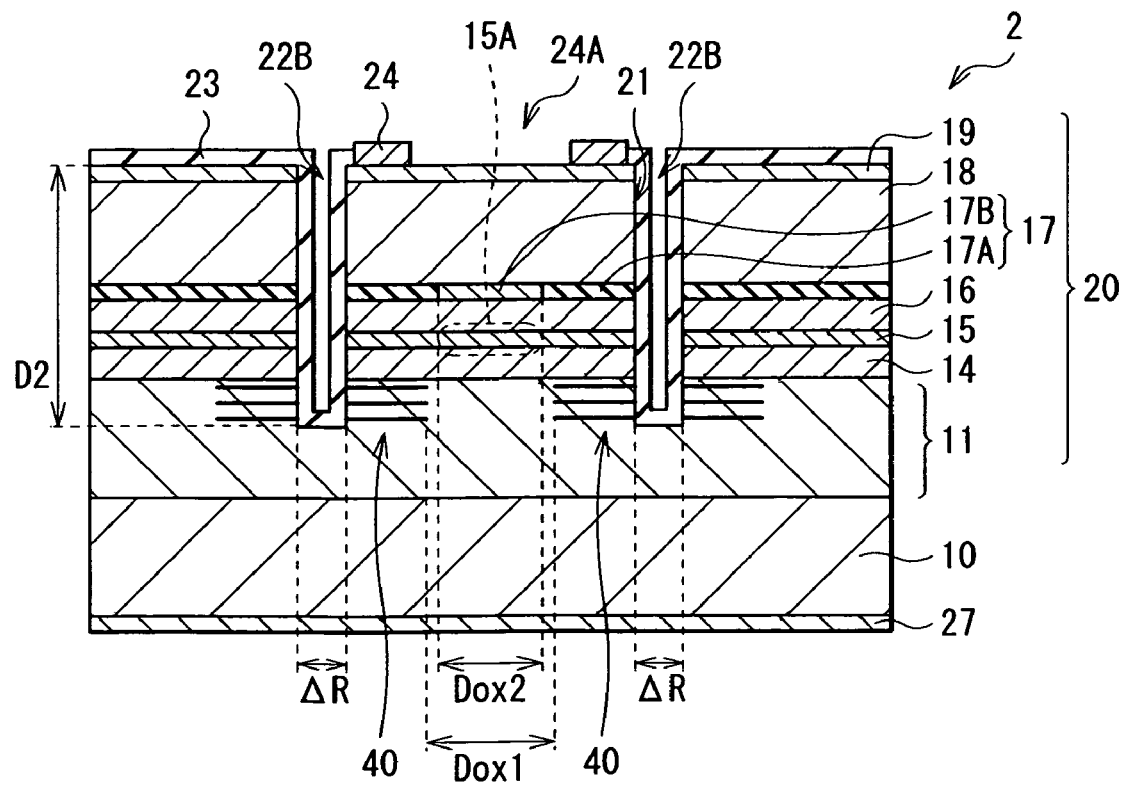
FIG. 16 is an illustration of a sectional configuration in another direction of the surface-emitting laser diode according to the second embodiment of the invention.

FIGS. 15 and 16 show sectional configurations of a surface-emitting laser diode 2 according to a second embodiment. In the above-described embodiment, the lower DBR mirror layer 11 has a configuration in which the lower first DBR mirror layer 12 and the lower second DBR mirror layer 13 are laminated in this order from the substrate 10 side; however, in the embodiment, the lower second DBR mirror layer 13 is removed from the lower DBR mirror layer 11, and the lower DBR mirror layer 11 has the same configuration as the lower second DBR mirror layer 13.

Figure 17A:
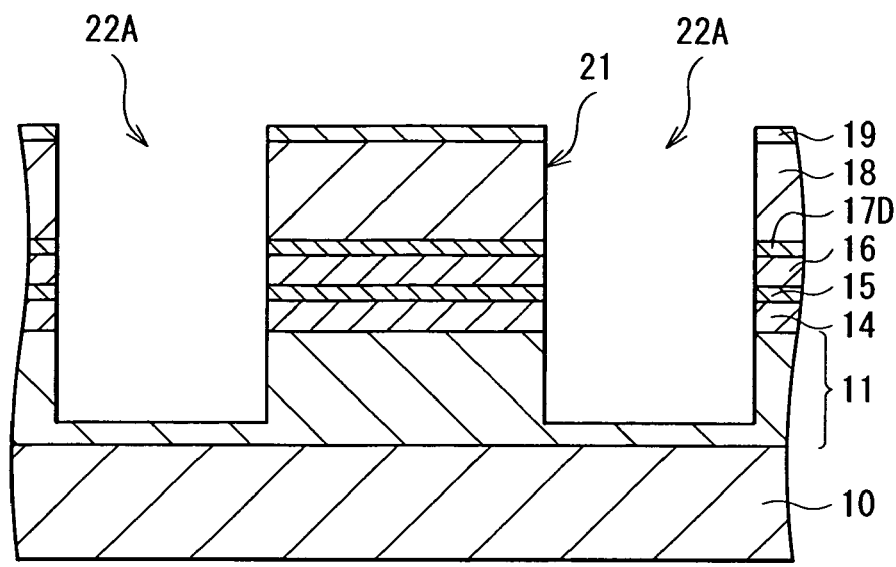
FIG. 17 is a sectional view for describing a step of manufacturing the laser diode shown in FIG. 15.
Figure 17B:
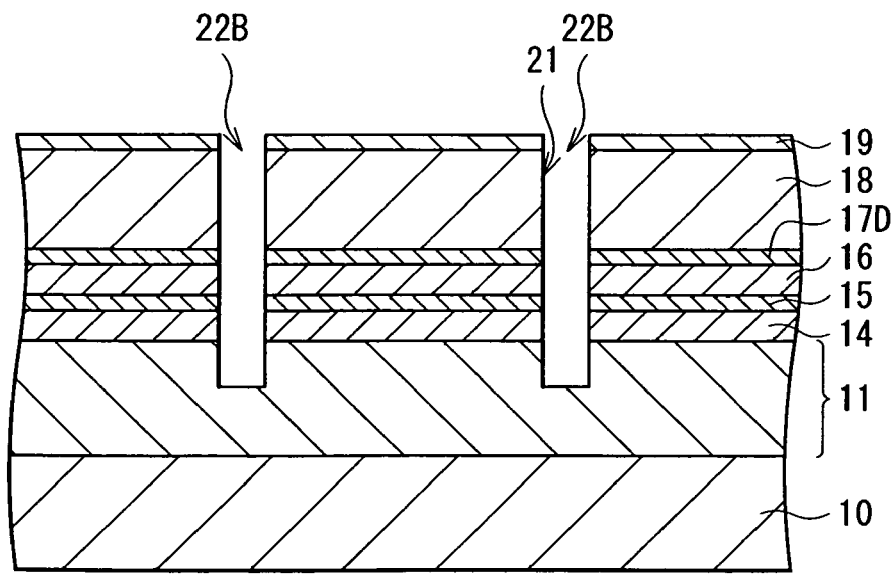
Figure 18A:
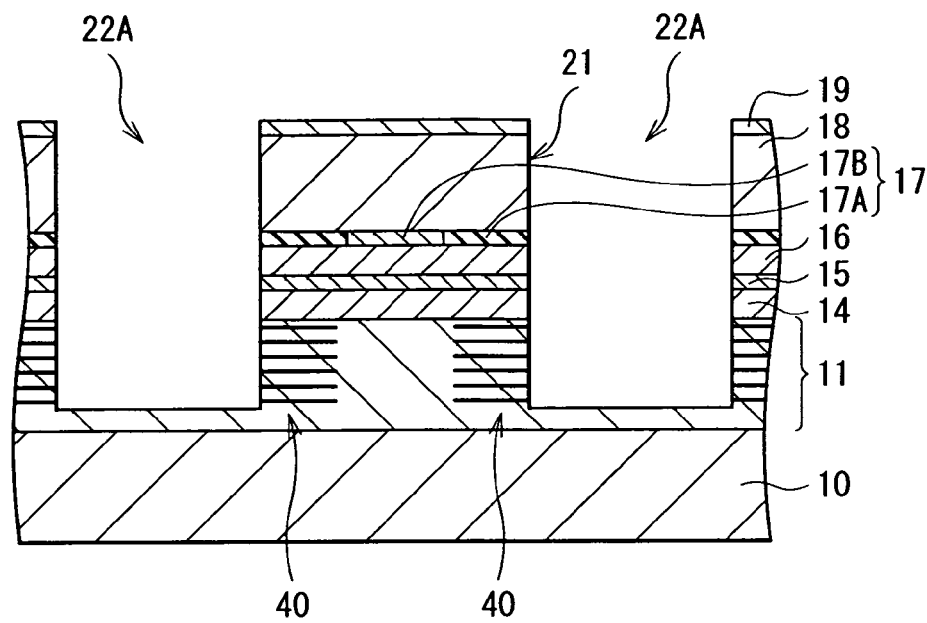
FIG. 18 is a sectional view for describing a step following FIG. 17.
Figure 18B:
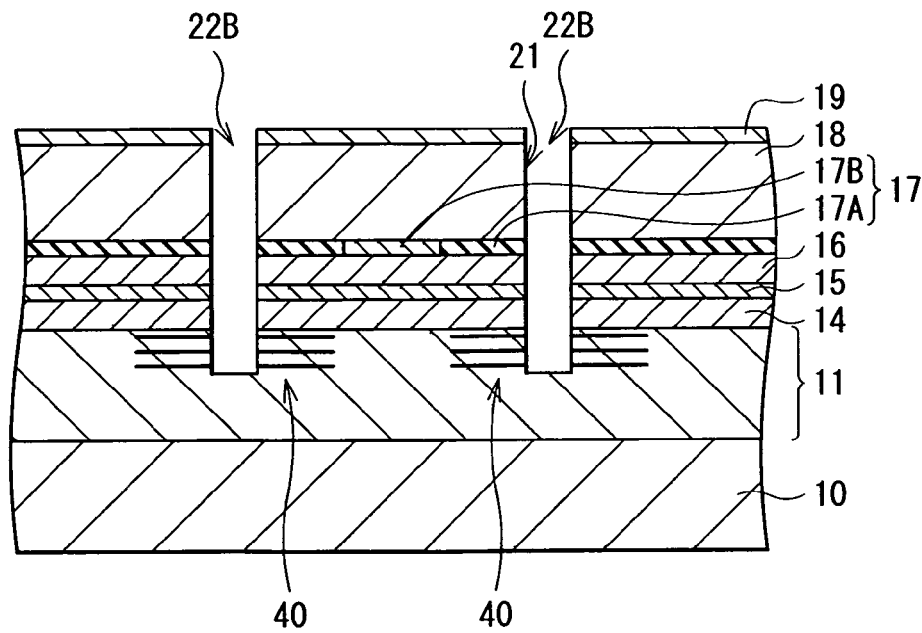

Therefore, as shown in FIGS. 17(A) and 17(B), when the groove section 22 is formed by etching, the low refractive index layer 12A in the lower DBR mirror layer 11 is exposed not only in the groove 22A but also in the groove 22B. Therefore, as shown in FIGS. 18(A) and (B), an oxidation section 40 is formed not only in a portion facing the groove 22A of the low refractive index layer 12A but also in a portion facing the groove 22B. However, the depth D1 of the groove 22A is larger than the depth D2 of the groove 22B, and the layer number on the groove 22A side in the oxidation section 40 is larger than the layer number on the groove 22B side, so the oxidation section 40 is a ring-shaped multilayer film having anisotropy in its thickness, and is nonuniformly distributed in a direction rotating around the light emission region 15A. Thereby, the oxidation section 40 generates a nonuniform stress according to the distribution in the active layer 15.

Thus, in the embodiment, the oxidation section 40 nonuniformly distributed in a direction rotating around the light emission region 15A is arranged in a periphery of a region corresponding to the light emission region 15A of the lower DBR mirror layer 11, so a stress by the oxidation section 40 is nonuniformly generated in the active layer 15. In this case, the oxidation section 40 is configured to include a ring-shaped multilayer film having the layer number on the groove 22A side which is larger than the layer number on the groove 22B side and having anisotropy in its thickness, and has an anisotropic distribution in a direction where the grooves 22A face each other, so an anisotropic stress according to the distribution is generated in the active layer 15. Then, the direction of the stress generated in the active layer 15 matches the direction where the grooves 22A face each other as in the case of the above-described embodiment. Thereby, while a polarization component in a direction orthogonal to the direction of the stress is enhanced, a polarization component in a direction parallel to the direction of the stress is suppressed.

Thus, in the surface-emitting laser diode 2 of the embodiment, the oxidation section 40 configured to include a ring-shaped multilayer film having the layer number on the groove 22A side which is larger than the layer number on the groove 22B side and having anisotropy in its thickness is arranged in the lower DBR mirror layer 11, so the polarization component of laser light can be fixed in one direction, and as a result, the polarization direction of the laser light can be stabilized in one direction.

Moreover, as in the case of the above-described embodiment, the substrate is not necessarily a special substrate such as an (n11) plane substrate (n is an integer), and may be a typical (100) plane substrate, so epitaxial growth conditions such as doping conditions and a gas flow rate of the typical (100) plane substrate can be used. Thereby, the surface-emitting laser diode 2 can be manufactured easily at low cost. Further, the larger the difference between the layer number on the groove 22A side and the layer number on the groove 22B side is, the more an anisotropic stress can be increased, so it is not necessary to arrange the oxidation section 40 even in a region corresponding to the light emission region 15A. Thereby, there is little possibility that the light output declines by the oxidation section 40, and high-power laser light can be emitted.

Therefore, in the embodiment, as in the case of the above-described embodiment, the surface-emitting laser diode 2 can be manufactured easily at low cost, and the polarization direction of laser light can be stabilized in one direction, and higher output can be achieved.

Third Embodiment

Figure 19:
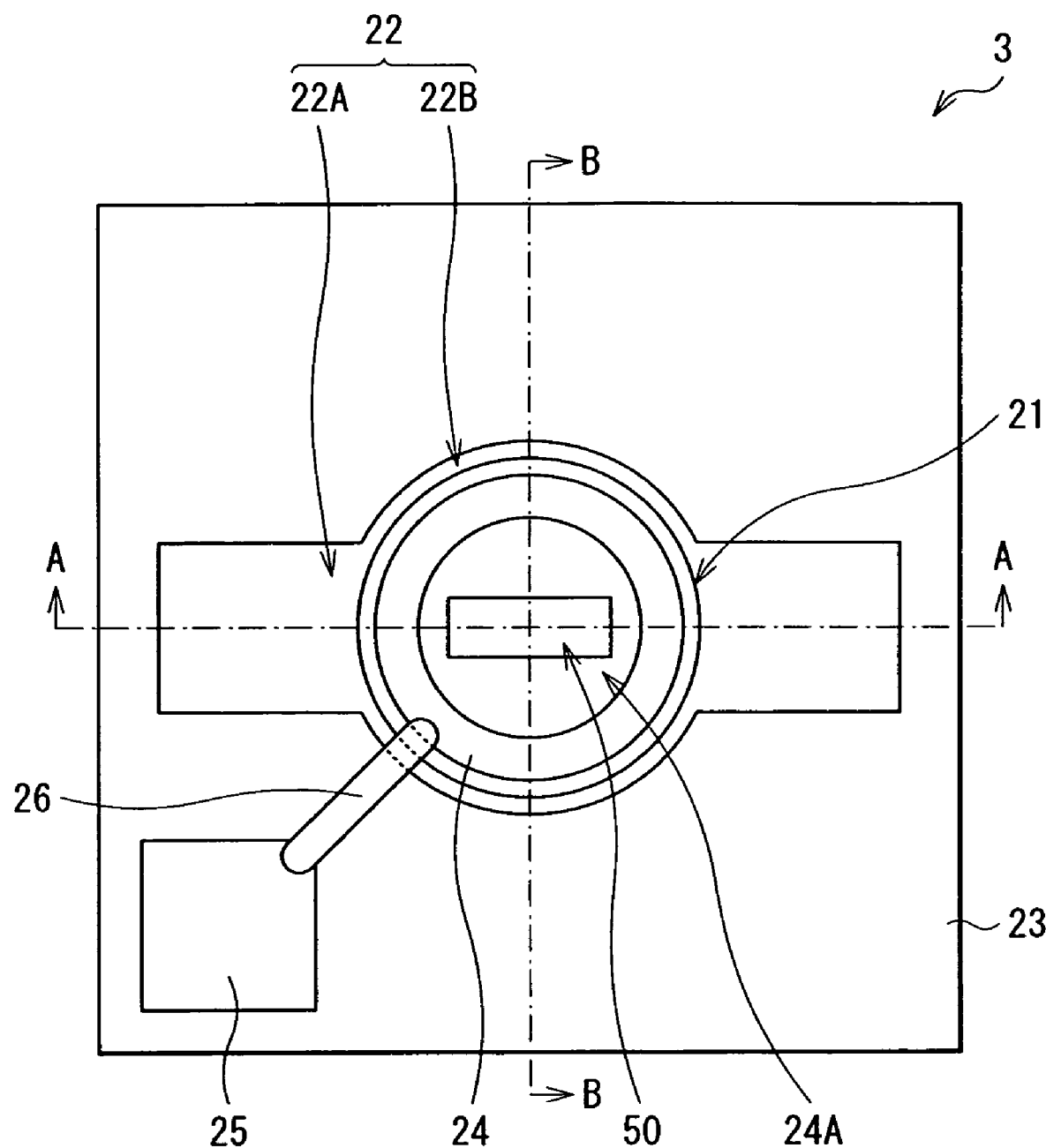
FIG. 19 is a top view of a surface-emitting laser diode according to a third embodiment of the invention.
Figure 20:
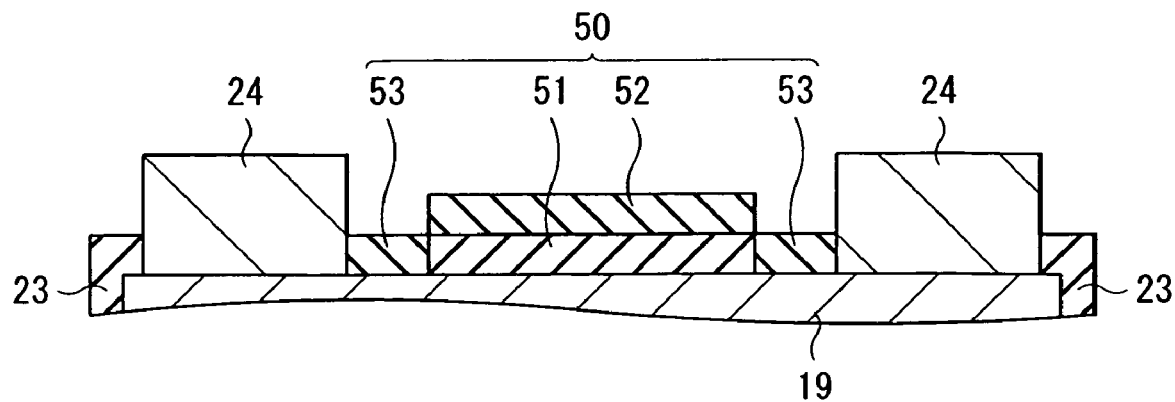
FIG. 20 is an enlarged view showing a sectional configuration in one direction of a transverse mode adjustment layer in FIG. 19.
Figure 21:
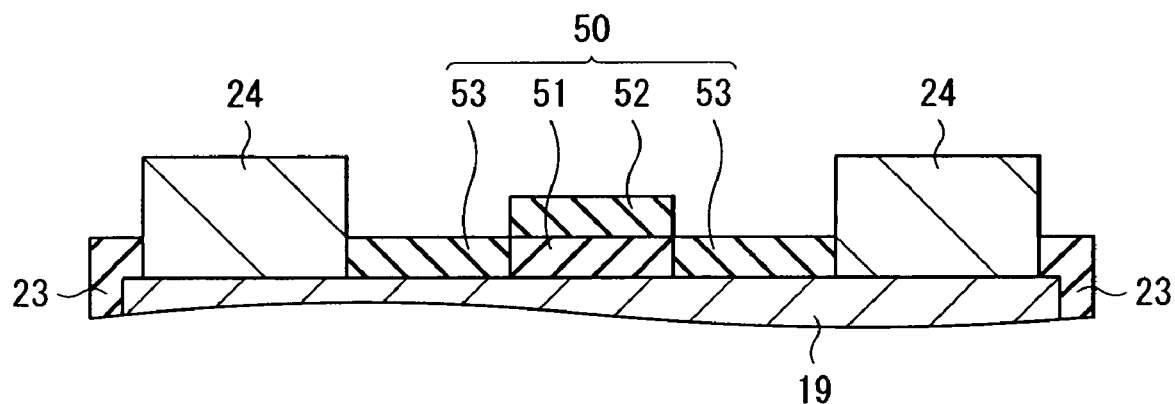
FIG. 21 is an enlarged view showing a sectional configuration in another direction of the transverse mode adjustment layer in FIG. 19.

FIG. 19 shows a top surface configuration of a surface-emitting laser diode 3 according to a third embodiment of the invention. FIG. 20 shows an enlarged view of a region in proximity to the light emission opening 24A of a sectional configuration taken along an arrow direction A-A of FIG. 19, and FIG. 21 is an enlarged view of a region proximity to the light emission opening 24A of a sectional configuration taken along an arrow direction B-B of FIG. 19. The surface-emitting laser diode 3 is distinguished from the configuration of the above-described embodiment by the fact that a transverse mode adjustment layer 50 corresponding to the light emission opening 24A is included.

The transverse mode adjustment layer 50 includes a first adjustment layer 51, a second adjustment layer 52 and a third adjustment layer 53, and the first adjustment layer 51 and the second adjustment layer 52 are laminated in this order in a central region of the light emission opening 24A, that is, a region where fundamental transverse mode oscillation mainly occurs. The third adjustment layer 53 is formed in an edge region surrounding the central region, that is, a region where high-order transverse mode oscillation mainly occurs.

Figure 22:
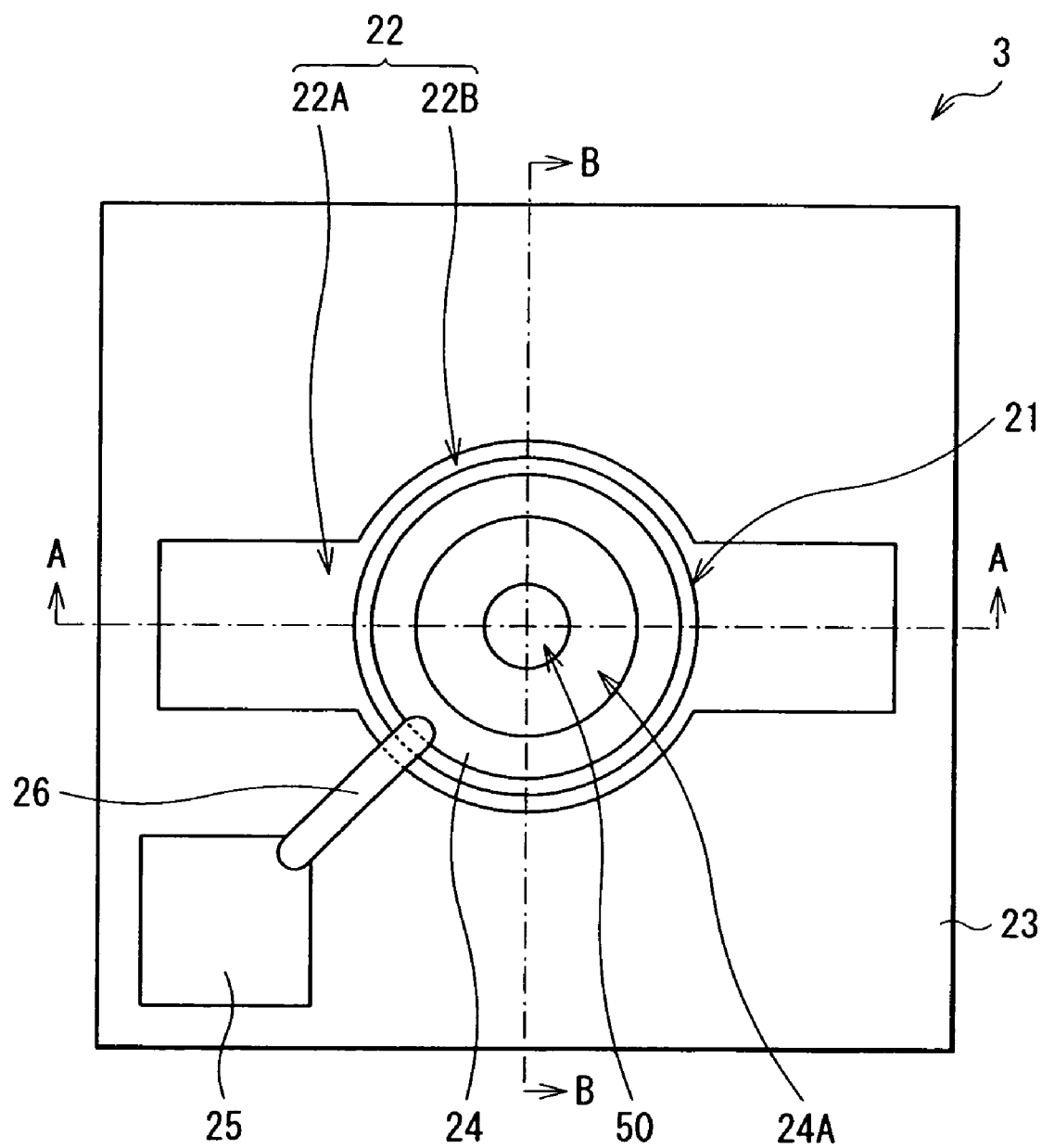
FIG. 22 is a top view of a surface-emitting laser diode according to another modified example.

In addition, in FIGS. 19 to 21, to further reduce high-order transverse mode oscillation in a direction where the grooves 22B face each other, the first adjustment layer 51 and the second adjustment layer 52 each have a rectangular shape in which a width in the direction is smaller than a width in a direction where the grooves 22A face each other; however, the first adjustment layer 51 and the second adjustment layer 52 may have any other shape, for example, a circular shape as shown in FIG. 22.

The first adjustment layer 51 has a film thickness of $(2a-1)\lambda/4n_1$ (a is an integer of 1 or more, and $n_1$ is an refractive index), and is made of a material in which the refractive index $n_1$ is lower than the refractive index of a high refractive index layer arranged on a surface of the upper DBR mirror layer 18, for example, a dielectric such as $SiO_2$ (silicon oxide). The width in a direction where the grooves 22B face each other of the first adjustment layer 51 is substantially equal to that of a region where fundamental transverse mode oscillation mainly occurs, and is preferably within a range from 3.0 μm to 5.0 μm both inclusive.

The second adjustment layer 52 has a film thickness of $(2b-1)\lambda/4n_2$ (b is an integer of 1 or more, and $n_2$ is a refractive index), and is made of a material in which the refractive index $n_2$ is higher than that of the first adjustment layer 51, for example, a dielectric such as SiN (silicon nitride).

The third adjustment layer 53 has a film thickness of $(2c-1)\lambda/4n_3$ (c is an integer of 1 or more, and $n_3$ is a refractive index), and is made of a material in which the refractive index $n_3$ is lower than that of the first adjustment layer 51, for example, a dielectric such as SiN (silicon nitride). In addition, the second adjustment layer 52 and the third adjustment layer 53 are preferably made of the same material with the same film thickness. Thereby, these layers can be formed at a time, and manufacturing steps can be simplified.

In this case, assuming that the reflectivity of a central region of the light emission opening 24A is $R_1$, and the reflectivity of an edge region surrounding the central region is $R_2$, and the reflectivity in the case where these adjustment layers are not arranged in the light emission opening 24A is $R_3$, each refractive index is preferably adjusted so as to satisfy the relationship of the following formula. Thereby, only high-order transverse mode oscillation can be suppressed without reducing fundamental transverse mode light output.

$$R_1 \geq R_3 > R_2 \tag{4}$$

In general, in the surface-emitting laser diode, there is a tendency that fundamental transverse mode light output is the largest in a central portion of the light emission opening, and is reduced with distance from the central portion of the light emission opening. Therefore, in the case where the surface-emitting laser diode is used for an application demanding high output, the light emission opening is preferably expanded so as to take out fundamental transverse mode laser light as much as possible. However, in general, there is a tendency that high-order transverse mode light output is the largest in a region at a predetermined distance from the central portion of the light emission opening, and is reduced toward the central portion of the light emission opening, so when the light emission opening is too large, a high output of high-order transverse mode laser light may be also produced.

Therefore, in a conventional surface-emitting laser diode, high-order transverse mode laser light is prevented from being outputted by measures such as reducing the size of the light emission opening or arranging a structure with a complicated shape in the light emission opening. Moreover, even in the case where the surface-emitting laser diode is used for an application demanding low output, to reduce high-order transverse mode laser light to a minimum, it is necessary to take the same measures as the above-described measures.

On the other hand, in the embodiment, the first adjustment layer 51 and the second adjustment layer 52 are laminated in this order in the central region of the light emission opening 24A, and the third adjustment layer 53 is arranged in a peripheral region around the central region of the light emission opening 24A. Thereby, the reflectivity of the peripheral region is lower than that of the central region. Therefore, the polarization direction of laser light can be stabilized in one direction, and only high-order transverse mode oscillation can be suppressed without reducing fundamental transverse mode light output.

Moreover, in the embodiment, the first adjustment layer 51 is arranged on the contact layer 19 made of a semiconductor material, so it is very easy to selectively etch the first adjustment layer 51, and it is not necessary for the first adjustment layer 51, the second adjustment layer 52 and the third adjustment layer 53 to have a complicated shape, so the surface-emitting laser diode 3 can be manufactured easily.

Fourth Embodiment

Figure 23:
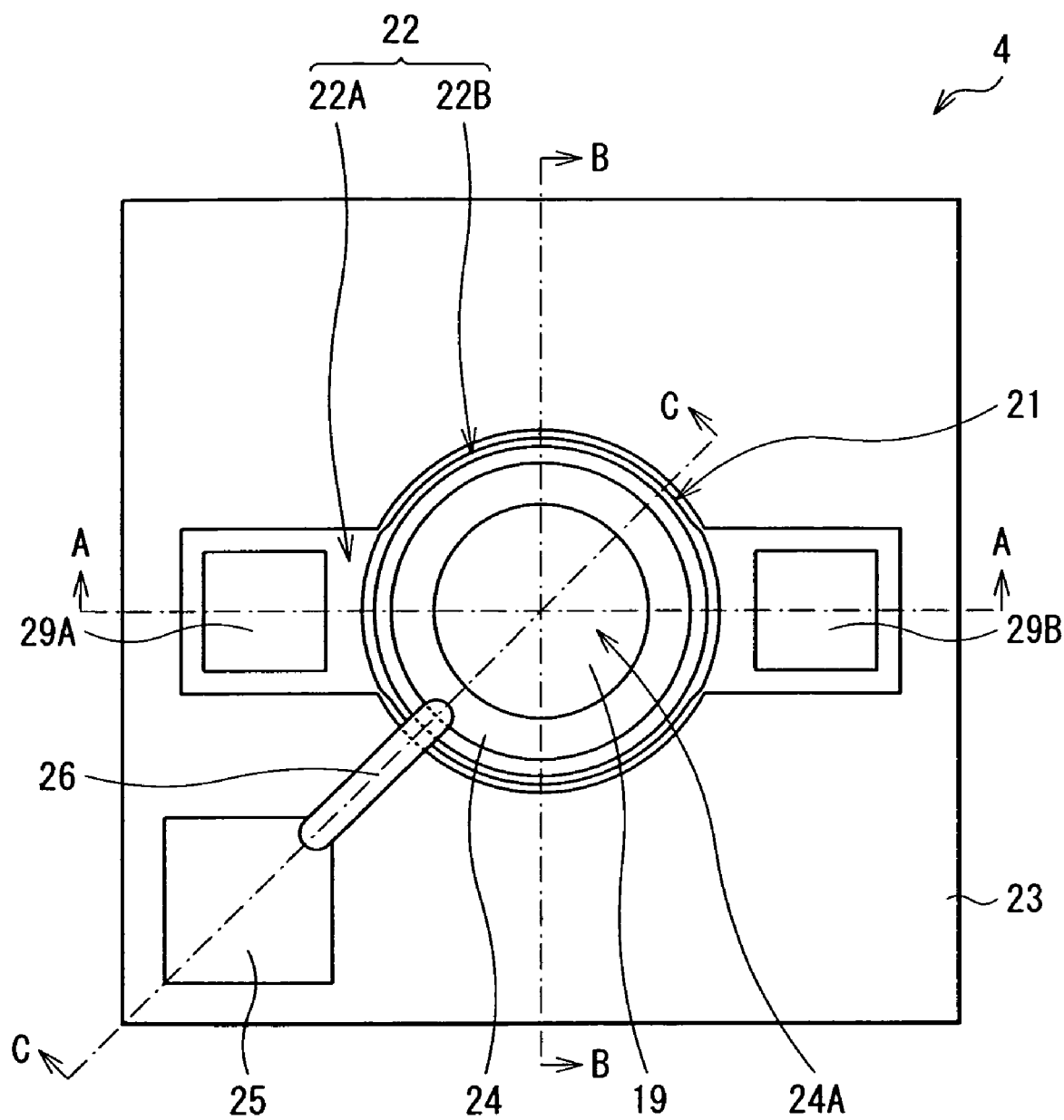
FIG. 23 is a top view of a surface-emitting laser diode according to a fourth embodiment of the invention.
Figure 24:
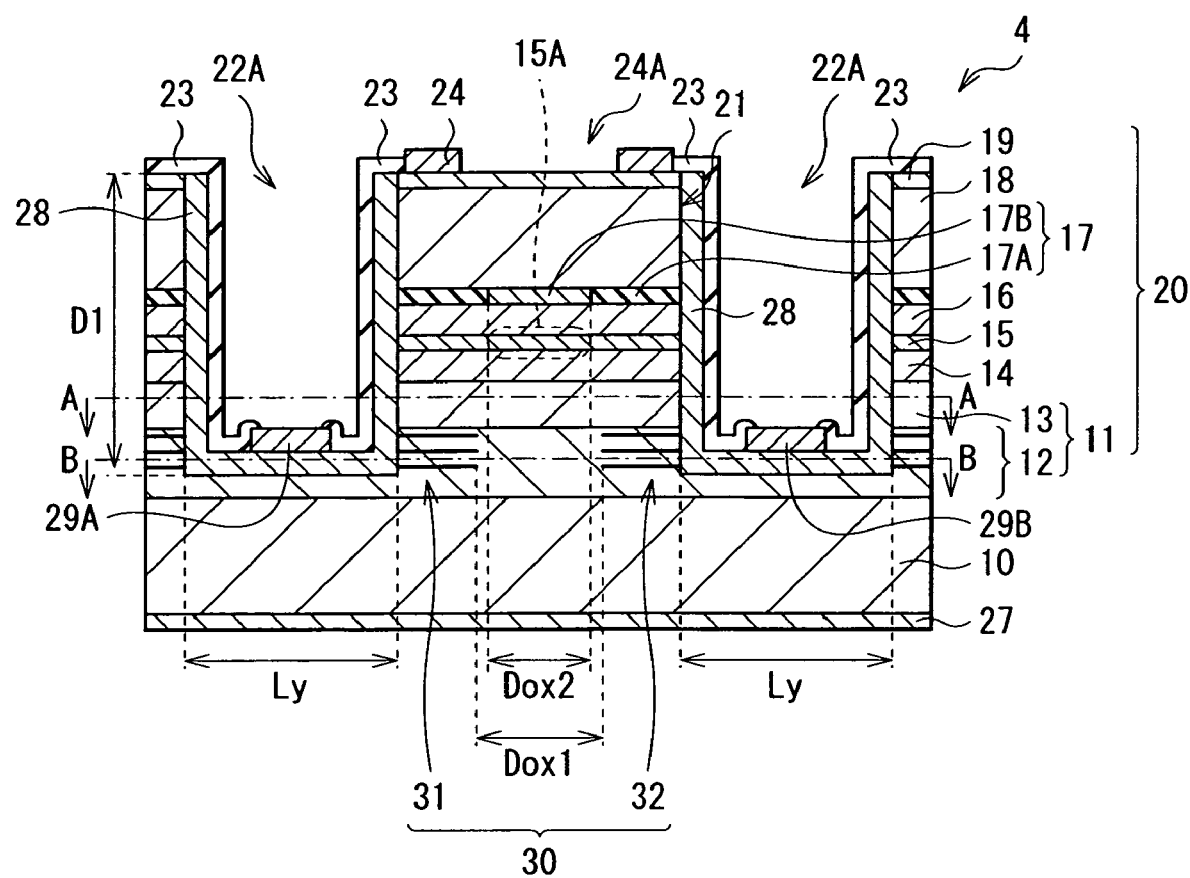
FIG. 24 is an illustration showing a sectional configuration of the laser diode taken along an arrow direction A-A of FIG. 23.
Figure 25:
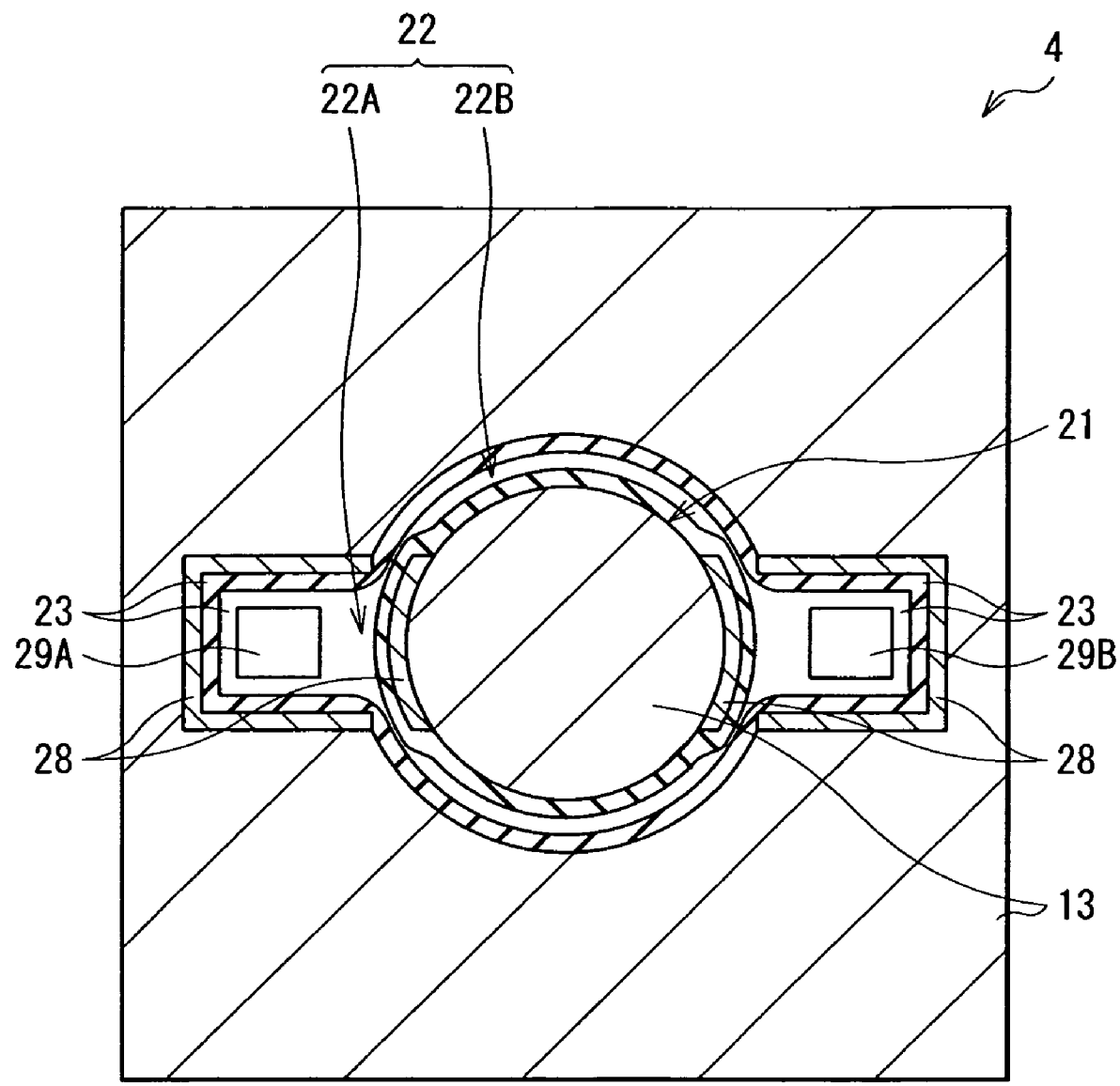
FIG. 25 is an illustration showing a sectional configuration of the laser diode taken along an arrow direction A-A of FIG. 24.
Figure 26:
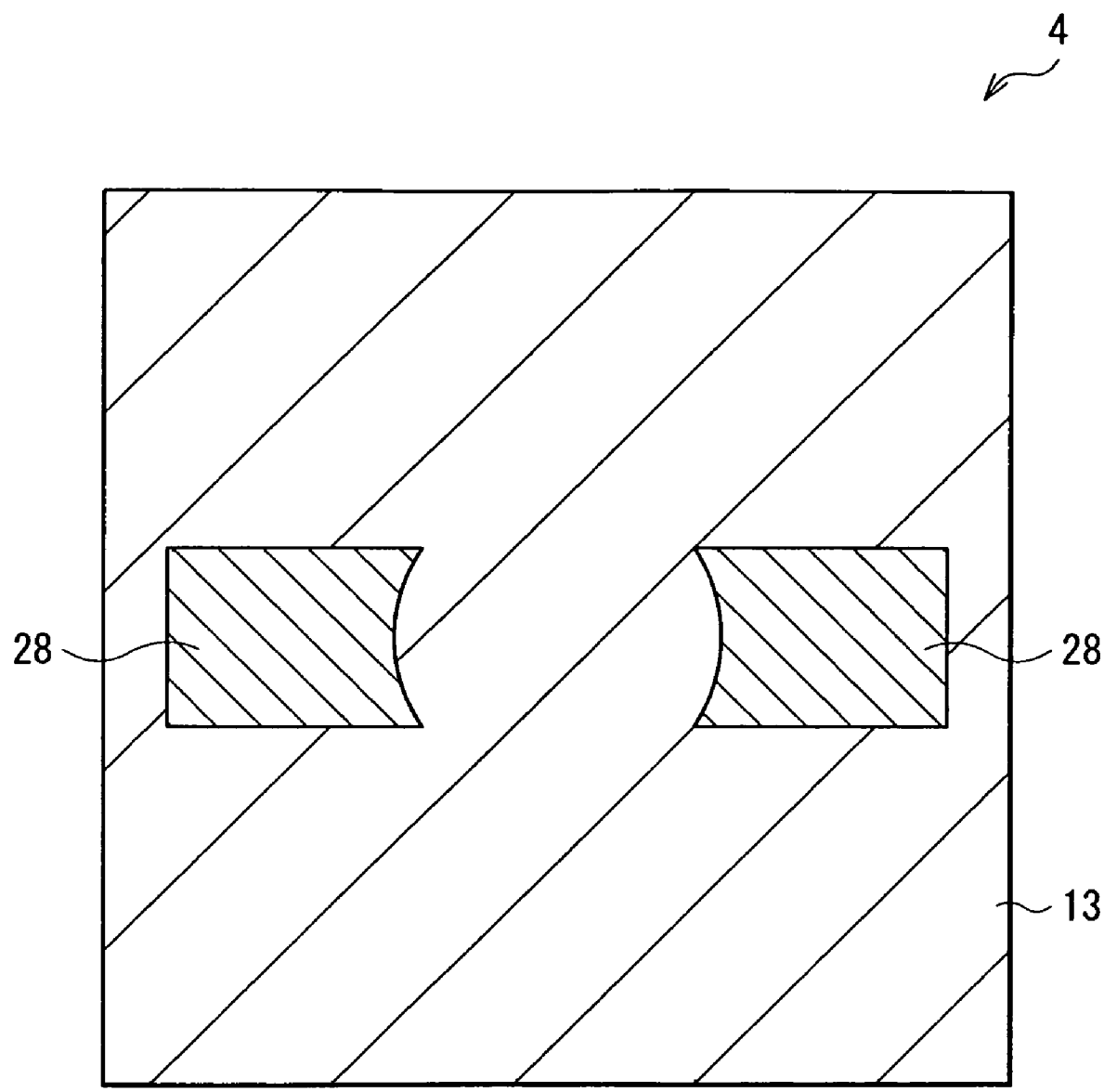
FIG. 26 is an illustration showing a sectional configuration of the laser diode taken along an arrow direction B-B of FIG. 24.

FIG. 23 shows a top surface configuration of a surface-emitting laser diode 4 according to a fourth embodiment. FIG. 24 shows a sectional configuration of the surface-emitting laser diode 4 taken along an arrow direction A-A of FIG. 23. FIG. 25 shows a sectional configuration of the surface-emitting laser diode 4 taken along an arrow direction A-A of FIG. 24, and FIG. 26 shows a sectional configuration of the surface-emitting laser diode 4 taken along an arrow direction B-B of FIG. 24. In addition, the sectional configurations taken along arrow directions B-B and C-C of FIG. 23 are the same as those in the case of the surface-emitting laser diode 1 of the above-described first embodiment.

As shown in FIGS. 23 to 26, the surface-emitting laser diode 4 is distinguished from the configuration of the above-described embodiment by the fact that a semiconductor layer 28 formed on an inner wall of the groove 22A including a side wall of the mesa section 21, and a pair of electrodes 29A and 29B formed in a part of a portion corresponding to a bottom surface of the groove 22A in a surface of the semiconductor layer 28.

The semiconductor layer 28 has, for example, an NPN configuration in which an n-type semiconductor layer, a p-type semiconductor layer and an n-type semiconductor layer are laminated in order from an inner wall side of the groove 22A by epitaxial crystal growth (regrowth).

The electrodes 29A and 29B each have, for example, a configuration in which a AuGe alloy layer, a Ni layer and a Au layer are laminated in order from a bottom portion side of the groove 22A, and are electrically connected to a surface of the semiconductor layer 28. The electrodes 29A and 29B are exposed from an opening formed in the bottom portion of the groove 22A of the protective film 23.

In the surface-emitting laser diode 4 of the embodiment, the electrodes 29A and 29B are connected to the inner wall of the groove 22A including the mesa section 21 through the semiconductor layer 28 with an NPN configuration, so even if a DC voltage (a bias) is applied between the electrodes 29A and 29B, a current does not flow into the mesa section 21, and when a current flows between the upper electrode 24 and the lower electrode 27 for laser drive, the current does not flow into the electrodes 29A and 29B. Therefore, when a DC voltage (a bias) is applied between the electrodes 29A and 29B, an electric field can be formed in the mesa section 21. The electric field is formed in a direction where the electrodes 29A and 29B face each other (a direction where the grooves 22A faces each other) and in a direction substantially parallel to the laminate in-plane direction of the mesa section 21, so an absorption loss in the direction where the grooves 22A face each other is increased by the presence of the electric field.

Thereby, in the embodiment, while a polarization component in a direction orthogonal to the direction where the grooves 22A face each other is enhanced, a polarization component in the direction where the grooves 22A face each other is suppressed, so the polarization component of laser light can be fixed in one direction, and as a result, the polarization direction of laser light can be stabilized in one direction.

Moreover, in the embodiment, a part (a side wall on the groove 22A side) of the mesa section 21 is covered with the semiconductor layer 28, so the heat of the mesa section 21 can be radiated to outside through the semiconductor layer 28, and head radiation is superior, compared to the case of each of the above-described embodiments.

Moreover, in the embodiment, the semiconductor layer 28 and the electrodes 29A and 29B each have a simple configuration, and the semiconductor layer 28 can be formed more easily by regrowth, so the surface-emitting laser diode 4 can be manufactured easily.

Modified Example of Fourth Embodiment

In the above embodiment, the semiconductor layer 28 is formed in the groove 22A; however, as shown in a surface-emitting laser diode 5 in FIGS. 27 to 30, the semiconductor layer 28 is formed also in the groove 22B so that the groove 22B can be filled with the semiconductor layer 28. In such a case, a large portion (side walls on the sides of the grooves 22A and 22B) of the mesa section 21 is covered with the semiconductor layer 28, so the heat of the mesa section 21 can be effectively radiated through a portion with which the groove 22B is filled of the semiconductor layer 28, and heat radiation is superior, compared to the case of the above-described fourth embodiment.

Figure 27:
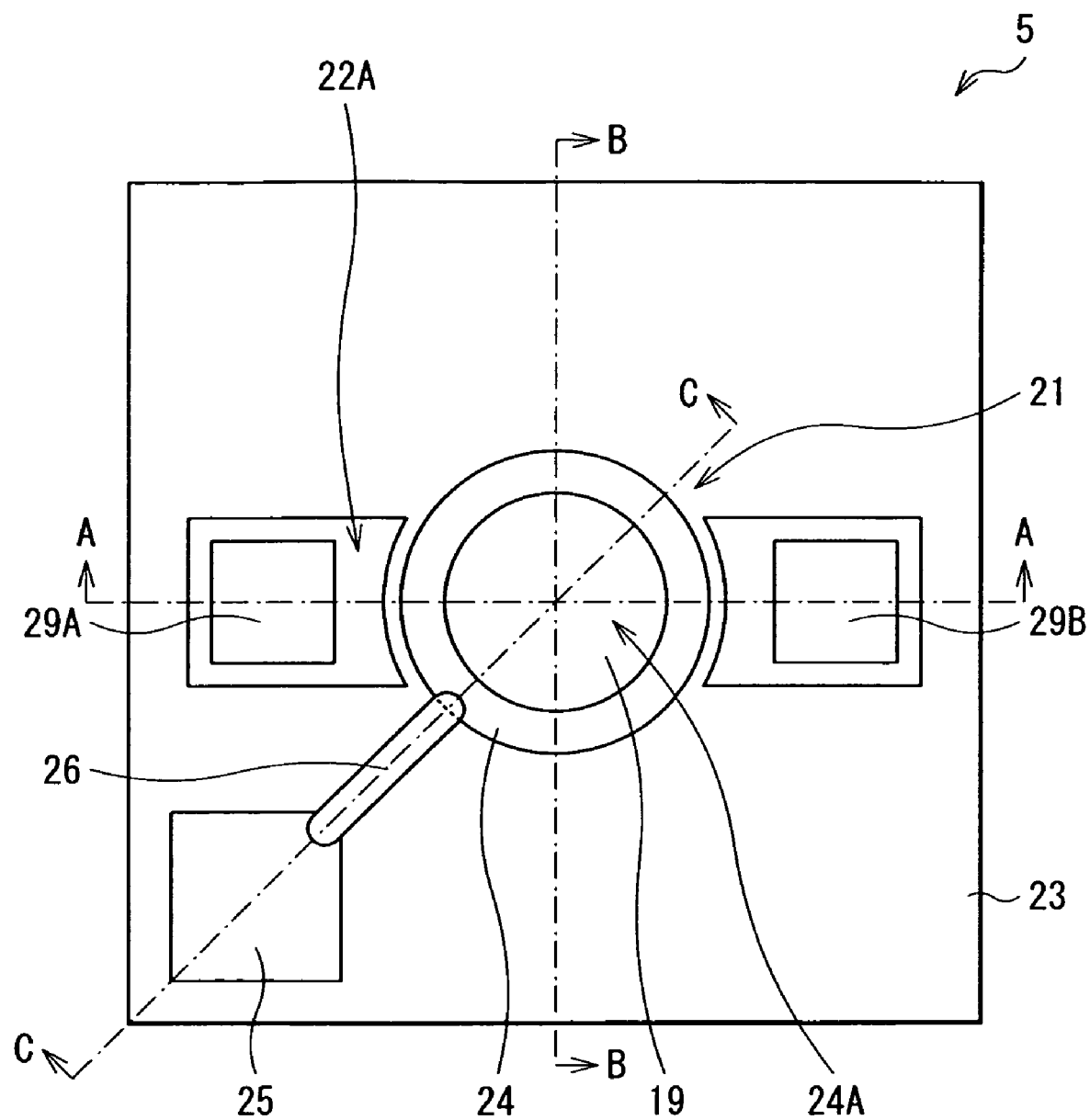
FIG. 27 is a top view of a surface-emitting laser diode according to a modified example.
Figure 28:
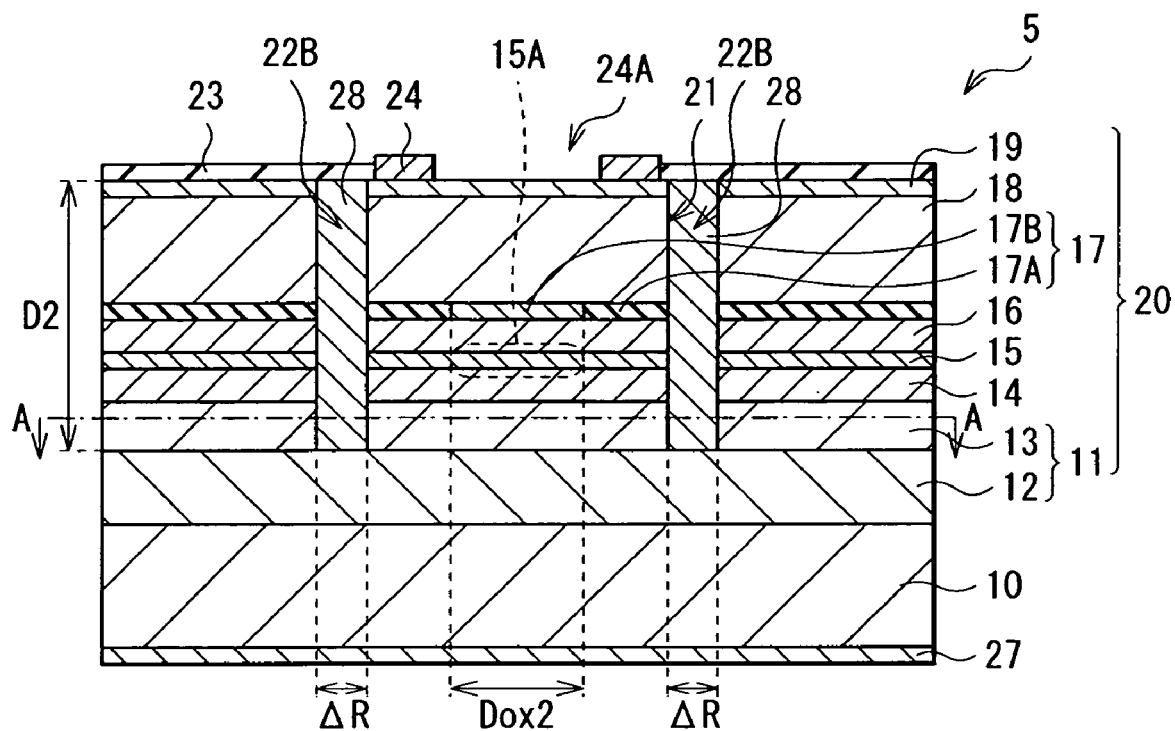
FIG. 28 is an illustration showing a sectional configuration of the laser diode taken along an arrow direction A-A of FIG. 27.
Figure 29:
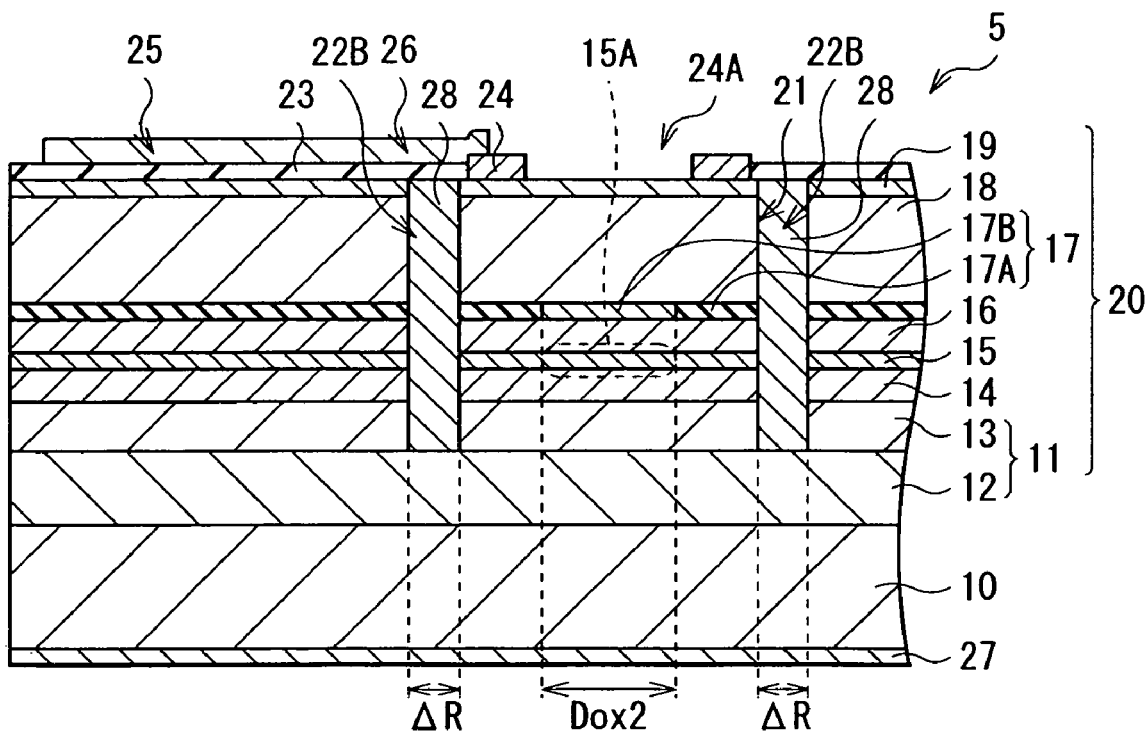
FIG. 29 is an illustration showing a sectional configuration of the laser diode taken along an arrow direction C-C of FIG. 27.
Figure 30:
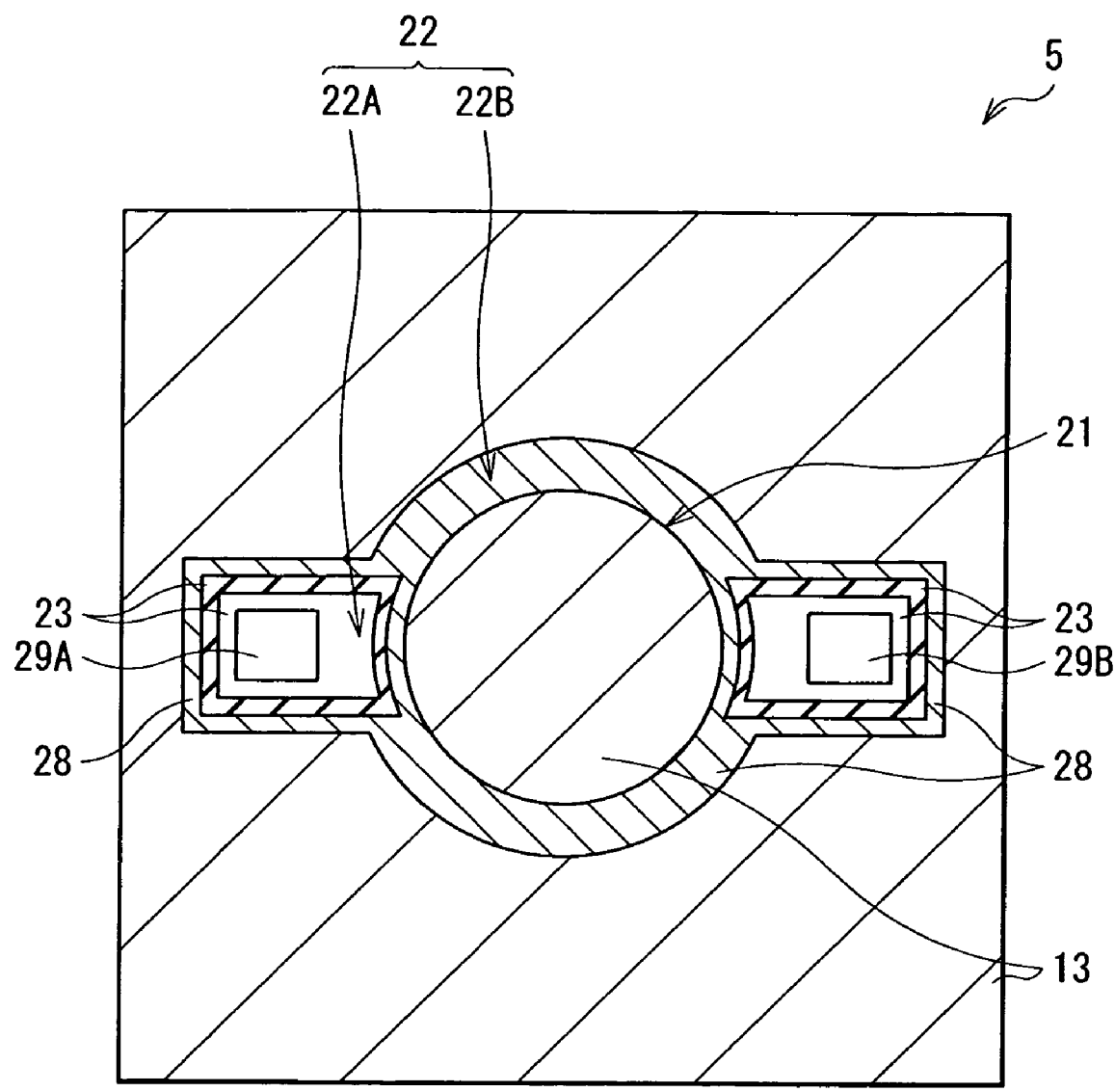
FIG. 30 is an illustration showing a sectional configuration of the laser diode taken along an arrow direction A-A of FIG. 28.

In addition, FIG. 27 shows a top surface configuration of the surface-emitting laser diode 5 according to a modified example, and FIG. 28 shows a sectional configuration taken along an arrow direction B-B of FIG. 27, and FIG. 29 shows a sectional configuration taken along an arrow direction C-C of FIG. 27. Moreover, the sectional configuration taken along the arrow direction A-A of FIG. 27 is the same as that in FIG. 24, and FIG. 30 shows a sectional configuration taken along an arrow direction A-A of FIG. 28.

Although the present invention is described referring to the embodiments and the modified example, the invention is not limited to the above-described embodiments and the like, and can be variously modified.

Figure 31:
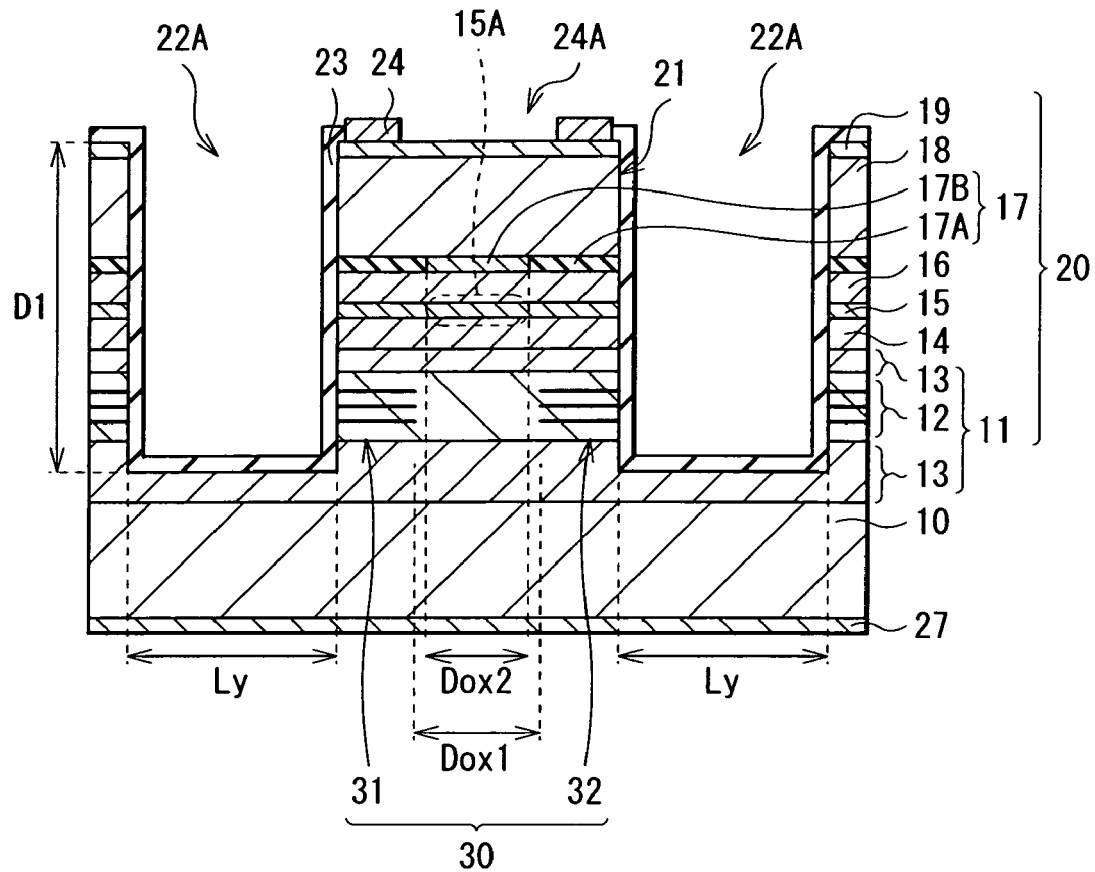
FIG. 31 is an illustration showing a sectional configuration of a surface-emitting laser diode according to a modified example.
Figure 32:
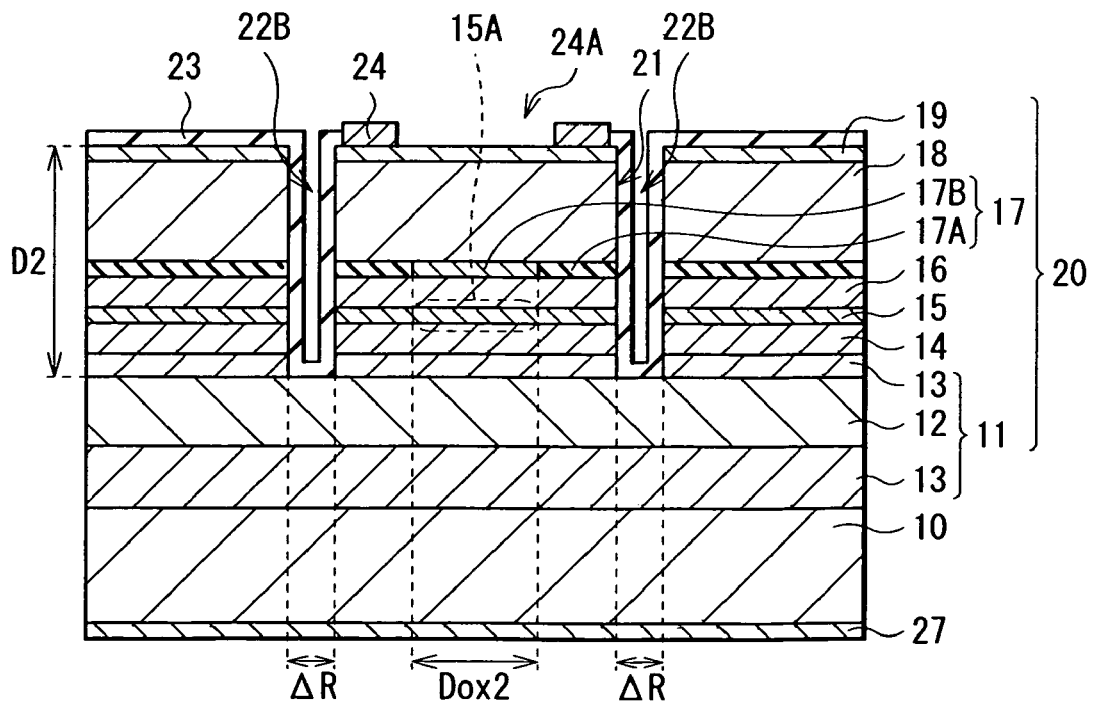
FIG. 32 is an illustration showing a sectional configuration in a direction orthogonal to a cutting direction of the laser diode in FIG. 31.
Figure 33:
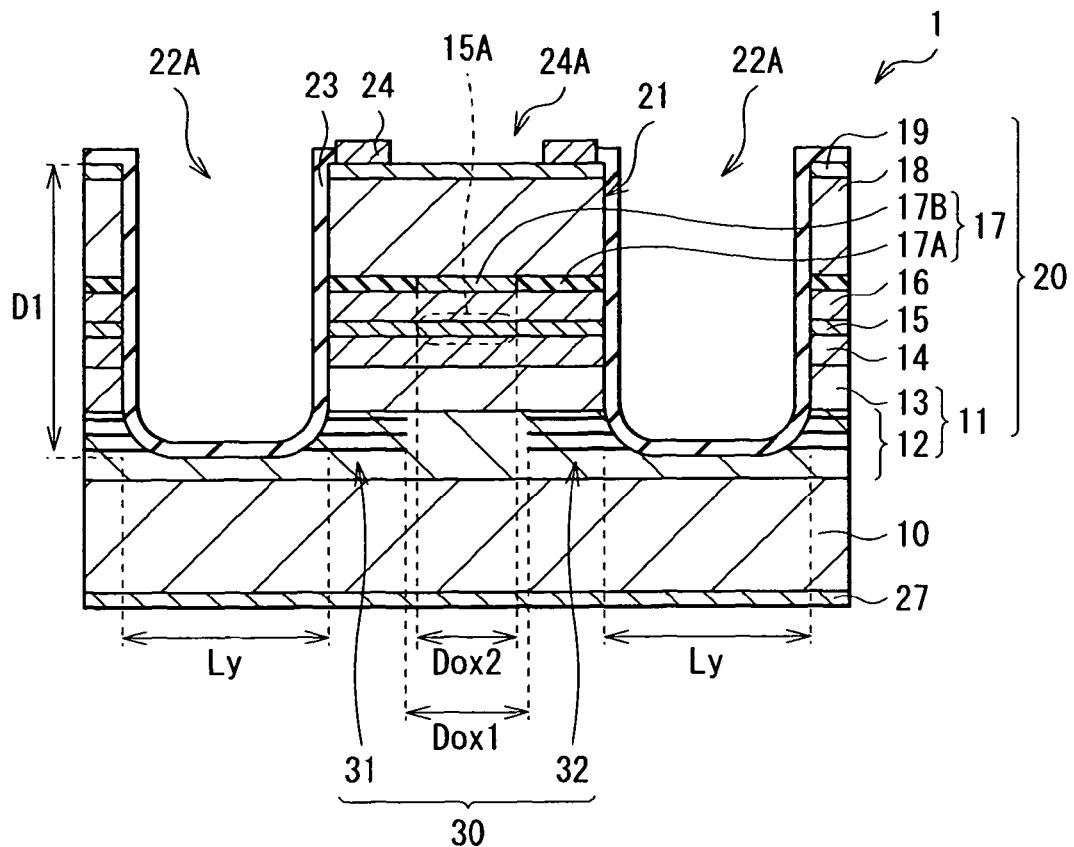
FIG. 33 is an illustration showing a sectional configuration of a modified example of the laser diode in FIG. 2.
Figure 34:
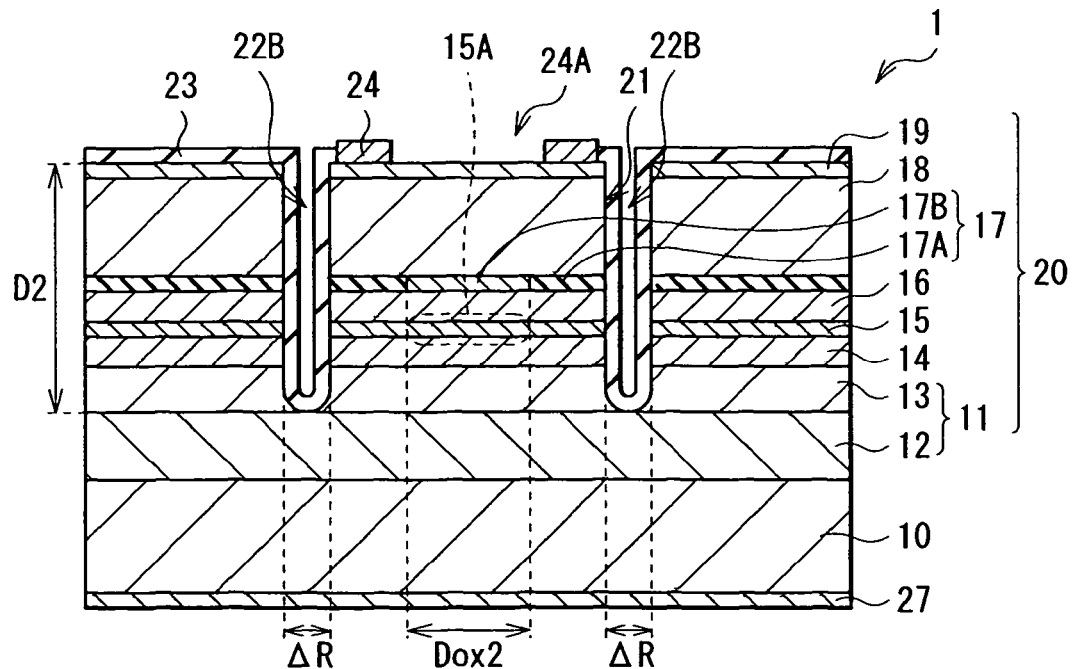
FIG. 34 is an illustration showing a sectional configuration in a direction orthogonal to a cutting direction of the laser diode in FIG. 33.
Figure 35:
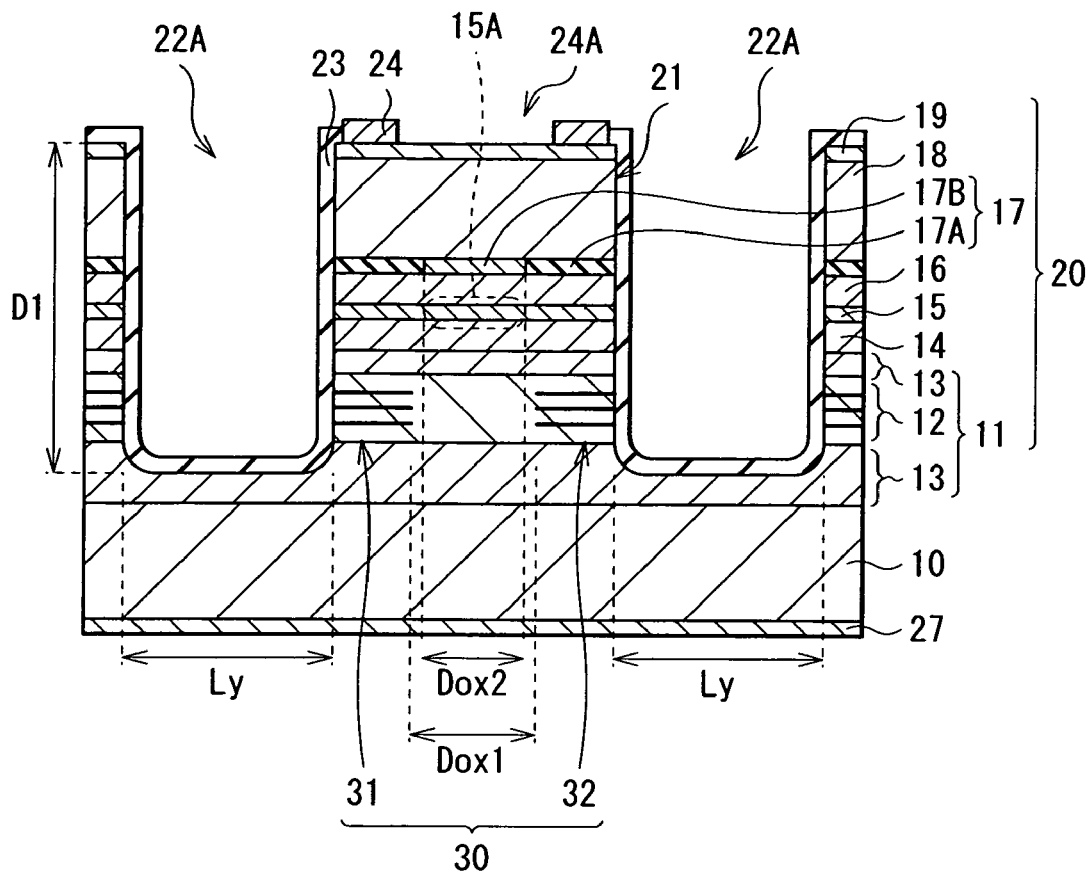
FIG. 35 is an illustration showing a sectional configuration of a modified example of the laser diode in FIG. 31.
Figure 36:
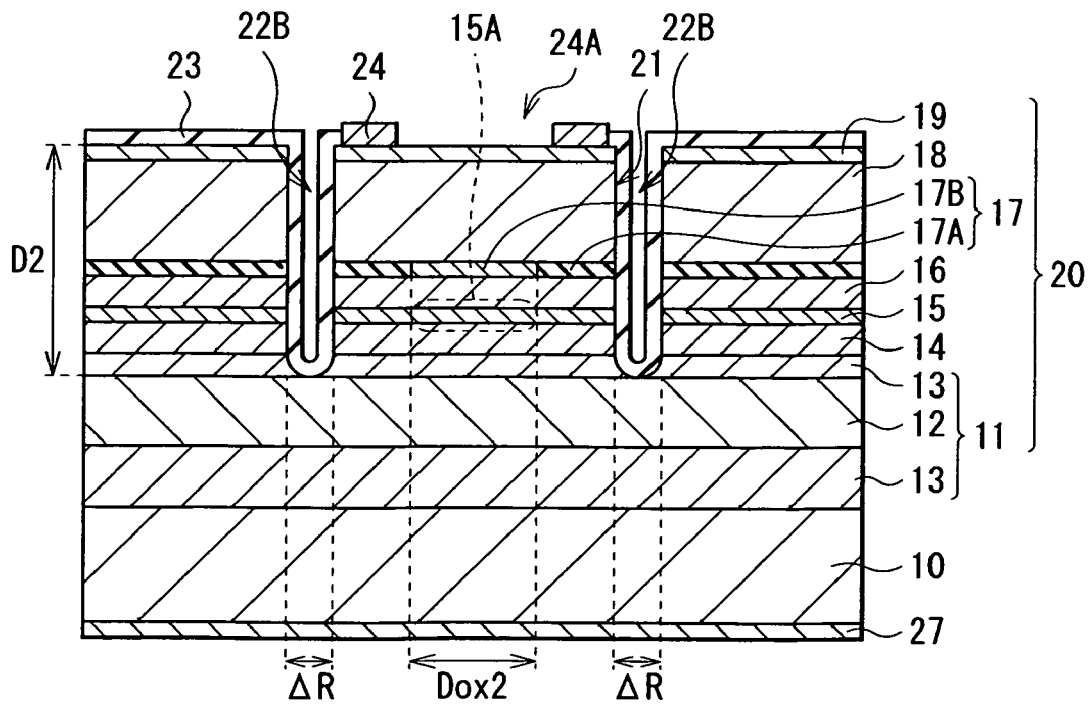
FIG. 36 is an illustration showing a sectional configuration in a direction orthogonal to a cutting direction of the laser diode in FIG. 35.

For example, in each of the above-described embodiments, the lower DBR mirror layer 11 has a configuration in which the lower first DBR mirror layer 12 and the lower second DBR mirror layer 13 are laminated in this order from the substrate 10 side; however, as shown in FIGS. 31 and 32, the lower DBR mirror layer 11 may have a configuration in which the lower first DBR mirror layer 12 is inserted into the middle of the lower second DBR mirror layer 13, and further may have a configuration in which the lower first DBR mirror layer 12 is arranged so that the lowermost layers of the oxidation layers 31 and 32 are placed in positions sufficiently higher than the bottom surface of the groove 22A. In addition, FIG. 31 shows a sectional configuration in a direction corresponding to the arrow direction A-A of FIG. 1, and FIG. 32 shows a sectional configuration in a direction corresponding to the arrow direction B-B of FIG. 1. In each of the above-described embodiments, for example, as shown in FIGS. 33 and 34, in the case where the bottom portion of the groove 22A has a tapered shape, there is a possibility that the taper shape varies among surface-emitting laser diodes 1. Moreover, when the depth of the groove 22A varies among surface-emitting laser diodes 1, there is a possibility that the numbers of the oxidation layers 31A and 32A vary among surface-emitting laser diodes 1. Therefore, in the case where the tapered shape or the depth of the groove 22A varies, there is a possibility that the magnitude of a stress applied to the active layer 15 varies among surface-emitting laser diodes 1. On the other hand, in the case where the lower DBR mirror layer 11 has a configuration shown in FIGS. 31 and 32, even if the bottom portion of the groove 22A has a tapered shape as shown in FIGS. 35 and 36, the tapered shape of the bottom portion does not reach the oxidation layers 31A and 32A, so there is no possibility that an adverse influence due to variations in the taper shape is exerted on the oxidation layers 31A and 32A. Moreover, even if the depth of the groove 22A varies among surface-emitting laser diodes 1, the oxidation layers 31A and 32B are not positioned directly below the bottom surface of the groove 22A, so there is no possibility that an adverse effect due to variations in the depth of the groove 22A is exerted on the oxidation layers 31A and 32A. Accordingly, in the case where the lower DBR mirror layer 11 has a configuration in which the lower first DBR mirror layer 12 is inserted into the middle of the lower second DBR mirror layer 13, and the lower first DBR mirror layer 12 is arranged so that the lowermost layers of the oxidation layers 31 and 32 are placed in positions sufficiently higher than the bottom surface of the groove 22A, even if the tapered shape or the depth of the groove 22A varies, the magnitude of a stress applied to the active layer 15 can be prevented from varying among surface-emitting laser diodes 1.

Figure 37:
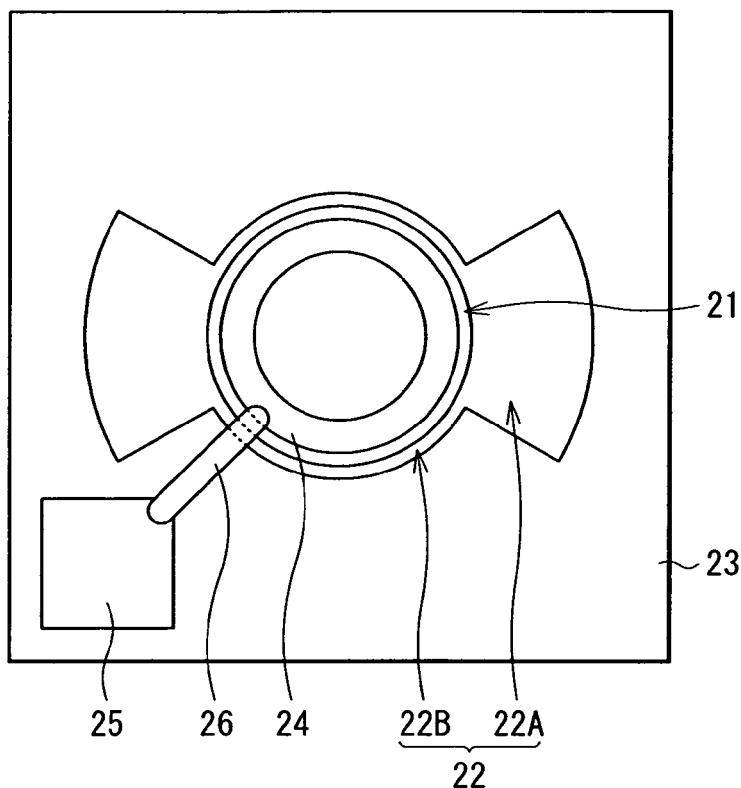
FIG. 37 is a top view of a modified example of the laser diode in FIG. 1.
Figure 38:
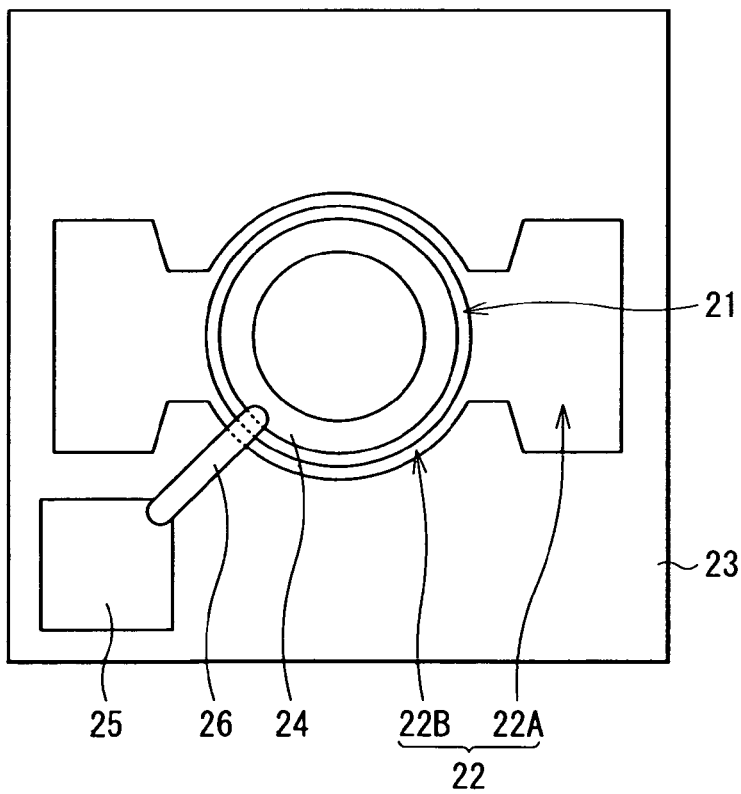
FIG. 38 is a top view of another modified example of the laser diode in FIG. 1.

Moreover, in each of the above-described embodiments, the shape of the groove 22A viewed from a top surface side is a substantially quadrilateral shape; however, for example, the shape of the groove 22A can be the shape of a sector as shown in FIG. 37 or the shape of a sectional surface of a nail as shown in FIG. 38.

Figure 39:
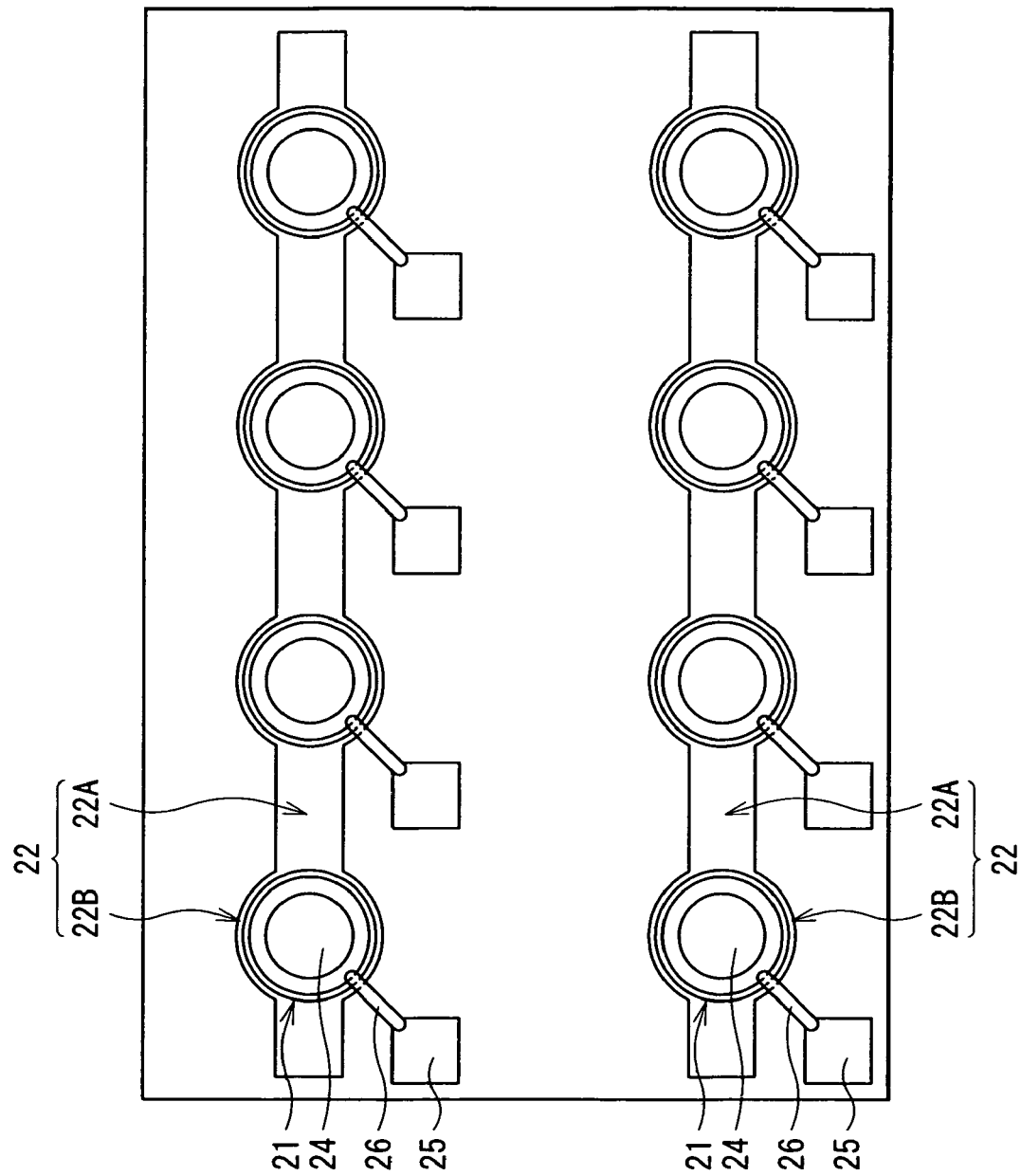
FIG. 39 is a top view of still another modified example of the laser diode in FIG. 1.
Figure 40:
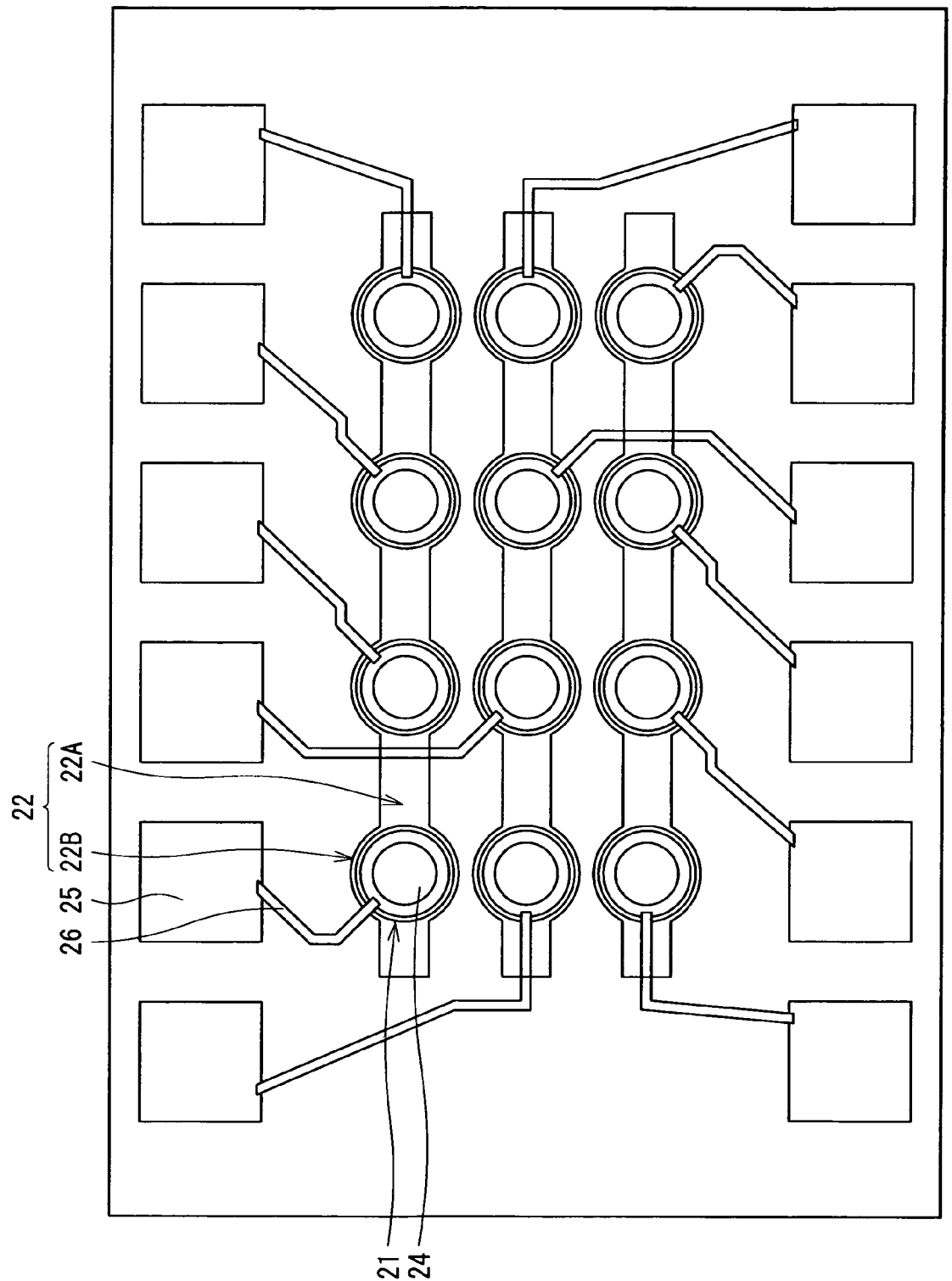
FIG. 40 is a top view of a further still another modified example of the laser diode in FIG. 1.
Figure 41:
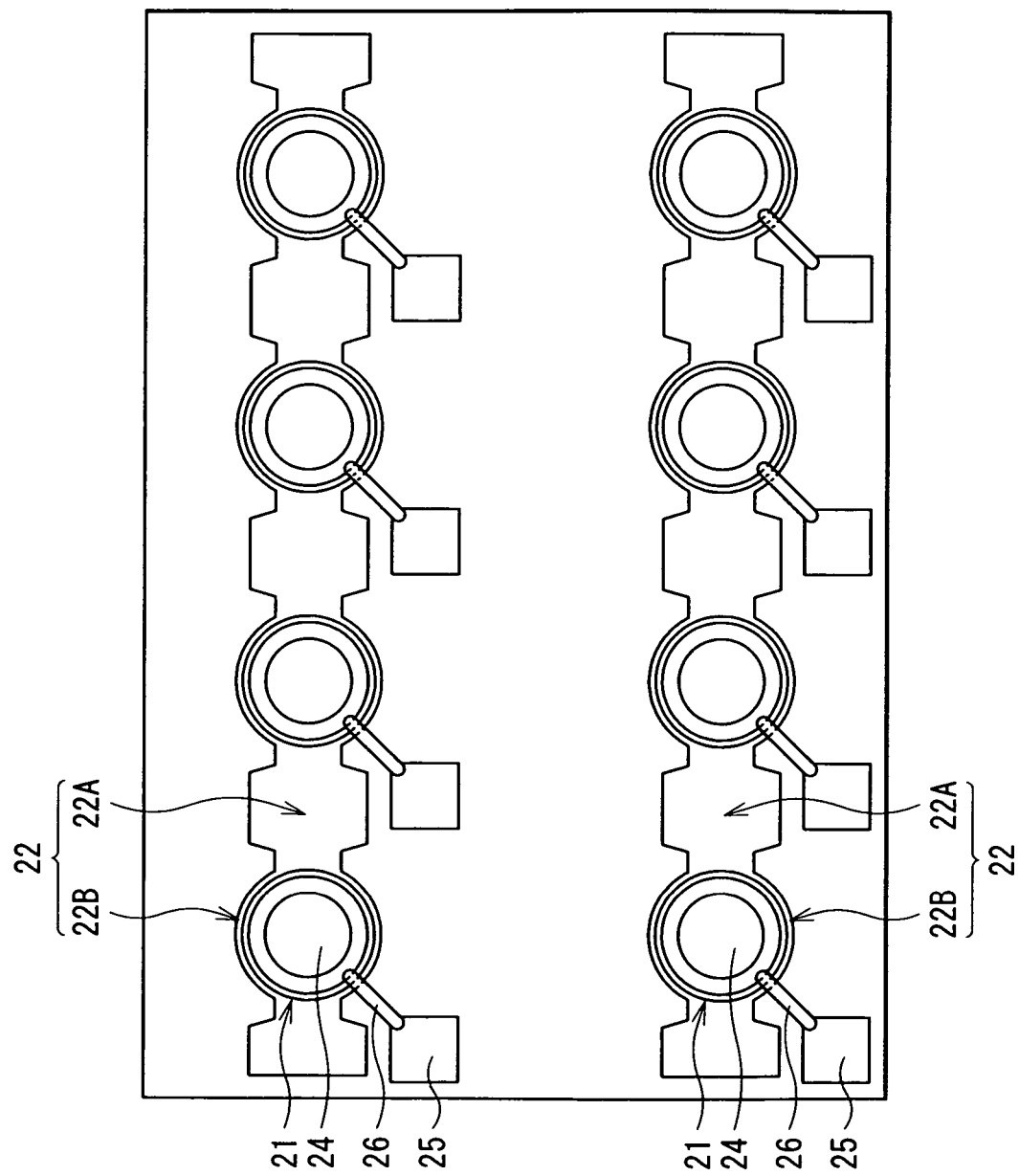
FIG. 41 is a top view of a modified example of the laser diode in FIG. 38.
Figure 42:
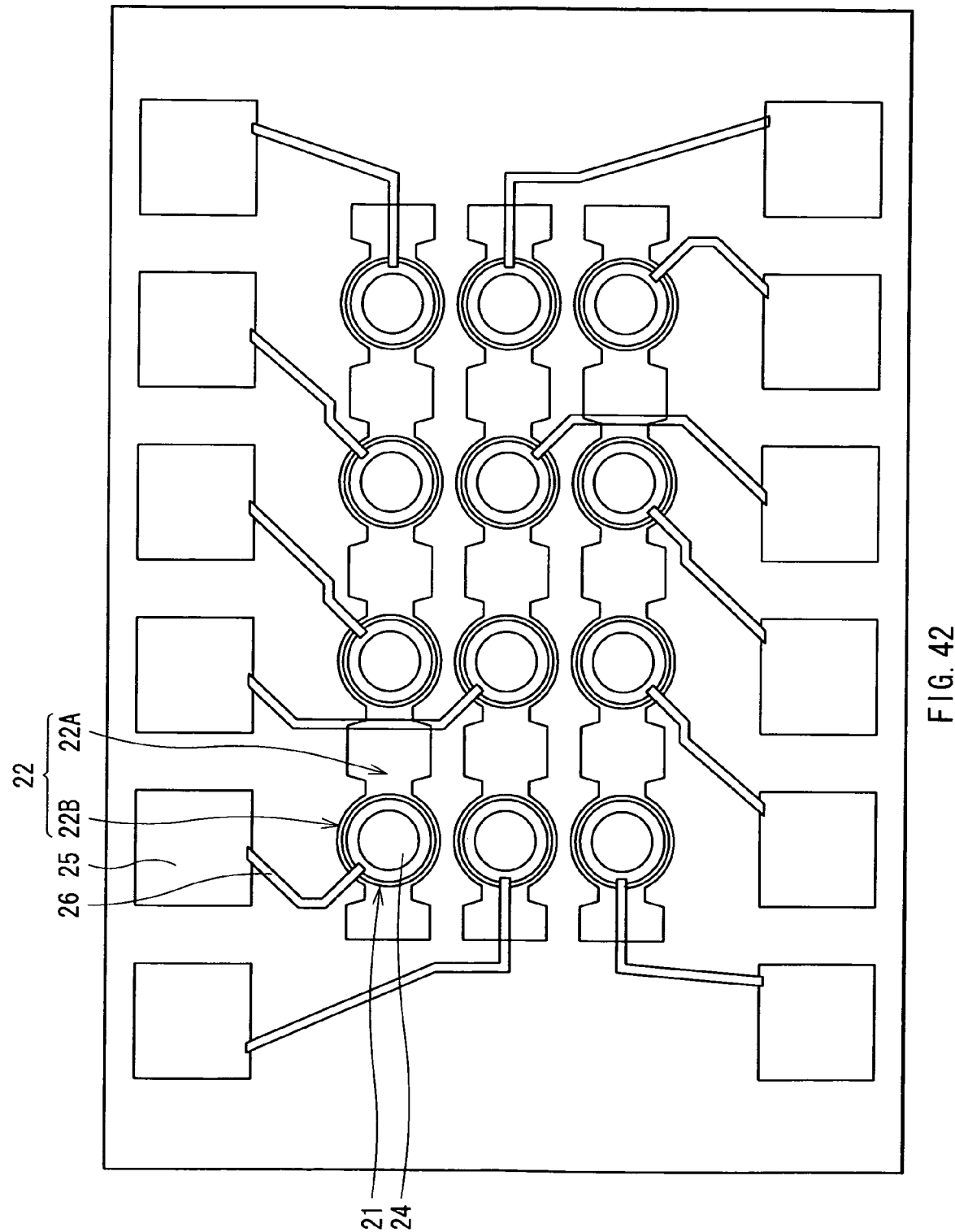
FIG. 42 is a top view of another modified example of the laser diode in FIG. 38.

Moreover, in each of the above-described embodiments, the case where only one mesa section 21 is arranged is described; however, as shown in FIGS. 39 and 40, a plurality of mesa sections 21 may be arranged in an array, and a groove sections 22 around the mesa sections 21 may be formed in communication with each other. At this time, the shape of the groove section 22 can be the shape of a sectional surface of a nail as shown in FIGS. 41 and 42. Thus, in the case where the groove sections 22 around the mesa sections 21 are formed in communication with each other, in a wafer before dicing the surface-emitting laser diodes 1 into chips, warpage of the whole wafer caused by epitaxial crystal growth can be reduced. Thereby, the warpage amount remaining in each chip after dicing can be reduced, and variations in the warpage amount among chips can be reduced.

Figure 43:
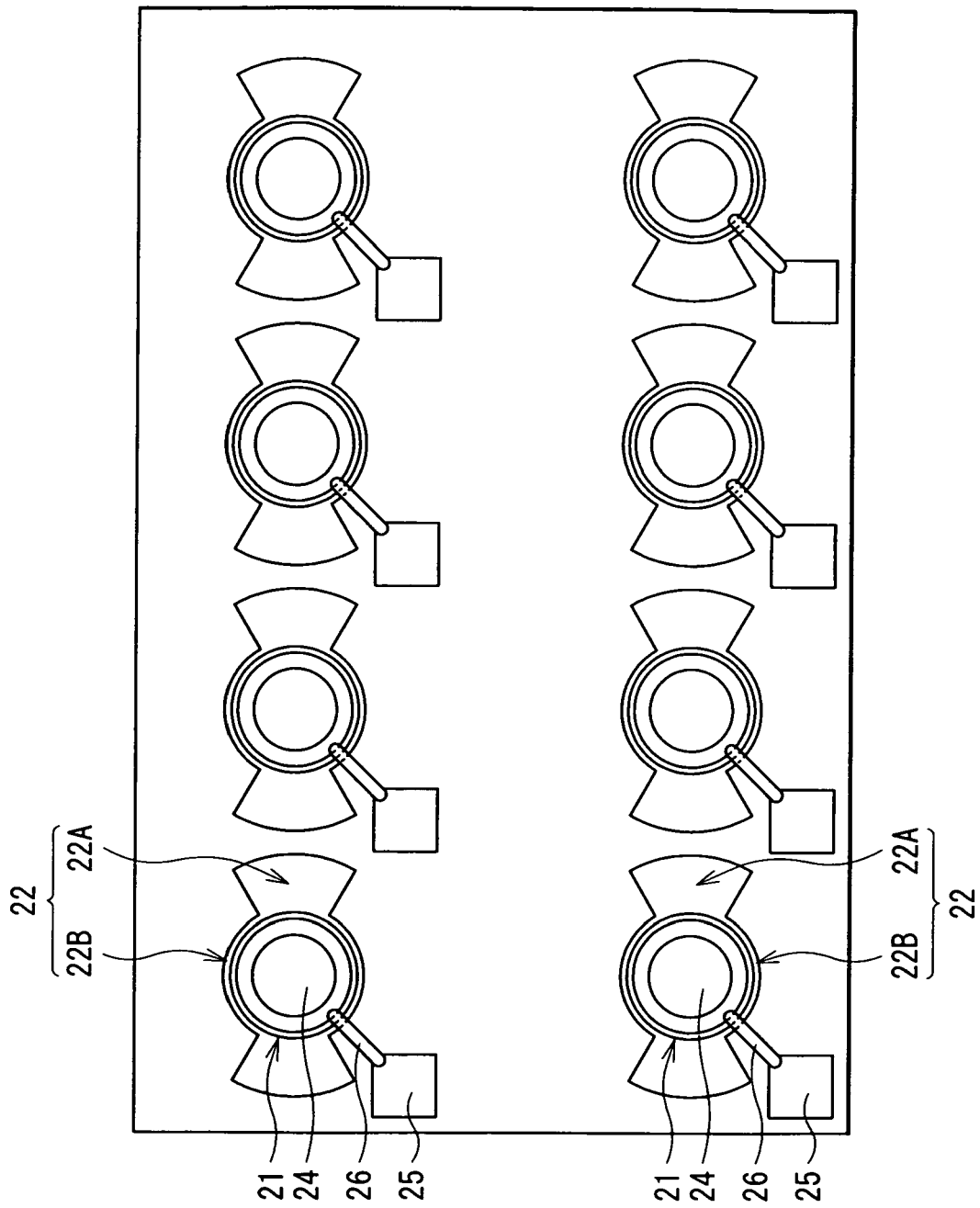
FIG. 43 is a top view of a modified example of the laser diode in FIG. 37.
Figure 44:
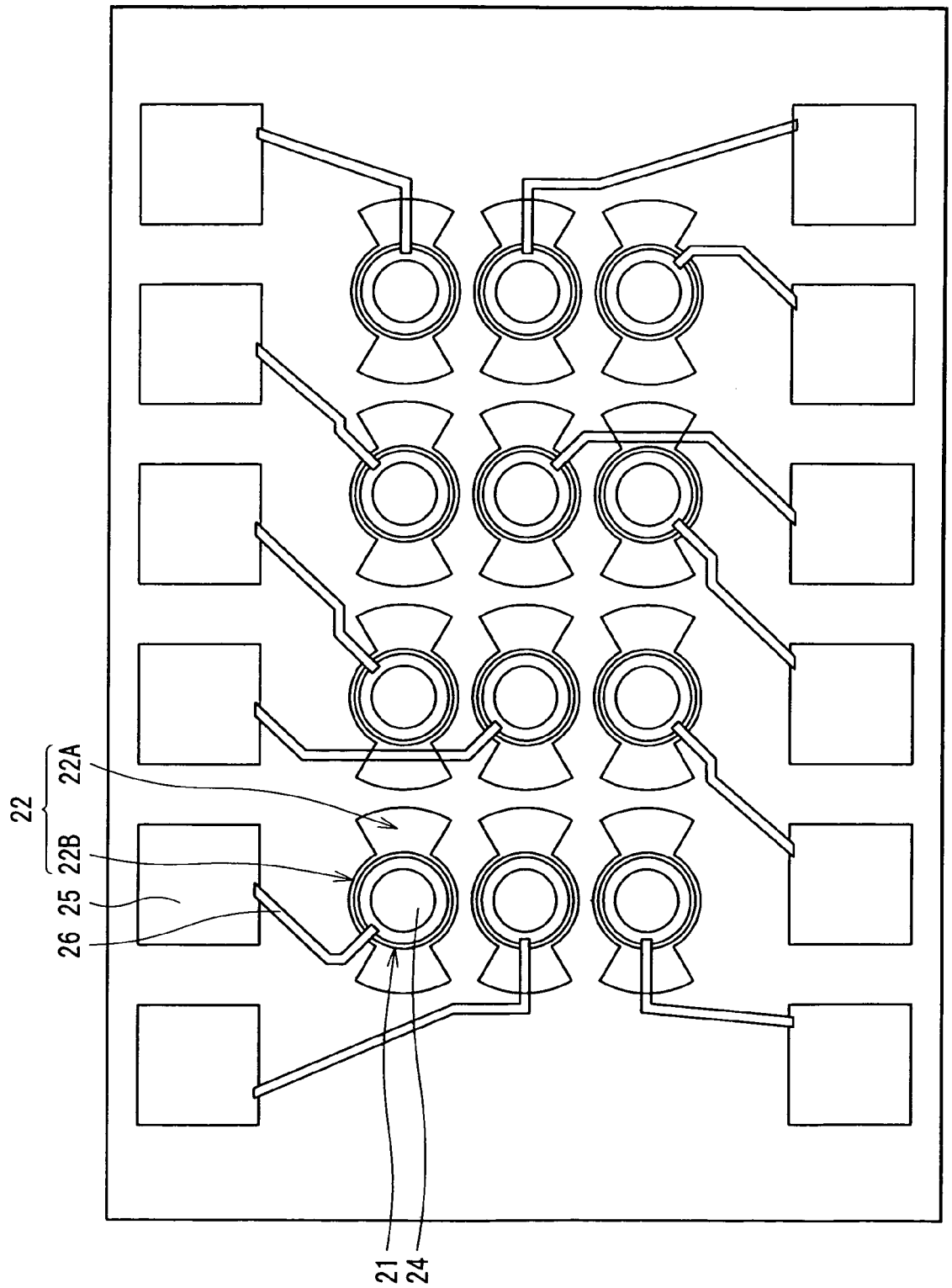
FIG. 44 is a top view of another modified example of the laser diode in FIG. 37.
Figure 45:
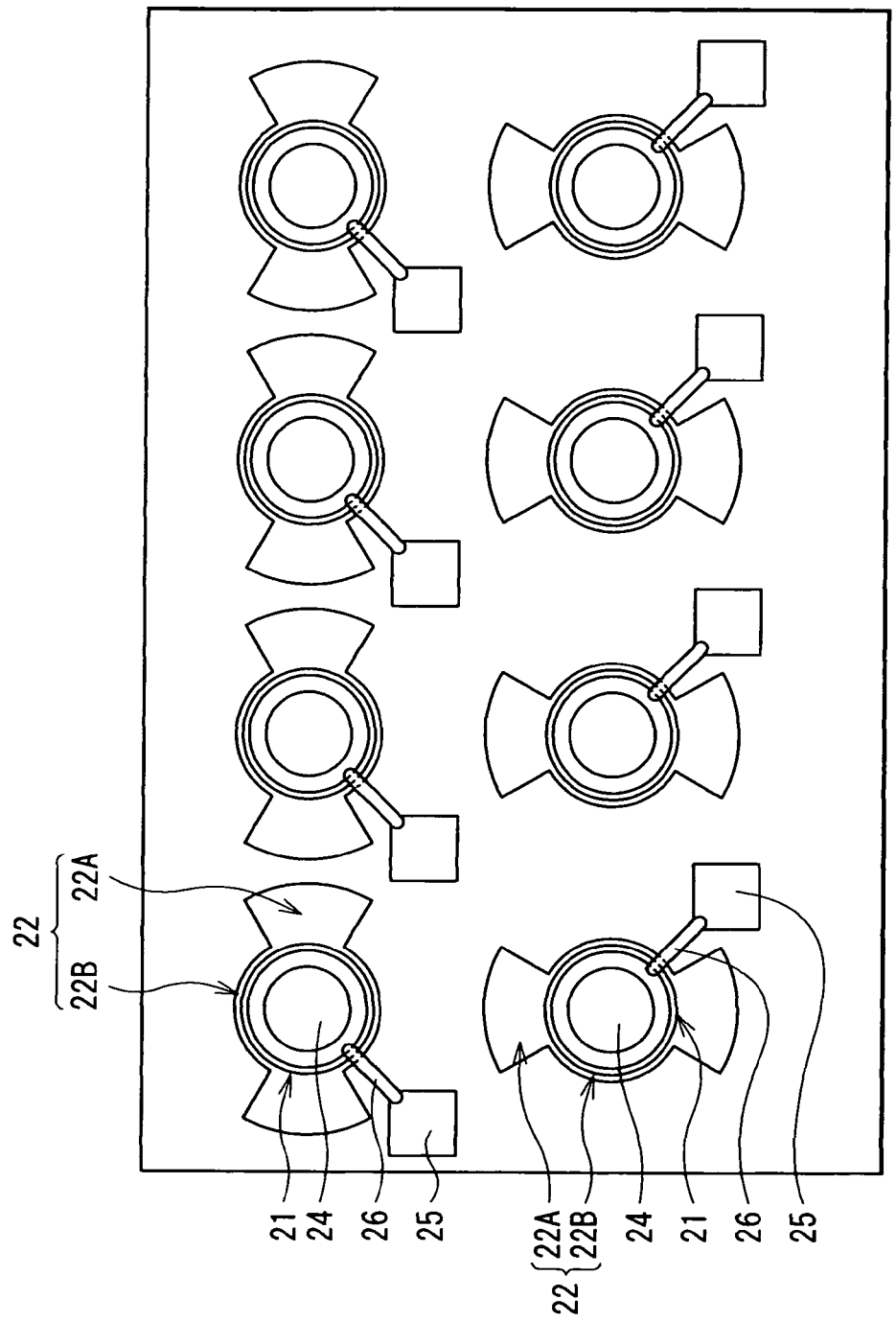
FIG. 45 is a top view of still another modified example of the laser diode in FIG. 37.
Figure 46:
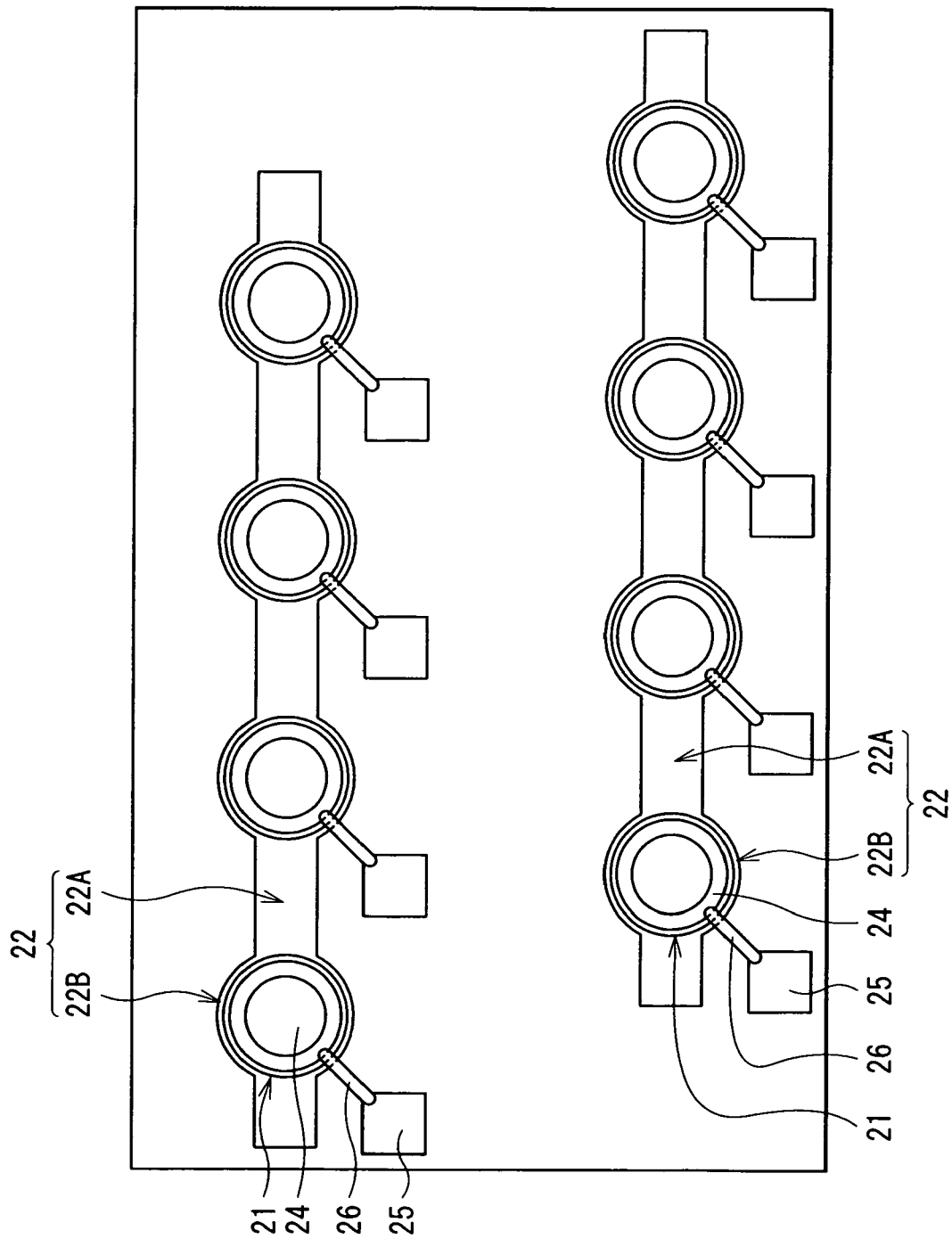
FIG. 46 is a top view of a modified example of the laser diode in FIG. 39.

Further, in the case where the shape of the groove section 22 is the shape of a sector, as shown in FIGS. 43 and 44, when the directions where the grooves 22A face each other of the groove sections 22 are the same, a polarization component of laser light emitted from the light emission opening 24A of each mesa section 21 is fixed in one direction, and as a result, while high output is achieved, the polarization direction of laser light can be stabilized in one direction. However, as shown in FIG. 45, in the case where the directions where the grooves 22A face each other are alternately different, the surface-emitting laser diode is driven so that a period of applying a voltage to each mesa section 21 surrounded by the groove section 22 in which the direction where the grooves 22A face each other is fixed in one direction and a period of applying a voltage to each mesa section 21 surrounded by the groove section 22 in which the direction where the grooves 22A face each other is fixed in another direction do not overlap each other, thereby while the polarization direction of laser light is stabilized in one direction, the polarization direction can be switched as necessary. Moreover, as shown in FIG. 46, a plurality of mesa sections 21 included in one array and a plurality of mesa sections 21 included in another array may be alternately arranged.

Moreover, in each of the above-described embodiments, the invention is described referring an AlGaAs-based compound laser diode as an example; however, the invention is applicable to any other compound laser diode, for example, a GaInP-based, AlGaInP-based, InGaAs-based, GaInP-based, InP-based, GaN-based, GaInN-based, or GaInNAs-based compound semiconductor laser diode.

The invention claimed is:

1. A surface-emitting laser diode characterized by comprising a light emission section, in which a first multilayer reflecting mirror, an active layer including one or a plurality of light emission regions and a second multilayer reflecting mirror are laminated in this order, on a substrate,
   wherein at least one of the first multilayer reflecting mirror and the second multilayer reflecting mirror includes an oxidation section nonuniformly distributed in a direction rotating around the light emission region in a periphery of a region corresponding to the light emission region,
   the light emission section includes a groove section surrounding the oxidation section and
   the groove section has a nonuniform depth corresponding to the distribution of the oxidation section.

2. The surface-emitting laser diode according to claim 1, characterized in that
   the oxidation section is configured to include a ring-shaped multilayer having anisotropy in a thickness thereof.

3. The surface-emitting laser diode according to claim 1, characterized in that
   the oxidation section is configured to include a first multilayer film and a second multilayer film which face each other with the light emission region in between.

4. The surface-emitting laser diode according to claim 1, characterized in that
   the oxidation section is configured to include a ring-shaped multilayer film having anisotropy in a thickness thereof, and
   a portion having a larger thickness of the multilayer film is formed corresponding to a portion having a larger depth of the groove section.

5. The surface-emitting laser diode according to claim 1, characterized in that
   the oxidation section is configured to include a first multilayer film and a second multilayer film which face each other with the light emission region in between, and
   the first multilayer film and the second multilayer film are formed corresponding to a portion having a larger depth of the groove section.

6. The surface-emitting laser diode according to claim 1, characterized in that
   the groove section has a nonuniform width corresponding to the distribution of the oxidation section.

7. The surface-emitting laser diode according to claim 1, characterized in that
   the width of a portion corresponding to a portion having a smaller depth of the groove section is within a range from 1 µM to 3 µM both inclusive.

8. A surface-emitting laser diode comprising:
   a light emission section, in which a first multilayer reflecting mirror, an active layer including one or a plurality of light emission regions and a second multilayer reflecting mirror are laminated in this order, on a substrate and a reflecting mirror having the oxidation section out of the first multilayer reflecting mirror and the second multilayer reflecting mirror has a configuration in which a third multilayer reflecting mirror being relatively susceptible to oxidation and a fourth multilayer reflecting mirror being relatively resistant to oxidation are laminated in this order from the substrate side, wherein at least one of the first multilayer reflecting mirror and the second multilayer reflecting mirror includes an oxidation section nonuniformly distributed in a direction rotating around the light emission region in a periphery of a region corresponding to the light emission region and the oxidation section is formed in the third multilayer reflecting mirror.

9. A surface-emitting laser diode comprising:

a light emission section, in which a first multilayer reflecting mirror, an active layer including one or a plurality of light emission regions and a second multilayer reflecting mirror are laminated in this order, on a substrate and a reflecting mirror having the oxidation section out of the first multilayer reflecting mirror and the second multilayer reflecting mirror includes a fourth multilayer reflecting mirror being relatively resistant to oxidation and a third multilayer reflecting mirror being inserted in the middle of the fourth multilayer reflecting mirror and relatively susceptible to oxidation, wherein at least one of the first multilayer reflecting mirror and the second multilayer reflecting mirror includes an oxidation section nonuniformly distributed in a direction rotating around the light emission region in a periphery of a region corresponding to the light emission region and the oxidation section is formed in the third multilayer reflecting mirror.

10. The surface-emitting laser diode according to claim 8 or claim 9, characterized in that the third multilayer reflecting mirror is configured by laminating a plurality of pairs of a low refractive index layer made of $Al_{x1}Ga_{1-x1}As$ and a high refractive index layer made of $Al_{x2}Ga_{1-x2}As$, the fourth multilayer reflecting mirror is configured by laminating a plurality of pairs of a low refractive index layer made of $Al_{x3}Ga_{1-x3}As$ and a high refractive index layer made of $Al_{x4}Ga_{1-x4}As$, and x1 to x4 satisfy the following formula:

$$1 \geq x1 > x3 > 0.8 > (x2, x4) \geq 0 \quad (1)$$

11. The surface-emitting laser diode according to claim 8 or claim 9, characterized in that the third multilayer reflecting mirror is configured by laminating a plurality of pairs of a low refractive index layer including a first refractive index layer made of $Al_{x5}Ga_{1-x5}As$ and a second refractive index layer $Al_{x6}Ga_{1-x6}As$ and a high refractive index layer made of $Al_{x2}Ga_{1-x2}As$, the fourth multilayer reflecting mirror is configured by laminating a plurality of pairs of a low refractive index layer made of $Al_{x3}Ga_{1-x3}As$ and a high refractive index layer made of $Al_{x4}Ga_{1-x4}As$, and x2 to x6 satisfy the following formula:

$$1 \geq x5 > (x6, x3) > 0.8 > (x2, x4) \geq 0 \quad (2)$$

12. The surface-emitting laser diode according to claim 8 or claim 9, characterized in that the third multilayer reflecting mirror is configured by laminating a plurality of pairs of a low refractive index layer including a third refractive index layer made of $Al_{x7}Ga_{1-x7}As$, a first refractive index layer made of $Al_{x5}Ga_{1-x5}As$ and a second refractive index layer $Al_{x6}Ga_{1-x6}As$ in this order and a high refractive index layer made of $A_{x2}Ga_{1-x2}As$, the fourth multilayer reflecting mirror is configured by laminating a plurality of pairs of a low refractive index layer made of $Al_{x3}Ga_{1-x3}As$ and a high refractive index layer made of $Al_{x4}Ga_{1-x4}As$, and x2 to x7 satisfy the following formula:

$$1 \geq x5 > (x6, x7, x3) > 0.8 > (x2, x4) \geq 0 \quad (3)$$

13. A surface-emitting laser diode comprising:

a light emission section, in which a first multilayer reflecting mirror, an active layer including one or a plurality of light emission regions and a second multilayer reflecting mirror are laminated in this order, on a substrate and a transverse mode adjustment layer on the second multilayer reflecting mirror, wherein at least one of the first multilayer reflecting mirror and the second multilayer reflecting mirror includes an oxidation section nonuniformly distributed in a direction rotating around the light emission region in a periphery of a region corresponding to the light emission region, one of the first multilayer reflecting mirror and the second multilayer reflecting mirror has a quadrilateral current injection region of which an intersection point of diagonal lines corresponds to the light emission region, the second multilayer reflecting mirror has a light emission opening arranged in a region corresponding to one diagonal line of the current injection region, and the transverse mode adjustment layer is arranged corresponding to the light emission opening, and in the transverse mode adjustment layer, the reflectivity of a peripheral region except for a central region corresponding to the light emission region of the light emission opening is lower than that of the central region.

14. The surface-emitting laser diode according to claim 13, characterized in that a portion corresponding to the central region of the transverse mode adjustment layer has a configuration in which a first adjustment layer having a film thickness of $(2a-1)\lambda/4n_1$ (a is an integer of 1 or more, $\lambda$ is a light emission wavelength, and $n_1$ is a refractive index) and the refractive index $n_1$ lower than that of a surface of the first multilayer reflecting mirror, and a second adjustment layer having a film thickness of $(2b-1)\lambda/4n_2$ (b is an integer of 1 or more, and $n_2$ is a refractive index), and the refractive index $n_2$ higher than that of the first adjustment layer are laminated in this order, and a portion corresponding the peripheral region of the transverse mode adjustment layer is a third adjustment layer having a film thickness of $(2c-1)\lambda/4n_3$ (c is an integer of 1 or more, and $n_3$ is a refractive index) and the refractive index $n_3$ higher than that of the first adjustment layer.

15. A method of manufacturing a surface-emitting laser diode characterized by comprising:

a step of laminating a first multilayer reflecting mirror, an active layer and a second multilayer reflecting mirror in this order on a substrate;

a step of forming a coating layer including one or a plurality of ring-shaped opening with a nonuniform width on a top surface side of the second multilayer reflecting mirror;

a step of forming a groove section with a nonuniform depth corresponding to the depth of the opening by dry etching using the coating layer as a mask; and a step of forming an oxidation section nonuniformly distributed corresponding to the depth of the groove section in at least one of the first multilayer reflecting mirror and the second multilayer reflecting mirror by oxidizing a side surface of the groove section.

* * * * *